(12) United States Patent
Hashimoto et al.

(10) Patent No.: US 6,636,143 B1
(45) Date of Patent: *Oct. 21, 2003

(54) RESISTOR AND METHOD OF MANUFACTURING THE SAME

(75) Inventors: Masato Hashimoto, Fukui (JP); Hiroyuki Yamada, Fukui (JP); Seiji Tsuda, Fukui (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/462,221

(22) PCT Filed: Jul. 2, 1998

(86) PCT No.: PCT/JP98/02989

§ 371 (c)(1),
(2), (4) Date: Apr. 6, 2000

(87) PCT Pub. No.: WO99/01876

PCT Pub. Date: Jan. 14, 1999

(30) Foreign Application Priority Data

Jul. 3, 1997 (JP) ............................. 9-177956
Jul. 9, 1997 (JP) ............................. 9-183370

(51) Int. Cl.⁷ .............................. H01L 1/012
(52) U.S. Cl. ................. 338/309; 338/203; 338/313; 338/327; 338/324; 338/332; 219/619; 219/621
(58) Field of Search ................. 338/307, 308, 338/309, 313, 327, 332, 324, 203; 29/621, 619

(56) References Cited

U.S. PATENT DOCUMENTS

| 2,934,736 | A | * | 4/1960 | Davis | 335/309 |
| 4,176,445 | A | * | 12/1979 | Solow | 29/620 |
| 4,529,960 | A | * | 7/1985 | Uchida et al. | 338/309 |
| 4,684,916 | A | * | 8/1987 | Ozawa | 338/308 |
| 4,780,702 | A | * | 10/1988 | Snel et al. | 338/308 |
| 4,792,781 | A | * | 12/1988 | Takahashi et al. | 338/307 |

(List continued on next page.)

FOREIGN PATENT DOCUMENTS

| DE | 3921651 | * | 1/1991 | 338/323 |
| JP | 63-283001 | * | 11/1988 | 338/309 |
| JP | 4-30502 | * | 2/1992 | 338/308 |
| JP | 4-102302 | * | 4/1992 | |
| JP | 5-21204 | * | 1/1993 | 338/309 |
| JP | 9-69406 | | 3/1997 | |

OTHER PUBLICATIONS

Japanese Search Report corresponding to application No. PCT/JP8/02989 dated Oct. 6, 1998 (w/English translation).

Primary Examiner—Karl D. Easthom
(74) Attorney, Agent, or Firm—RatnerPrestia

(57) ABSTRACT

The present invention relates to a resistor and a manufacturing method of the same. The invention aims at providing the resistor and the manufacturing method thereof that can reduce a soldering area that occupies a mount area, when the resistor is mounted on a mount board. In order to achieve the foregoing object, a resistor comprises a substrate (21), a pair of first upper surface electrode layers (22), each provided on a side portion of an upper surface toward a portion of a side surface of the substrate (21), a pair of second upper surface electrode layers (23) provided in a manner to make electrical connections with the first upper surface electrode layers (22), a resistance layer (24) provided in a manner to make electrical connections with the second surface electrode layers (23), and a protective layer (25) provided to cover at least an upper surface of the resistance layer (24). The invention realizes the electrodes on side surfaces of the resistor to have a small surface area because of the pair of first surface electrode layers (22) on side portions of an upper surface toward portions of side surfaces of the substrate (21), thereby attaining a reduction of the actual mount area on the mount board, including soldering portions.

21 Claims, 52 Drawing Sheets

U.S. PATENT DOCUMENTS

| | | | | |
|---|---|---|---|---|
| 4,829,553 A | * | 5/1989 | Shindo et al. | 338/309 |
| 5,077,564 A | * | 12/1991 | Thomas | 347/201 |
| 5,294,910 A | * | 3/1994 | Tani et al. | 338/306 |
| 5,680,092 A | * | 10/1997 | Yamada et al. | 338/309 |
| 5,757,076 A | * | 5/1998 | Kambara | 257/72 A |
| 5,815,065 A | * | 9/1998 | Hanamura | 338/309 |
| 5,917,403 A | * | 6/1999 | Hashimoto et al. | 338/307 |
| 6,023,217 A | * | 2/2000 | Yamada et al. | 338/309 |
| 6,150,920 A | * | 11/2000 | Hashimoto et al. | 338/309 |
| 6,304,167 B1 | * | 10/2001 | Nakayama | 338/195 |

* cited by examiner (a)

(b)

(a)

(b)

(c)

(a)

(b)

(c)

(d)

(a)

(b)

(c)

(a)

(b)

(a)

(b)

(a)

(b)

(c)

(a)

(b)

(a)

(b)

(c)

(a)

(b)

(a)

(b)

(a)

(b)

(c)

(a)

(b)

(c)

(a)

(b)

(a)

(b)

(c)

(a)

(b)

(c)

(a)

(b)

(a)

(b)

(c)

(a)

(b)

(c)

(a)

(b)

(c)

(a)

(b)

(a)

(b)

(c)

(a)

(b)

(c)

(a)

(b)

RESISTOR AND METHOD OF MANUFACTURING THE SAME

This application is a U.S. national phase application of PCT INTERNATIONAL application PCT/JP98/02989.

FIELD OF THE INVENTION

The present invention relates to a resistor and a method of manufacturing the same.

BACKGROUND OF THE INVENTION

There has been a growing demand more than ever in recent years for miniaturization of electronic components used for circuit boards, in order to increase a density of mounting, as reduction in size of electronic devices continues. A demand has been rising also for resistors having smaller size and higher accuracy in tolerance of resistance values, in order to reduce mounting areas on mount boards.

Previously known resistors of such kind include one that is disclosed in Japanese Patent Laid-open Publication, Number H04-102302.

A resistor of the prior art and a method of manufacturing the same will be described hereinafter by referring to accompanying figures.

FIG. 50 is a sectional view depicting a resistor of the prior art.

In the figure, a reference numeral 1 represents an insulating substrate, and a reference numeral 2 represents first upper surface electrode layers provided on an upper surface at both right and left ends of the insulating substrate 1. A reference numeral 3 represents a resistance layer provided in a manner that portions of which overlap with the first upper surface electrode layers 2. A reference numeral 4 represents a first protective layer provided in a manner to cover the resistance layer 3 entirely. A reference numeral 5 represents a trimmed slit provided in the resistance layer 3 and the first protective layer 4 for correcting a resistance value. A reference numeral 6 represents a second protective layer provided over an outer surface of the first protective layer 4. A reference numeral 7 represents second upper surface electrode layers provided on upper surfaces of the first upper surface electrode layers 2 in a manner to spread over a full width of the insulating substrate 1. A reference numeral 8 represents side surface electrode layers provided on side surfaces of the insulating substrate 1. Reference numerals 9 and 10 respectively represent nickel-plated layers and solder-plated layers provided over surfaces of the second upper surface electrode layers 7 and the side surface electrode layers 8.

A method of manufacturing the resistor of the prior art constructed as above will be described hereinafter by referring to accompanying figures.

FIG. 51 represents procedural views depicting a method of manufacturing the prior art resistor.

Firstly, first upper surface electrode layers 2 are print-formed on both right and left ends of an upper surface of an insulating substrate 1, as shown in FIG. 51(a).

Secondly, a resistance layer 3 is print-formed on the upper surface of the insulating substrate 1 in a manner that portions of which overlap with the first upper surface electrode layers 2, as shown in FIG. 51(b).

Then, a first protective layer 4 is print-formed to cover the resistance layer 3 entirely, followed by providing a trimmed slit 5 in the resistance layer 3 and the first protective layer 4 with a laser or the like, as shown in FIG. 51(c), in order to make a resistance value of the resistance layer 3 to fall within a predetermined range of resistance value.

A second protective layer 6 is then print-formed on an upper surface of the first protective layer 4 as shown in FIG. 51(d).

Second upper surface electrode layers 7 are then print-formed on upper surfaces of the first upper surface electrode layers 2 in a manner that they spread over an entire width of the insulating substrate 1 as shown in FIG. 51(e).

Side surface electrode layers 8 are coat-formed on side surfaces at both right and left ends of the first upper surface electrode layers 2 and the insulating substrate 1, in a manner to make an electrical continuity with the first and the second upper surface electrode layers 2 and 7, as shown in FIG. 51(f).

The resistor of the prior art is completed finally, when nickel-plated layers 9 and solder-plated layers 10 are formed by providing solder-plating after nickel-plating over surfaces of the second upper surface electrode layers 7 and the side surface electrode layers 8.

However, as shown in a sectional view of FIG. 52(a) depicting the resistor of the prior art in a mounted position, the resistor having the above structure of the prior art and produced by the manufacturing method described above has a fillet-mounting structure, in which it is soldered with both the side surface electrode layers (not shown in the figure) and the lower surface electrode layers (not shown in the figure), when it is soldered on a mount board. The resistor thus requires areas 13 for soldering the side surfaces in addition to an area 12 for the resistor component, and therefore a mounting area 14 combining them altogether, as shown in a plan view of FIG. 52(b) depicting of the resistor of the prior art. Furthermore, a proportion occupied by the soldering area with respect to the mounting area increases, if external dimensions of the component are reduced in order to increase a density of mounting. Consequently, the resistor has a problem that a limitation arises in the improvement of mounting density in order to reduce size of electronic devices.

The present invention is intended to solve the above-described problem of the prior art, and it aims at providing a resistor, as well as a method of manufacturing, that can reduce a soldering area occupying in the mounting area, when it is mounted on the mount board.

DISCLOSURE OF THE INVENTION

In order to solve the foregoing problem, a resistor of the present invention comprises: a substrate; a pair of first upper surface electrode layers provided on side portions of an upper surface toward a portion of respective side surfaces of the substrate; a pair of second upper surface electrode layers provided in a manner to make electrical connections with the first upper surface electrode layers; a resistance layer provided in a manner to make electrical connections with the second upper surface electrode layers; and a protective layer provided to cover at least an upper surface of the resistance layer.

In the above-described resistor, electrodes on side surfaces of the resistor have small surface areas, since the resistor is provided with the pair of first upper surface electrode layers on side portions of the upper surface toward portions of side surfaces of the substrate. Because the resistor is soldered with the small areas of the electrodes on side surfaces, it can reduce an area required to form fillets for soldering, if it is soldered on a mount board. Accordingly, the resistor is able to reduce a mount area, including soldering portions, on the mount board.

BRIEF DESCRIPTION OF THE DRAWINGS

FIG. 52(*b*) is a plan view depicting the same resistor in the mounted position.

THE BEST MODE FOR CARRYING OUT THE INVENTION

First Exemplary Embodiment

A resistor of a first exemplary embodiment of the present invention and a method of manufacturing the same will be described hereinafter by referring to accompanying figures.

Figure 1:
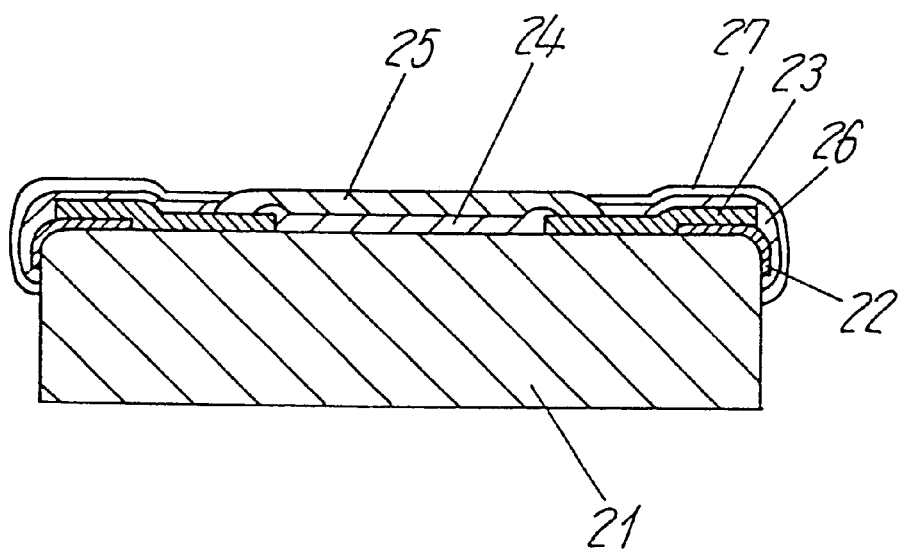
FIG. 1 is a sectional view depicting a resistor of a first exemplary embodiment of the present invention.

FIG. 1 is a sectional view of a resistor of the first exemplary embodiment of this invention.

In the figure, a reference numeral 21 represents a substrate containing 96% of alumina. A reference numeral 22 represents first upper surface electrode layers, which are constructed of calcined gold-base organic metal compound, and provided on side portions of an upper surface toward portions of side surfaces of the substrate 21. Ridges of these first upper surface electrode layers 22 are rounded. In addition, a surface area of the first upper surface electrode layer 22 occupying the side surface of the substrate 21 is not more than a half of an area of the side surface of the substrate 21. A reference numeral 23 represents second upper surface electrode layers constructed of silver-base conductive powder containing glass for electrically connecting with the first upper surface electrode layers 22. A reference numeral 24 represents a resistance layer having a chief component of ruthenium oxide for electrically connecting with the second upper surface electrode layers 23. A reference numeral 25 is a protective layer having a chief component of glass, provided on an upper surface of the resistance layer 24. Reference numerals 26 and 27 respectively represent a nickel-plated layer and a solder-plated layer provided, as occasion demands, for a purpose of assuring reliability, etc. during soldering.

The resistor of the first exemplary embodiment of this invention constructed as above is manufactured in a manner, which will be described hereinafter by referring to the figures.

Figure 2:
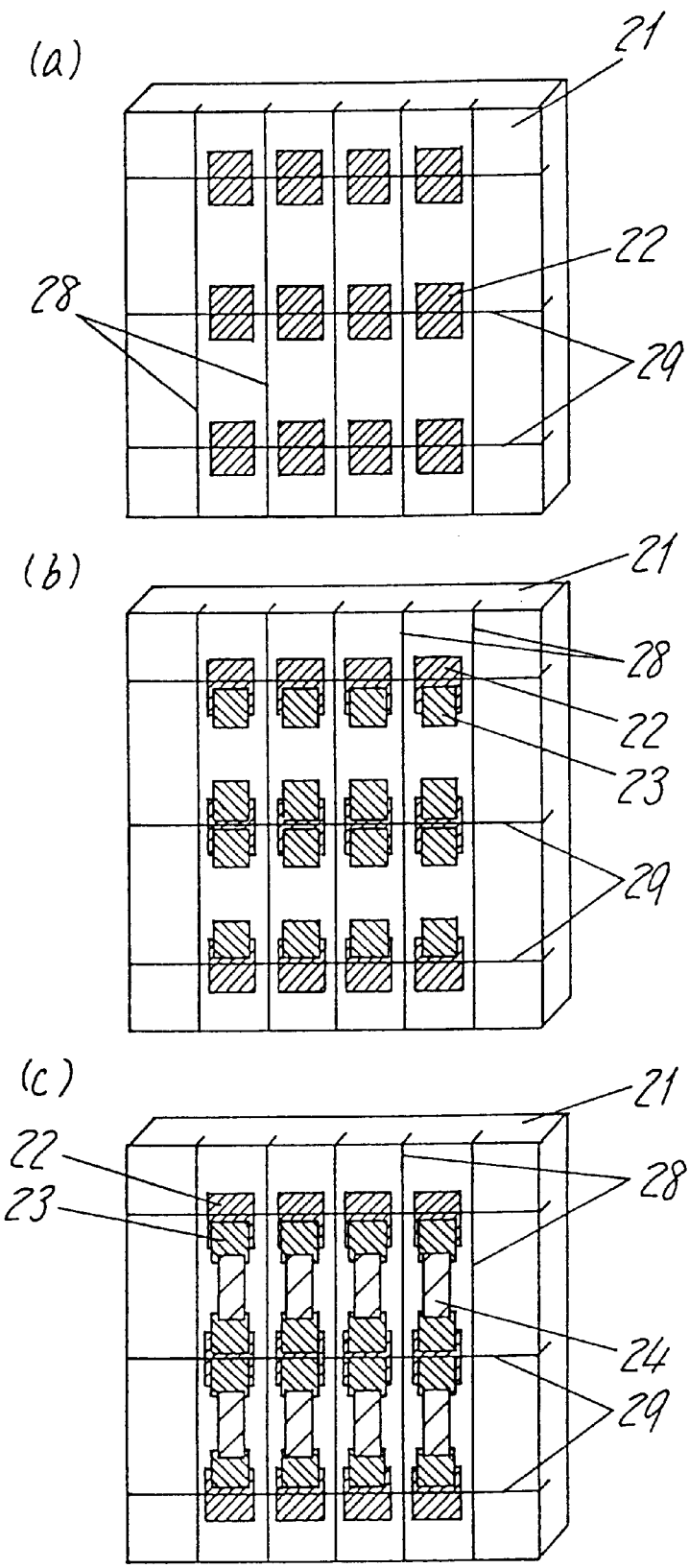
FIG. 2(a) through FIG. 2(c) represent a series of procedural views depicting a process of manufacturing the same resistor.
Figure 3:
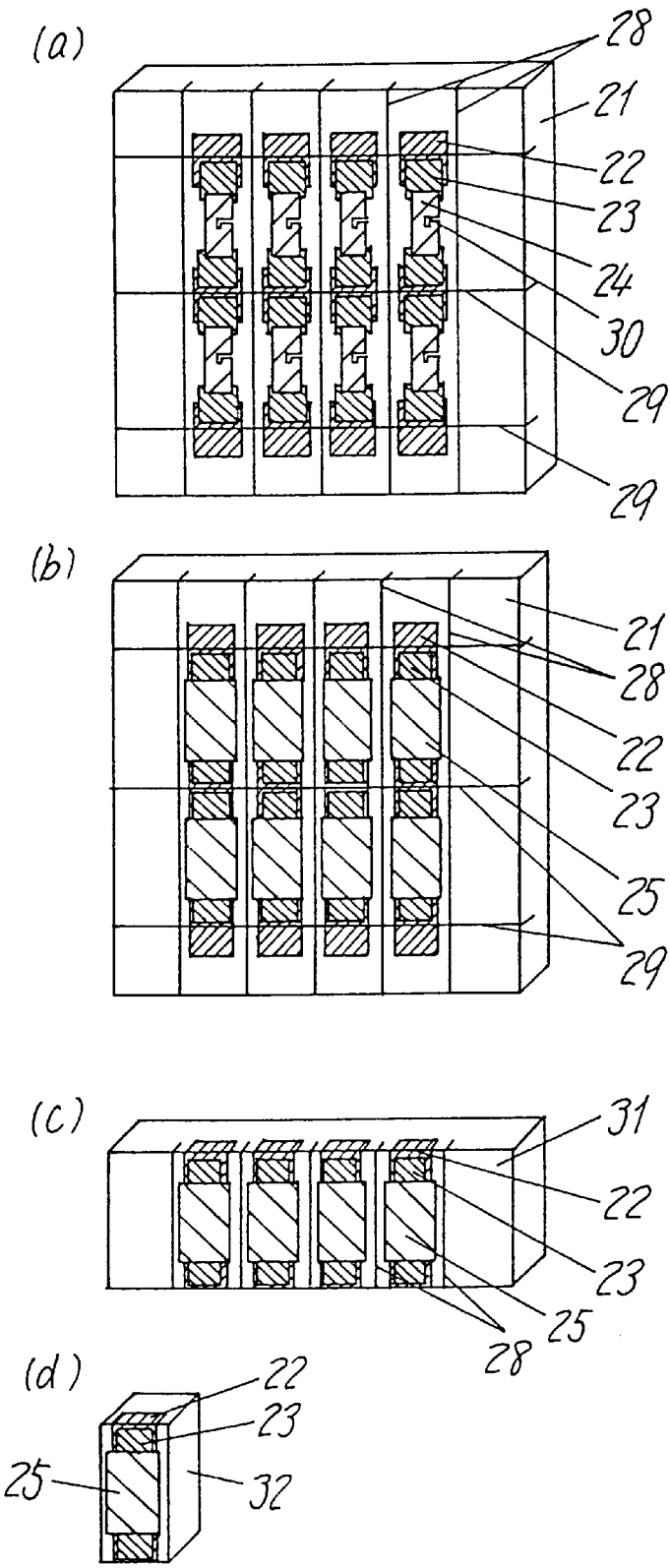
FIG. 3(a) through FIG. 3(d) represent another series of procedural views depicting the process of manufacturing the same resistor.

FIG. 2 and FIG. 3 represent a series of procedural views showing a manufacturing method of the resistor of the first exemplary embodiment of this invention.

First of all, first upper surface electrode layers 22 are formed, as shown in FIG. 2(*a*), by printing electrode paste containing gold-base organic metal in a manner to cross over slitting grooves 29 made in a horizontal direction through a sheet-formed substrate 21, which has a superior heat-resisting property and an insulating property as it contains 96% alumina, and a surface of which is provided with a plurality of slitting grooves 28 and 29 in a vertical direction as well as in a horizontal direction in order to separate it into rectangular strips and then into individual pieces in the subsequent steps. During this process, the electrode paste containing gold-base organic metal gets into the slitting grooves 29 of horizontal direction, so as to form the first upper surface electrode layers 22 deeply down in the slitting grooves. In addition, the first upper surface electrode layers 22 are calcined at a temperature of approximately 850° C. in order to make them become secure films. Generally, the slitting grooves 28 and 29 are so formed that their depth with respect to a thickness of the substrate 21 becomes equal to or less than a half of the thickness of the substrate 21, so as to avoid it from being cracked during handling in the manufacturing process.

Next, electrode paste containing silver-base conductive powder and glass is printed to form second upper surface electrode layers 23 in a manner that each of them overlaps a portion of the first upper surface electrode layers 22, as shown in FIG. 2(*b*). The second upper surface electrode layers 23 are then calcined at a temperature of approximately 850° C. in order to make them become stable films.

Resistive paste having a principal component of ruthenium oxide is printed to form resistance layers 24 in a manner that they connect electrically with the second upper surface electrode layers 23, as shown in FIG. 2(*c*). The resistance layers 24 are then calcined at a temperature of approximately 850° C. in order to make them become stable films.

Next, trimming is made to form trimmed slits 30 with a YAG laser, as shown in FIG. 3(*a*) in order to correct resistance values of the resistance layers 24 to a predetermined value. The trimming is made by setting trimming probes for measuring a resistance value on the second upper surface electrode layers 23 during this process.

Another paste having a principal component of glass is printed to form protective layers 25, as shown in FIG. 3(*b*), in order to protect the resistance layers 24, of which resistance values have been corrected. For this process, a printing pattern may be made in such a shape that the protective layers 25 cross over the slitting grooves 28 of vertical direction to connectively cover a plurality of the horizontally aligned resistance layers 24. The protective layers 25 are then calcined at a temperature of approximately 600° C. in order to make them become stable films.

Then, the substrate 21 in a sheet-form, on which the first upper surface electrode layers 22, the second upper surface electrode layers 23, the resistance layers 24, the trimmed slits 30, and the protective layers 25 have been formed, is separated into rectangular substrate strips 31 by splitting it along the slitting grooves 29 of horizontal direction in the substrate 21, as shown in FIG. 3(*c*). When this is done, the previously formed first upper surface electrode layers 22 lie in their respective positions on the side surfaces along a longitudinal direction of the rectangular substrate strips 31 down to the depth of the slitting grooves 29 of horizontal direction.

As a preparatory process for plating exposed surfaces of the first upper surface electrode layers 22 and the second upper surface electrode layers 23, the rectangular substrate strips 31 are finally separated into individual substrate pieces 32 by splitting them along the slitting grooves 28 of vertical direction, as shown in FIG. 3(d). A resistor is now completed when a nickel-plated layer, as an intermediate layer (not shown in the figure), and a solder-plated layer, as an outer layer (not shown in the figure) are formed by means of electroplating on exposed surfaces of the first upper surface electrode layers 22 and the second upper surface electrode layers 23, in order to prevent electrode-erosion during soldering and to assure reliability of the soldering.

Figure 4:
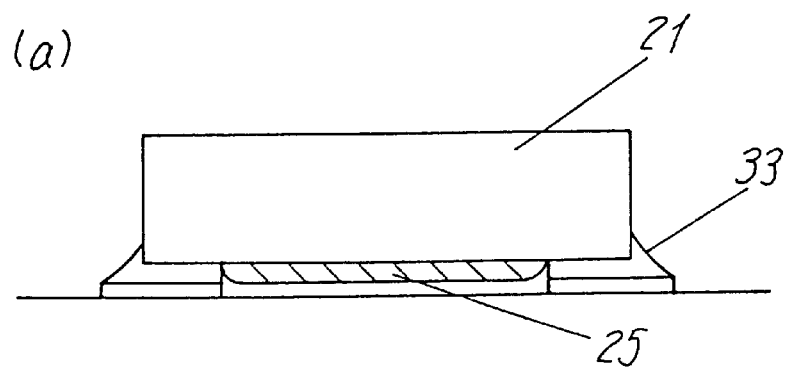
FIG. 4(a) is a sectional view depicting the same resistor in a mounted position.
FIG. 4(b) is a plan view depicting the same resistor in the mounted position.
Figure 4:
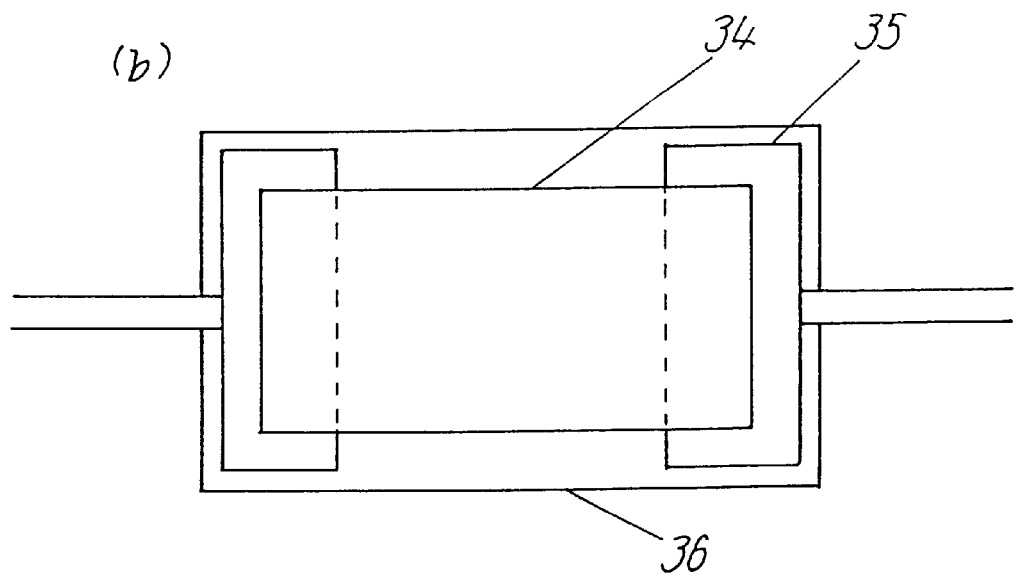

The resistor of the first exemplary embodiment of this invention constructed and manufactured as above is soldered on a mount board. As shown in a sectional view of FIG. 4(a) depicting the resistor of the first exemplary embodiment of this invention in a mounted position, the resistor is mounted with the surface having the protective layer down, and soldered with both the electrode layers on upper surfaces (not shown in the figure) and resistance layer portion on the side surface of the substrate. However, since these areas in the side surfaces, whereon electrodes are formed, are so small that fillets 33 are barely formed. Accordingly, an actual mount area 36 comes to the sum of a component area 34 and areas 35 required for soldering the side surfaces, as shown in a plan view of FIG. 4(b) depicting the resistor of the first exemplary embodiment of this invention in the mounted position. The invention attains a reduction of approximately 20% in the mount area when compared with a product of the prior art, in the case of a square-tip resistor in a size of 0.6×0.3 mm.

Accordingly, the structure of this invention requires a small area on a mount board to form fillets of soldering, because of the small areas of electrodes on the side surfaces of the resistor, and therefore it can reduce the mount areas.

In the first exemplary embodiment of this invention, if the solder-plated layers 27 and the protective layer 25 are formed to be on the same plane, or if the solder-plated layers 27 are formed to be higher than the protective layer 25, the resistor is not likely to allow a gap between the solder-plated layers 27 and a land pattern, when it is mounted, thereby further improving quality of mounting.

Besides, other characteristics can be improved in the first exemplary embodiment of this invention, if the second upper surface electrode layers 23 and the protective layer 25 are composed of combinations shown in Table 1.

TABLE 1

| Combination | Second upper surface electrode layers 23 | Protective layer 25 | Characteristics to be improved |
|---|---|---|---|
| 1 | Gold-base conductive powder and glass (calcined at 850° C.) | Glass-base material (calcined at 600° C.) | Improvement in loaded-life characteristic due to low ion migration |
| 2 | Silver-base conductive powder and glass (calcined at 850° C.) | Resin-base material (hardened at 200° C.) | No variation in resistance value in manufacturing process, and small deviation in resistance value of products, due to low processing temperature of protective layer. |
| 3 | Gold-base conductive powder and glass (calcined at 850° C.) | Resin-base material (hardened at 200° C.) | Both of characteristics of above combinations 1 and 2. |

In addition, it is easily conceivable that the mount area can be further reduced if electrodes are not formed on the side surfaces in the first exemplary embodiment of this invention.

Second Exemplary Embodiment

A resistor of a second exemplary embodiment of the present invention and a method of manufacturing the same will be described hereinafter by referring to accompanying figures.

Figure 5:
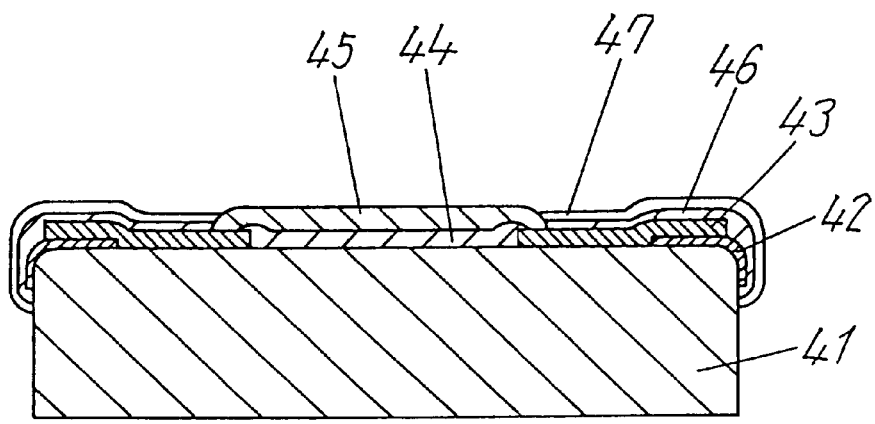
FIG. 5 is a sectional view depicting a resistor of a second exemplary embodiment of the present invention.

FIG. 5 is a sectional view of a resistor of the second exemplary embodiment of this invention.

In the figures, a reference numeral 41 represents a substrate containing 96% of alumina. A reference numeral 42 represents first upper surface electrode layers provided by sputtering gold-base material on side portions of an upper surface toward portions of side surfaces of the substrate 41. Ridges of these first upper surface electrode layers 42 are rounded. In addition, a surface area of the first upper surface electrode layer 42 occupying the side surface of the substrate 41 is not more than a half of an area of the side surface of the substrate 41. A reference numeral 43 represents second upper surface electrode layers composed of silver-base conductive powder containing glass for making electrical connection with the first upper surface electrode layers 42. A reference numeral 44 represents a resistance layer having a chief component of ruthenium oxide, for electrically connecting with the second upper surface electrode layers 43. A reference numeral 45 is a protective layer having a chief component of glass, provided on an upper surface of the resistance layer 44. Reference numerals 46 and 47 respectively represent nickel-plated layers and solder-plated layers provided, as occasion demands, for a purpose of assuring reliability, etc. during soldering.

The resistor of the second exemplary embodiment of this invention constructed as above is manufactured in a manner, which will be described hereinafter by referring to the figures.

Figure 6:
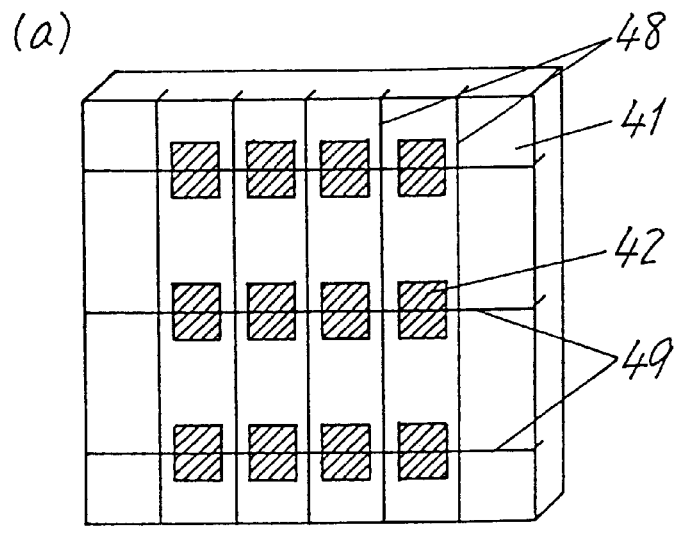
FIG. 6(a) through FIG. 6(c) represent a series of procedural views depicting a process of manufacturing the same resistor.
Figure 6:
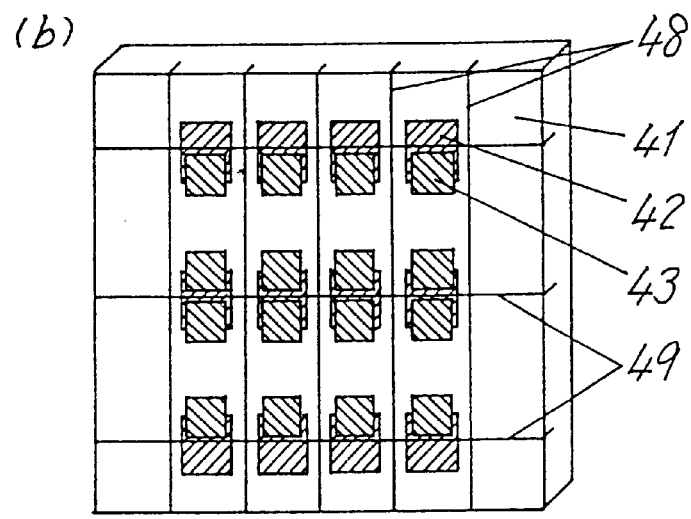
Figure 6:
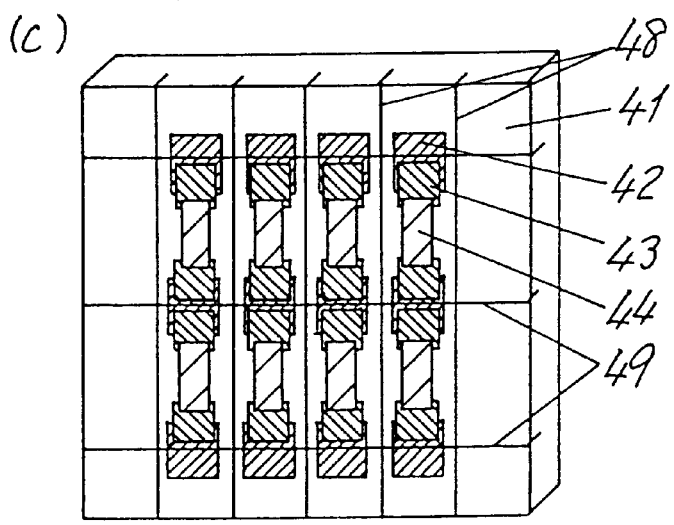
Figure 7:
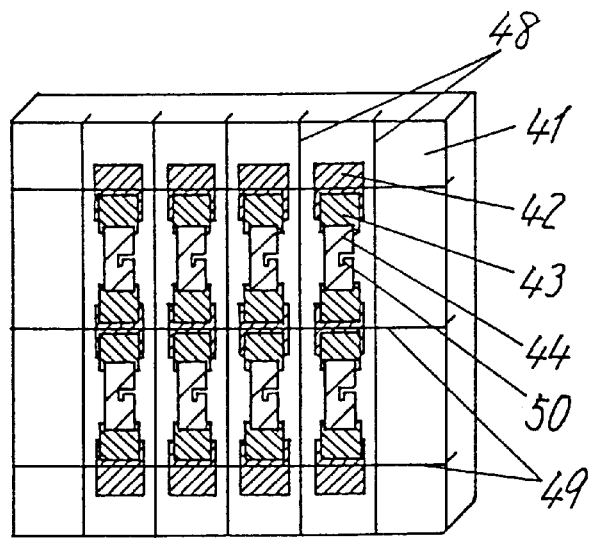
FIG. 7(a) through FIG. 7(d) represent another series of procedural views depicting the process of manufacturing the same resistor.
Figure 7:
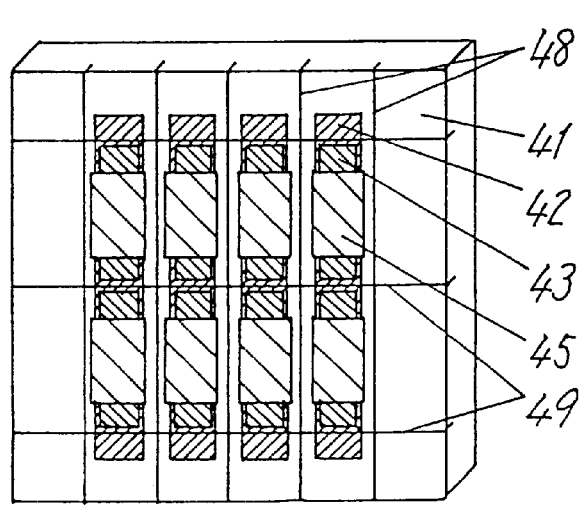
Figure 7:
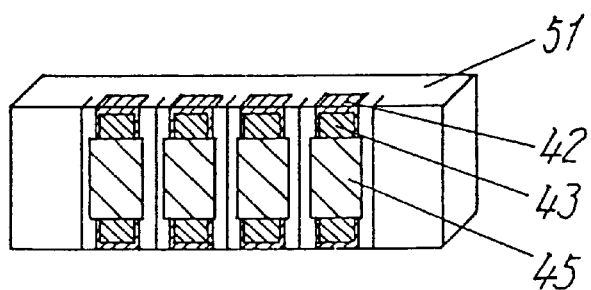
Figure 7:
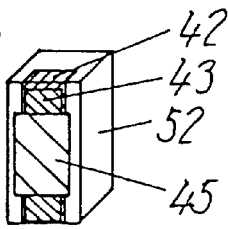

FIG. 6 and FIG. 7 represent a series of procedural views showing a manufacturing method of the resistor of the second exemplary embodiment of this invention.

First of all, gold is deposited in a form of film by sputtering method on an entire upper surface of a sheet-formed substrate 41, which has a superior heat-resisting property and an insulating property as it contains 96% alumina, and a surface of which is provided with a plurality of slitting grooves 48 and 49 in a vertical direction as well as in a horizontal direction in order to separate it into rectangular strips and then into individual pieces in the subsequent steps. Further, first upper surface electrode layers 42 having a desired electrode pattern are formed, as shown in FIG. 6(a), by a photo-lithographic method which is commonly used for LSI's, and the like. The first upper surface electrode layers 42 are then subjected to heat treatment at a temperature of approximately 300 to 400° C. in order to make them become stable films. During this process, the first upper surface electrode layers 42 get into slitting grooves 49 of horizontal direction, so as to form the first upper surface electrode layers 42 deeply down in the slitting grooves. Generally, the slitting grooves 48 and 49 are so formed that their depth with respect to a thickness of the substrate 41 becomes equal to or less than a half of the thickness of the substrate 41, so as to avoid it from being cracked during handling in the manufacturing process.

Next, electrode paste containing silver-base conductive powder and glass is printed to form second upper surface electrode layers 43 in a manner to make electrical connections with the first upper surface electrode layers 42, as shown in FIG. 6(b). The second upper surface electrode layers 43 are then calcined at a temperature of approximately 850° C. in order to make them become stable films.

Resistive paste having a principal component of ruthenium oxide is printed to form resistance layers 44 in a manner that they connect electrically with the second upper surface electrode layers 43, as shown in FIG. 6(*c*). The resistance layers 44 are then calcined at a temperature of approximately 850° C. in order to make them become stable films.

Next, trimming is made to form trimmed slits 50 with a YAG laser, as shown in FIG. 7(*a*) in order to correct resistance values of the resistance layers 44 to a predetermined value. The trimming is made with trimming probes for measuring a resistance value set on the second upper surface electrode layers 43 during this process.

Another paste having a principal component of glass is printed to form protective layers 45, as shown in FIG. 7(*b*), in order to protect the resistance layers 44, of which resistance values have been corrected. For this process, a printing pattern may be made in such a shape that the protective layers 45 cross over the slitting grooves 48 of vertical direction to connectively cover a plurality of the horizontally aligned resistance layers 44. The protective layers 45 are then calcined at a temperature of approximately 600° C. in order to make them become stable films.

Then, the substrate 41 in a sheet-form, on which the first upper surface electrode layers 42, the second upper surface electrode layers 43, the resistance layers 44, the trimmed slits 50, and the protective layers 45 have been formed, is separated into rectangular substrate strips 51 by splitting it along the slitting grooves 49 of horizontal direction in the substrate 41, as shown in FIG. 7(*c*). When this is done, the previously formed first upper surface electrode layers 42 lie in their respective positions on the side surfaces along a longitudinal direction of the rectangular substrate strips 51 down to the depth of the slitting grooves 49 of horizontal direction.

As a preparatory process for plating exposed surfaces of the first upper surface electrode layers 42 and the second upper surface electrode layers 43, the rectangular substrate strips 51 are finally separated into individual substrate pieces 52 by splitting them along the slitting grooves 48 of vertical direction, as shown in FIG. 7(*d*). A resistor is now completed when a nickel-plated layer, as an intermediate layer (not shown in the figure), and a solder-plated layer, as an outer layer (not shown in the figure), are formed by means of electroplating on otherwise exposed surfaces of the first upper surface electrode layers 42 and the second upper surface electrode layers 43 in order to prevent electrode-erosion during soldering and to assure reliability of the soldering.

Distinctive effects of the resistor of the second exemplary embodiment of this invention constructed and manufactured as above, when it is soldered on a mount board, are same as in the case of the resistor of the foregoing first exemplary embodiment, and therefore they are not described.

In addition, other characteristics can be improved in the second exemplary embodiment of this invention, if the first upper surface electrode layers 42, the second upper surface electrode layers 43, the resistance layer 44 and the protective layer 45 are composed of combinations shown in Table 2.

TABLE 2

| Combination | First upper surface electrode layers 42 | Second upper surface electrode layers 43 | Resistance layer 44 | Protective layer 45 | Characteristics to be improved |
|---|---|---|---|---|---|
| 4 | Sputtered gold-base material (heat-treated at 300–400° C.) | Gold-base conductive powder and glass (calcined at 850° C.) | Ruthenium oxide-base material (calcined at 850° C.) | Glass-base material (calcined at 600° C.) | Improvement in loaded-life characteristic due to low ion migration. |
| 5 | Sputtered gold-base material (heat-treated at 300–400° C.) | Silver-base conductive powder and glass (calcined at 850° C.) | Ruthenium oxide-base material (calcined at 850° C.) | Resin-base material (hardened at 200° C.) | No variation in resistance value in manufacturing process, and small deviation in resistance value of products, due to low processing temperature of protective layer. |
| 6 | Sputtered gold-base material (heat-treated at 300–400° C.) | Gold-base conductive powder and glass (calcined at 850° C.) | Ruthenium oxide-base material (calcined at 850° C.) | Resin-base material (hardened at 200° C.) | Both of characteristics of above combinations 4 and 5. |
| 7 | Sputtered nickel-base material (heat-treated at 300–400° C.) | Silver-base conductive powder and resin (hardened at 200° C.) | Carbonic resin-base material (hardened at 200° C.) | Resin-base material (hardened at 200° C.) | Same characteristic as above combination 5, with less manufacturing cost than above combination 6 due to use of base metal for first upper surface electrode layers. |
| 8 | Sputtered nickel-base material | Nickel-base conductive powder | Carbonic resin-base material (hardened | Resin-base material (hardened at 200° C.) | Same characteristic as above combination 7, with less manufacturing cost than above |

TABLE 2-continued

| Combination | First upper surface electrode layers 42 | Second upper surface electrode layers 43 | Resistance layer 44 | Protective layer 45 | Characteristics to be improved |
|---|---|---|---|---|---|
| | (heat-treated at 300–400° C.) | and resin (hardened at 200° C.) | at 200° C.) | | combination 7 due to use of base metal for second upper surface electrode layers. |

Third Exemplary Embodiment

A resistor of a third exemplary embodiment of the present invention and a method of manufacturing the same will be described hereinafter by referring to accompanying figures.

Figure 8:
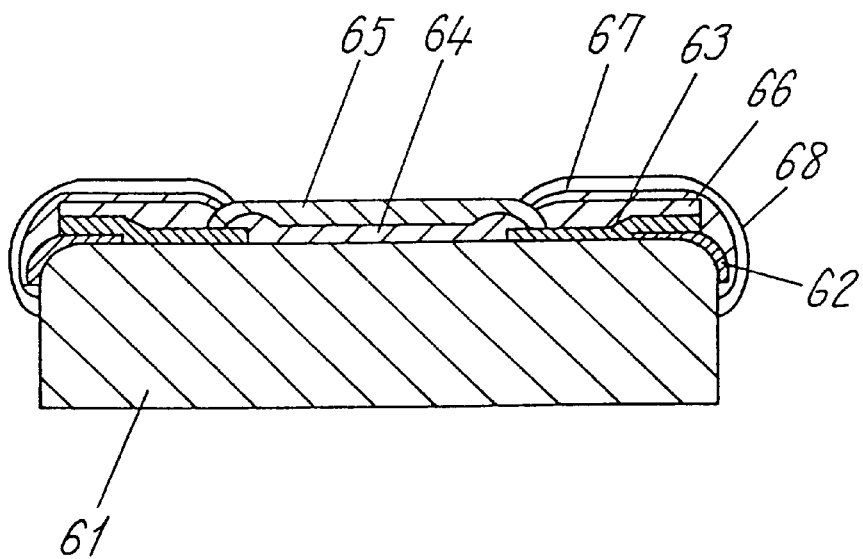
FIG. 8 is a sectional view depicting a resistor of a third exemplary embodiment of the present invention.

FIG. 8 is a sectional view of a resistor of the third exemplary embodiment of this invention.

In FIG. 8, a reference numeral 61 represents a substrate containing 96% of alumina. A reference numeral 62 represents first upper surface electrode layers, which are constructed of calcined gold-base organic metal compound, provided on side portions of an upper surface toward portions of side surfaces of the substrate 61. A surface area of the first upper surface electrode layer 62 occupying the side surface of the substrate 61 is not more than a half of an area of the side surface of the substrate 61. A reference numeral 63 represents a pair of second upper surface electrode layers composed of silver-base conductive powder containing glass for making electrical connections with the first upper surface electrode layers 62. A reference numeral 64 represents a resistance layer having a chief component of ruthenium oxide for electrically connecting with the second upper surface electrode layers 63. A reference numeral 65 is a protective layer having a chief component of glass provided on an upper surface of the resistance layer 64. A reference numeral 66 represents third upper surface electrode layers composed of silver-base conductive powder containing glass, and provided on portions of upper surfaces of the second upper surface electrode layers 63. Reference numerals 67 and 68 respectively represent a nickel-plated layer and a solder-plated layer provided, as occasion demands, for a purpose of assuring reliability, etc. during soldering.

The resistor of the third exemplary embodiment of this invention constructed as above is manufactured in a manner, which will be described hereinafter by referring to the accompanying figures.

Figure 9:
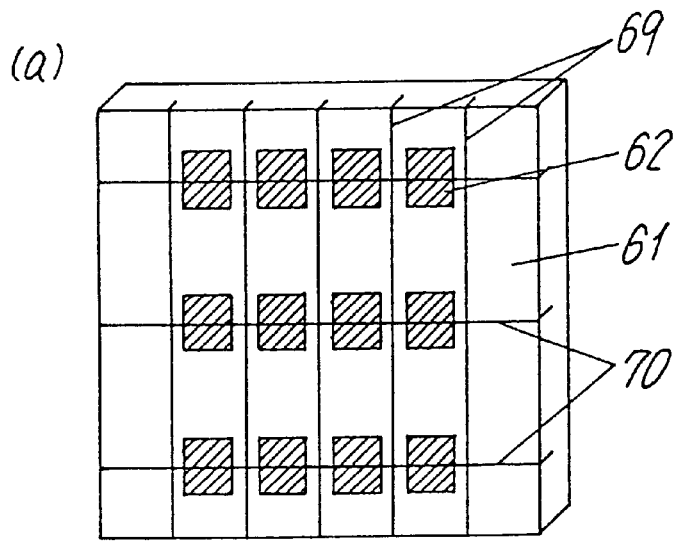
FIG. 9(a) through FIG. 9(c) represent a series of procedural views depicting a process of manufacturing the same resistor.
Figure 9:
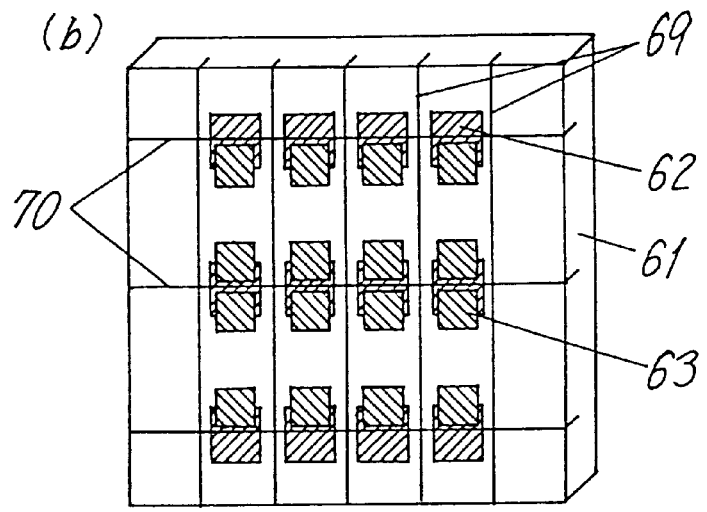
Figure 9:
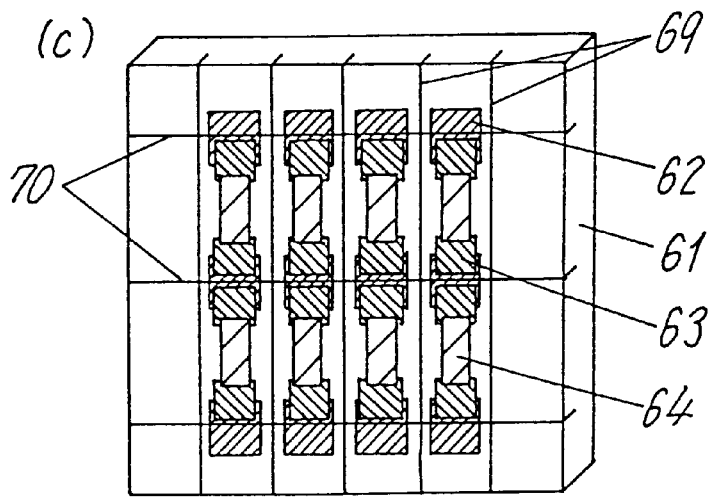
Figure 10:
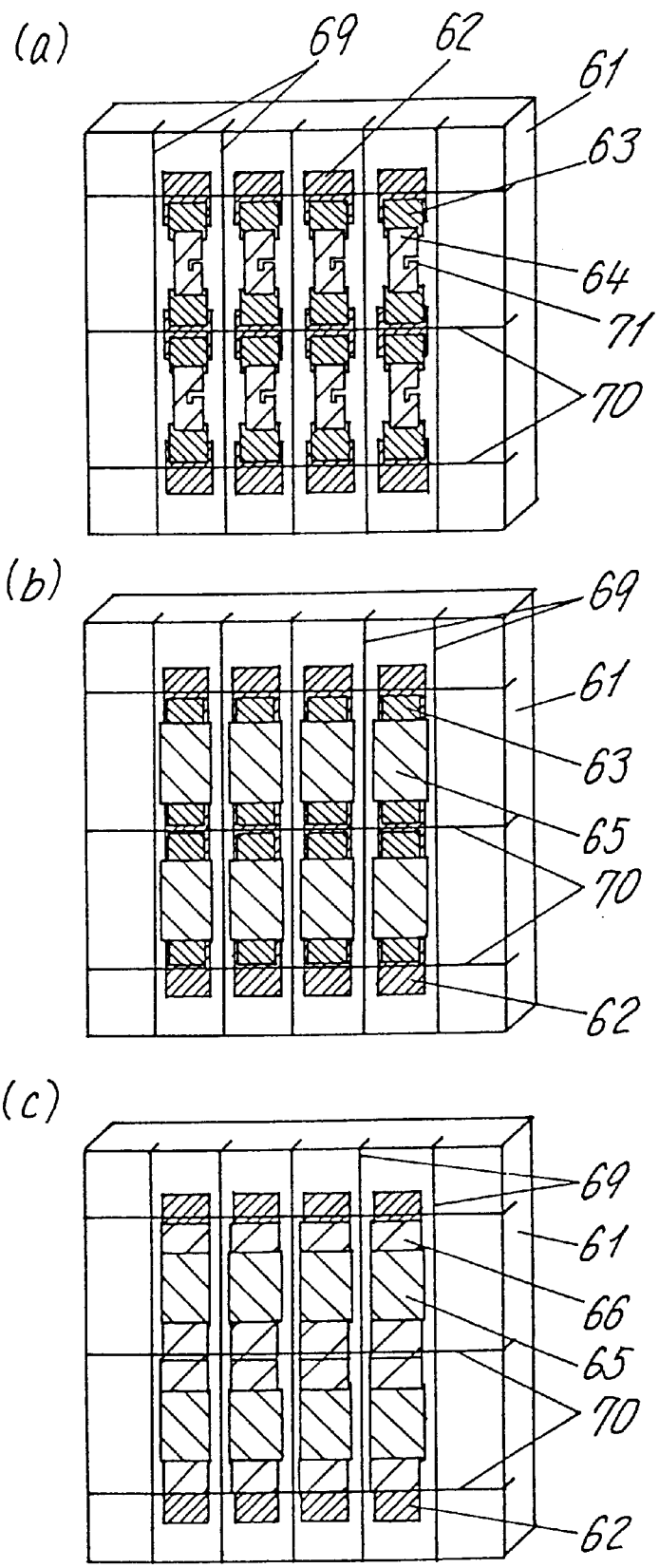
FIG. 10(a) through FIG. 10(c) represent another series of procedural views depicting the process of manufacturing the same resistor.
Figure 11:
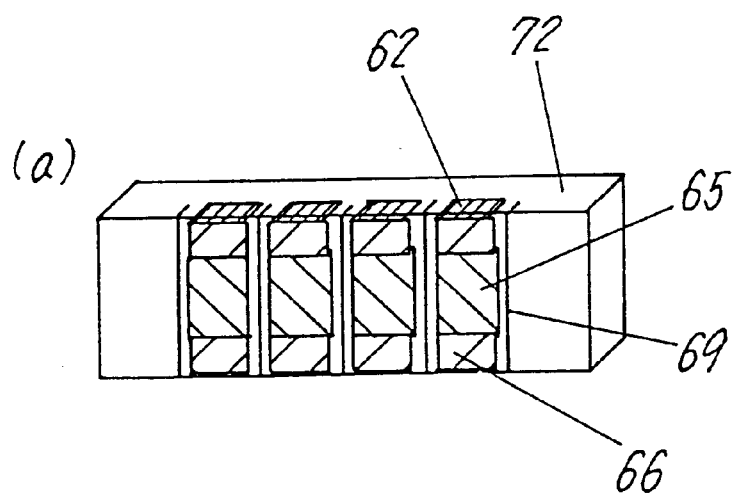
FIG. 11(a) and FIG. 11(b) represent still another series of procedural views depicting the process of manufacturing the same resistor.
Figure 11:
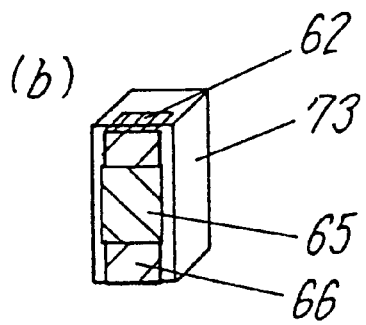

FIG. 9 through FIG. 11 represent a series of procedural views showing a manufacturing method of the resistor of the third exemplary embodiment of this invention.

In the beginning, first upper surface electrode layers 62 are formed, as shown in FIG. 9(a), by printing electrode paste containing gold-base organic metal compound in a manner to cross over slitting grooves 70 made in a horizontal direction through a sheet-formed substrate 61, which has a superior heat-resisting property and an insulating property as it contains 96% alumina, and a surface of which is provided with a plurality of slitting grooves 69 and 70 in a vertical direction as well as in a horizontal direction in order to separate it into rectangular strips and then into individual pieces in the subsequent steps. The first upper surface electrode layers 62 are subjected to calcination at a temperature of approximately 850° C. in order to make them become stable films. During this process, the electrode paste gets into the slitting grooves 70 of horizontal direction, so as to form the first upper surface electrode layers 62 deeply down in the slitting grooves. In general, the slitting grooves 69 and 70 are so formed that their depth with respect to a thickness of the substrate 61 becomes equal to or less than a half of the thickness of the substrate 61, in order to avoid it from being cracked during handling in the manufacturing process.

Next, electrode paste containing silver-base conductive powder and glass is printed to form second upper surface electrode layers 63 in a manner to make electrical connections with the first upper surface electrode layers 62, as shown in FIG. 9(b). The second upper surface electrode layers 63 are then calcined at a temperature of approximately 850° C. in order to make them become stable films.

Resistive paste having a principal component of ruthenium oxide is printed to form resistance layers 64 in a manner that they connect electrically with the second upper surface electrode layers 63, as shown in FIG. 9(c). The resistance layers 64 are then calcined at a temperature of approximately 850° C. in order to make them become stable films.

Next, trimming is made to form trimmed slits 71 with a YAG laser, as shown in FIG. 10(a) in order to correct resistance values of the resistance layers 64 to a predetermined value. The trimming is made with trimming probes for measuring a resistance value set on the second upper surface electrode layers 63 during this process.

Another paste having a principal component of glass is printed to form protective layers 65, as shown in FIG. 10(b), in order to protect the resistance layers 64, of which resistance values have been corrected. For this process, a printing pattern may be made in such a shape that the protective layers 65 cross over the slitting grooves 69 of vertical direction to connectively cover a plurality of the horizontally aligned resistance layers 64. The protective layers 65 are then calcined at a temperature of approximately 600° C. in order to make them become stable films.

Next, electrode paste containing silver-base conductive powder and glass is printed to form third upper surface electrode layers 66 on portions of upper surfaces of the first upper surface electrode layers 62 and the second upper surface electrode layers 63 in a manner not to cross the slitting grooves 70 of horizontal direction, as shown in FIG. 10(c). The third upper surface electrode layers 66 are then calcined at a temperature of approximately 600° C. in order to make them become stable films.

Then, the substrate 61 in a sheet-form, on which the first upper surface electrode layers 62, the second upper surface electrode layers 63, the resistance layers 64, the trimmed slits 71, the protective layers 65 and the third upper surface electrode layers 66 have been formed, is separated into rectangular substrate strips 72 by splitting it along the slitting grooves 70 of horizontal direction in the substrate 61, as shown in FIG. 11(a). When this is done, the previously formed first upper surface electrode layers 62 lie in their respective positions on the side surfaces along a longitudinal direction of the rectangular substrate strips 72 down to the depth of the slitting grooves 70 of horizontal direction.

As a preparatory process for plating exposed surfaces of the first upper surface electrode layers 62, the second upper surface electrode layers 63 and the third upper surface electrode layers 66, the rectangular substrate strips 72 are finally separated into individual substrate pieces 73 by splitting them along the slitting grooves 69 of vertical, direction, as shown in FIG. 11(b). A resistor is now completed when a nickel-plated layer, as an intermediate layer (not shown in the figure), and a solder-plated layer, as an outer layer (not shown in the figure) are formed by means of electroplating on all exposed surfaces of the first upper surface electrode layers 62, the second upper surface electrode layers 63 and the third upper surface electrode layers 66 in order to prevent electrode-erosion during soldering, and to assure reliability of the soldering.

Figure 12:
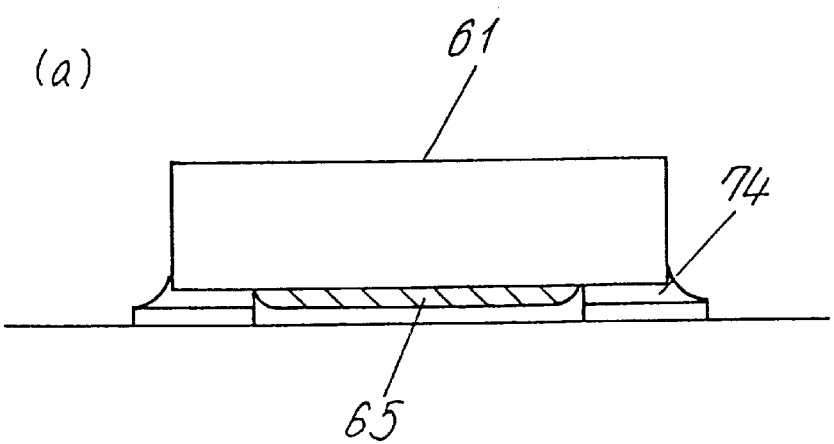
FIG. 12(a) is a sectional view depicting the same resistor in a mounted position.
FIG. 12(b) is a plan view depicting the same resistor in the mounted position.
Figure 12:
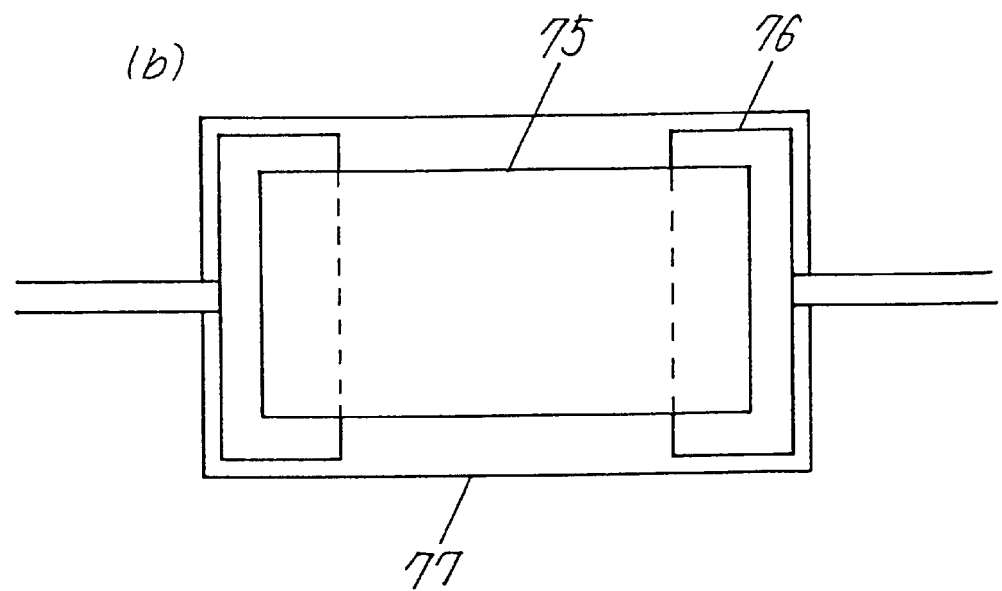

The resistor of the third exemplary embodiment of this invention constructed and manufactured as above is soldered on a mount board. The resistor is mounted with the surface having the protective layer down, as shown in a sectional view of FIG. 12(a) depicting a mounted position in the third exemplary embodiment of this invention, and soldered with the first, second and third upper surface electrode layers (not shown in the figure) and the resistance layer portion on a side surface of the substrate. However, since these areas in the side surfaces, whereon the electrodes are formed, are so small that fillets 74 are barely formed. Accordingly, an actual mount area 77 comes to the sum of a component area 75 and areas 76 required for soldering the side surfaces of this component, as shown in a plan view of FIG. 12(b) depicting the mounted position. The invention attains a reduction of approximately 20% in the mount area when compared with a product of the prior art, in the case of a square-tip resistor in a size of 0.6×0.3 mm.

Therefore, the structure according to the third exemplary embodiment of this invention requires a small area on a mount board to form fillets of soldering, because of the small areas of electrodes on the side surfaces of the resistor, and thereby it can reduce the mount areas.

In the third exemplary embodiment of this invention, if solder-plated layers 68 and the protective layer 65 are formed to be on the same plane, or if the solder-plated layers 68 are formed to be higher than the protective layer 65, the resistor is not likely to allow a gap between the solder-plated layers 68 and a land pattern 76, when it is mounted, thereby further improving quality of mounting.

Besides, other characteristics can be improved in the third exemplary embodiment of this invention, if the second upper surface electrode layers 63, the protective layer 65 and the third upper surface electrode layers 66 are composed of combinations shown in Table 3.

TABLE 3

| Combination | Second upper surface electrode layers 63 | Third upper surface electrode layers 66 | Protective layer 65 | Characteristics to be improved |
|---|---|---|---|---|
| 1 | Silver-base conductive powder and glass (calcined at 850° C.) | Silver-base conductive powder and resin (hardened at 200° C.) | Glass-base material (calcined at 600° C.) | No variation in resistance value during manufacturing process, and small deviation in resistance value of products, due to low processing temperature of third upper surface electrode layers 66. |
| 2 | Silver-base conductive powder (calcined at 850° C.) | Nickel-base conductive powder and resin (hardened at 200° C.) | Glass-base material (calcined at 600° C.) | Same characteristic as above combination 1, with less manufacturing cost due to use of base metal for third upper surface electrode layers 66. |
| 3 | Silver-base conductive powder and glass (calcined at 850° C.) | Silver-base conductive powder and resin (hardened at 200° C.) | Resin-base material (hardened at 200° C.) | Small deviation in resistance value of products, due to less variation in manufacturing process than above combination 1, as protective layer 65 is processed at lower temperature |
| 4 | Silver-base conductive powder and glass (calcined at 850° C.) | Nickel-base conductive powder and resin (hardened at 200° C.) | Resin-base material (hardened at 200° C.) | Same characteristic as above combination 3, with less manufacturing cost due to use of base metal for third upper surface electrode layers 66. |
| 5 | Gold-base conductive powder and glass (calcined at 850° C.) | Silver-base conductive powder and glass (calcined at 600° C.) | Glass-base material (calcined at 600° C.) | Improvement in loaded-life characteristic due to low ion migration. |
| 6 | Gold-base conductive powder and glass (calcined at 850° C.) | Silver-base conductive powder and resin (hardened at 200° C.) | Glass-base material (calcined at 600° C.) | Both of characteristics of above combinations 1 and 5. |
| 7 | Gold-base conductive powder and glass (calcined at 850° C.) | Nickel-base conductive powder and resin (hardened at 200° C.) | Glass-base material (calcined at 600° C.) | Both of characteristics of above combinations 2 and 5. |
| 8 | Gold-base conductive powder and glass (calcined at 850° C.) | Silver-base conductive powder and resin (hardened at 200° C.) | Resin-base material (hardened at 200° C.) | Both of characteristics of above combinations 3 and 5. |
| 9 | Gold-base conductive powder and glass (calcined at 850° C.) | Nickel-base conductive powder and resin (hardened at 200° C.) | Resin-base material (hardened at 200° C.) | Both of characteristics of above combinations 4 and 5. |

In addition, it is easily conceivable that the mount area can be further reduced if electrodes are not formed on the side surfaces in the third exemplary embodiment of this invention.

Fourth Exemplary Embodiment

A resistor of a fourth exemplary embodiment of the present invention and a method of manufacturing the same will be described hereinafter by referring to accompanying figures.

Figure 13:
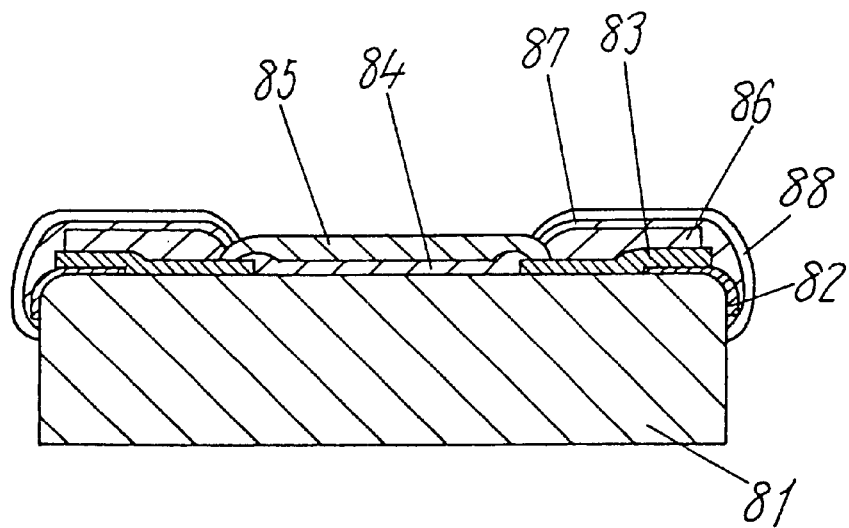
FIG. 13 is a sectional view depicting a resistor of a fourth exemplary embodiment of the present invention.

FIG. 13 is a sectional view of a resistor of the fourth exemplary embodiment of this invention.

In FIG. 13, a reference numeral 81 represents a substrate containing 96% of alumina. A reference numeral 82 represents first upper surface electrode layers provided by sputtering gold-base material on side portions of an upper surface and portions of side surfaces of the substrate 81. A surface area of the first upper surface electrode layer 82 occupying the side surface of the substrate 81 is not more than a half of an area of the side surface of the substrate 81. A reference numeral 83 represents second upper surface electrode layers containing silver-base conductive powder and glass for making electrical connections with the first upper surface electrode layers 82. A reference numeral 84 represents a resistance layer having a chief component of ruthenium oxide for electrically connecting with the second upper surface electrode layers 83. A reference numeral 85 is a protective layer having a chief component of glass, and provided on an upper surface of the resistance layer 84. A reference numeral 86 represents third upper surface electrode layers composed of silver-base conductive powder containing glass, provided on portions of the first upper surface electrode layers 82 and the second upper surface electrode layers 83. Reference numerals 87 and 88 respectively represent nickel-plated layers and solder-plated layers provided, as occasion demands, for a purpose of assuring reliability, etc. during soldering.

The resistor of the fourth exemplary embodiment of this invention constructed as above is manufactured in a manner, which will be described hereinafter by referring to the figures.

Figure 14:
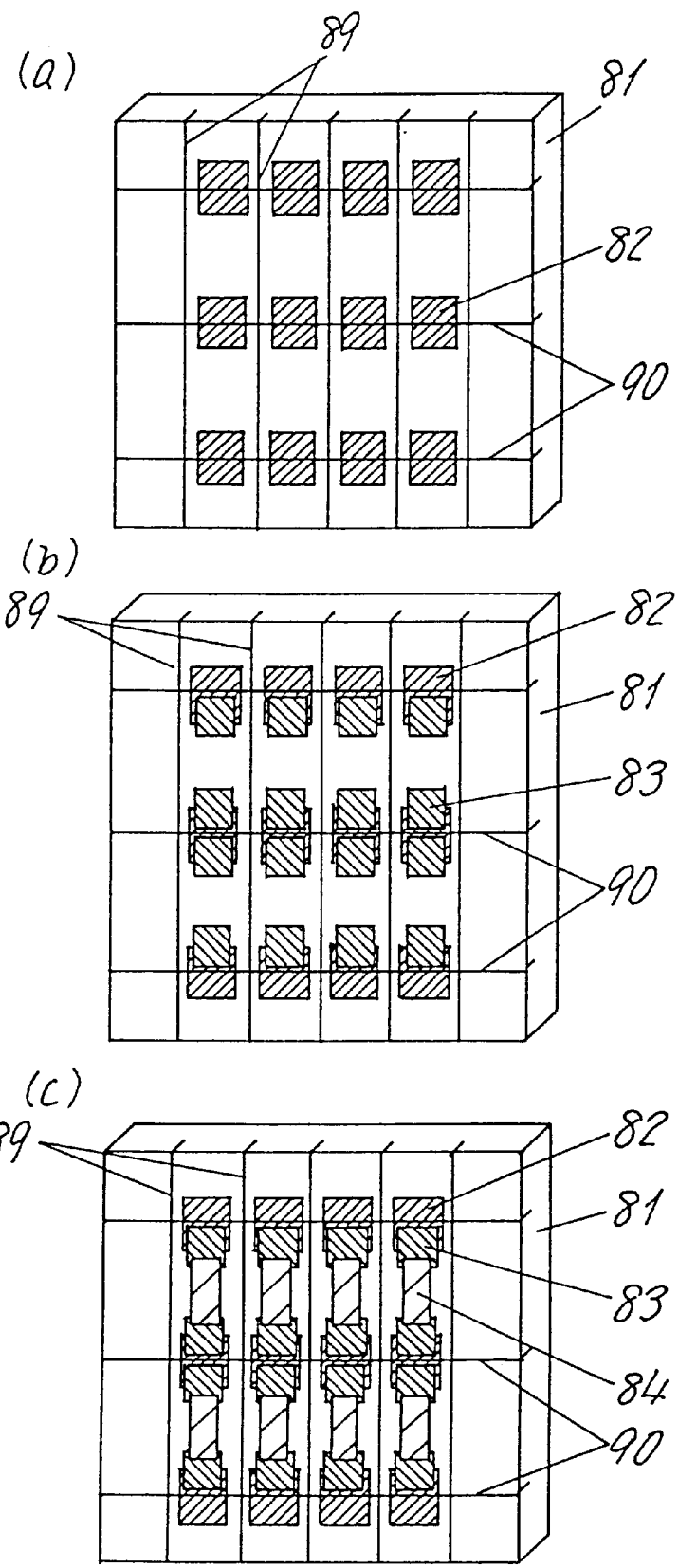
FIG. 14(a) through FIG. 14(c) represent a series of procedural views depicting a process of manufacturing the same resistor.
Figure 15:
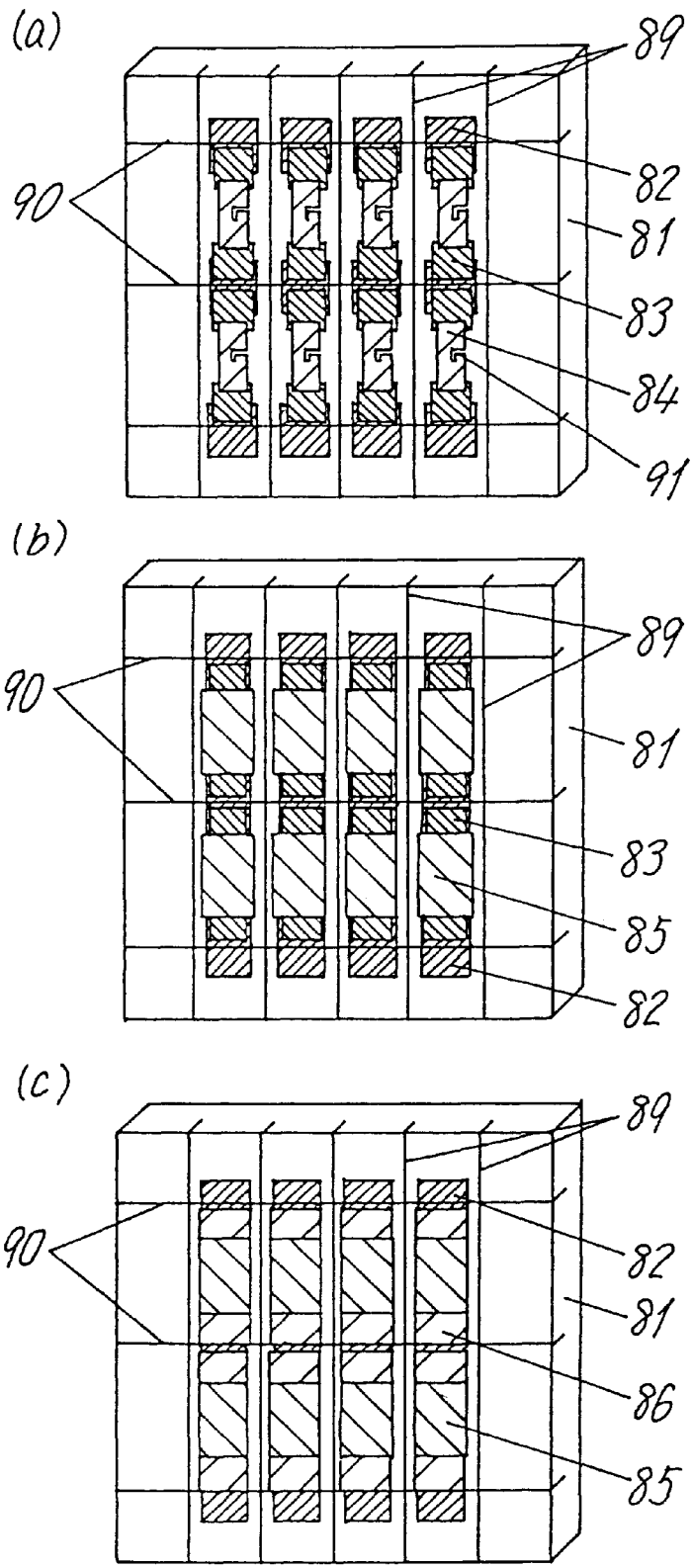
FIG. 15(a) through FIG. 15(c) represent another series of procedural views depicting the process of manufacturing the same resistor.
Figure 16:
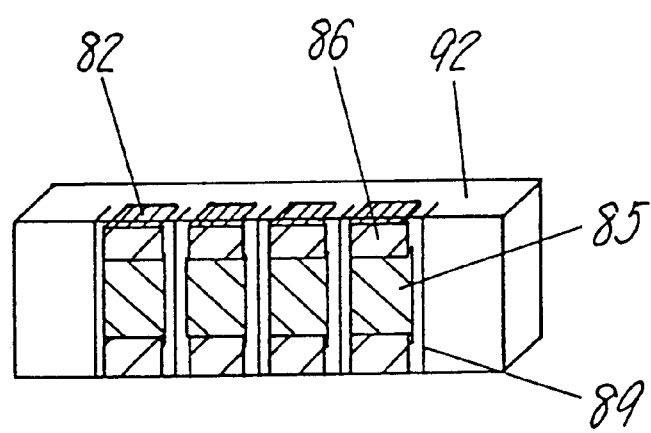
FIG. 16(a) and FIG. 16(b) represent still another series of procedural views depicting the process of manufacturing the same resistor.
Figure 16:
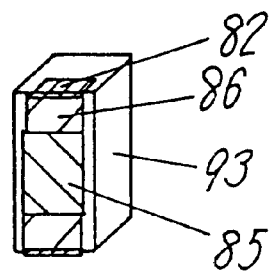

FIG. 14 through FIG. 16 represent a series of procedural views showing a manufacturing method of the resistor of the fourth exemplary embodiment of this invention.

First of all, gold is deposited in a form of film by sputtering method on an entire upper surface of a sheet-formed substrate 81, which has a superior heat-resisting property and an insulating property as it contains 96% alumina, and a surface of which is provided with a plurality of slitting grooves 89 and 90 in a vertical direction as well as a horizontal direction in order to separate it into rectangular strips and individual pieces in the subsequent steps. Further, first upper surface electrode layers 82 having a desired electrode pattern are formed, as shown in FIG. 14(a), by photo-lithographic method which is normally used for LSI's, and the like. The first upper surface electrode layers 82 are subjected to heat treatment at a temperature of approximately 300 to 400° C. in order to make them become stable films. During this process, the first upper surface electrode layers 82 get into the slitting grooves 90 of horizontal direction, so as to form the first upper surface electrode layers 82 deeply down in the slitting grooves. Generally, the slitting grooves 89 and 90 are so formed that their depth with respect to a thickness of the substrate 81 becomes equal to or less than a half of the thickness of the substrate 81, so as to avoid it from being cracked during handling in the manufacturing process.

Next, electrode paste containing silver-base conductive powder and glass is printed to form second upper surface electrode layers 83 in a manner to make electrical connections with the first upper surface electrode layers 82, as shown in FIG. 14(b). The second upper surface electrode layers 83 are then calcined at a temperature of approximately 850° C. in order to make them become stable films.

Resistive paste having a principal component of ruthenium oxide is printed to form resistance layers 84 in a manner that they connect electrically with the second upper surface electrode layers 83, as shown in FIG. 14(c). The resistance layers 84 are then calcined at a temperature of approximately 850° C. in order to make them become stable films.

Next, trimming is made to form trimmed slits 91 with a YAG laser, as shown in FIG. 15(a) in order to correct resistance values of the resistance layers 84 to a predetermined value. The trimming is made with trimming probes for measuring a resistance value set on the second upper surface electrode layers 83 during this process.

Another paste having a principal component of glass is printed to form protective layers 85, as shown in FIG. 15(b), in order to protect the resistance layers 84, of which resistance values have been corrected. For this process, a printing pattern may be made in such a shape that the protective layers 85 cross over the slitting grooves 89 of vertical direction to connectively cover a plurality of the horizontally aligned resistance layers 84. The protective layers 85 are then calcined at a temperature of approximately 600° C. in order to make them become stable films.

Next, electrode paste containing silver-base conductive powder and glass is printed to form third upper surface electrode layers 86 on portions of upper surfaces of the first upper surface electrode layers 82 and the second upper surface electrode layers 83 in a manner not to cross the slitting grooves 90 of horizontal direction, as shown in FIG. 15(c). The third upper surface electrode layers 86 are then calcined at a temperature of approximately 600° C. in order to make them become stable films.

Then, the substrate 81 in a sheet-form, on which the first upper surface electrode layers 82, the second upper surface electrode layers 83, the resistance layers 84, the trimmed slits 91, the protective layers 85 and the third upper surface electrode layers 86 have been formed, is separated into rectangular substrate strips 92 by splitting it along the slitting grooves 90 of horizontal direction in the substrate 81, as shown in FIG. 16(a). When this is done, the previously formed first upper surface electrode layers 82 lie in their respective positions on the side surfaces along a longitudinal direction of the rectangular substrate strips 92 down to the depth of the slitting grooves 90 of horizontal direction.

As a preparatory process for plating exposed surfaces of the first upper surface electrode layers 82, the second upper surface electrode layers 83 and the third upper surface electrode layers 86, the rectangular substrate strips 82 are finally separated into individual substrate pieces 93 by splitting them along the slitting grooves 89 of vertical direction, as shown in FIG. 16(b). A resistor is now completed when a nickel-plated layer, as an intermediate layer (not shown in the figure), and a solder-plated layer, as an outer layer (not shown in the figure) are formed by means of electroplating on all exposed surfaces of the first upper surface electrode layers 82, the second upper surface electrode layers 83 and the third upper surface electrode layers 86 in order to prevent electrode-erosion during soldering, and to assure reliability of the soldering.

Distinctive effects of the resistor of the fourth exemplary embodiment of this invention constructed and manufactured as above, when it is soldered on a mount board, are same as in the case of the above-described third exemplary embodiment, and therefore they are not described further.

In addition, other characteristics can be improved in the fourth exemplary embodiment of this invention, if the first upper surface electrode layers 82, the second upper surface electrode layers. 83, the resistance layer 84, the protective layer 85 and the third upper surface electrode layers 86 are composed of combinations shown in Table 4.

TABLE 4

| Combination | First upper surface electrode layers 82 | Second upper surface electrode layers 83 | Third upper surface electrode layers 86 | Resistance layer 84 Protective layer 85 | Characteristics to be improved |
|---|---|---|---|---|---|
| 10 | Sputtered gold-base material | Silver-base conductive powder and glass (calcined at 850° C.) | Silver-base conductive powder and glass (hardened at 200° C.) | Ruthenium oxide-base (calcined at 850° C.) Glass-base (calcined at 600° C.) | Same characteristic as combination 1 in Table 1. |
| 11 | Sputtered gold-base material | Silver-base conductive powder and glass (calcined at 850° C.) | Nickel-base conductive powder and resin (hardened at 200° C.) | Ruthenium oxide-base (calcined at 850° C.) Glass-base (calcined at 600° C.) | Same characteristic as combination 2 in Table 1. |
| 12 | Sputtered gold-base material | Silver-base conductive powder and glass (calcined at 850° C.) | Silver-base conductive powder and resin (hardened at 200° C.) | Ruthenium oxide-base (calcined at 850° C.) Resin-base (hardened at 200° C.) | Same characteristic as combination 3 in Table 1. |
| 13 | Sputtered gold-base material | Silver-base conductive powder and glass (calcined at 850° C.) | Nickel-base conductive powder and resin (hardened at 200° C.) | Ruthenium oxide-base (calcined at 850° C.) Resin-base (hardened at 200° C.) | Same characteristic as combination 4 in Table 1. |
| 14 | Sputtered gold-base material | Gold-base conductive powder and glass (calcined at 850° C.) | Silver-base conductive powder and glass (calcined at 600° C.) | Ruthenium oxide-base (calcined at 850° C.) Glass-base (calcined at 600° C.) | Same characteristic as combination 5 in Table 1. |
| 15 | Sputtered gold-base material | Gold-base conductive powder and glass (calcined at 850° C.) | Silver-base conductive powder and resin (hardened at 200° C.) | Ruthenium oxide-base (calcined at 850° C.) Glass-base (calcined at 600° C.) | Same characteristic as combination 6 in Table 1. |
| 16 | Sputtered gold-base material | Gold-base conductive powder and glass (calcined at 850° C.) | Nickel-base conductive powder and resin (hardened at 200° C.) | Ruthenium oxide-base (calcined at 850° C.) Glass-base (calcined at 600° C.) | Same characteristic as combination 7 in Table 1. |
| 17 | Sputtered gold-base material | Gold-base conductive powder and glass (calcined at 850° C.) | Silver-base conductive powder and resin (hardened at 200° C.) | Ruthenium oxide-base (calcined at 850° C.) Resin-base (hardened at 200° C.) | Same characteristic as combination 8 in Table 1. |
| 18 | Sputtered gold-base material | Gold-base conductive powder and glass (calcined at 850° C.) | Nickel-base conductive powder and resin (hardened at 200° C.) | Ruthenium oxide-base (calcined at 850° C.) Resin-base (hardened at 200° C.) | Same characteristic as combination 9 in Table 1. |
| 19 | Sputtered nickel-base material | Silver-base conductive powder and resin (hardened at 200° C.) | Silver-base conductive powder and resin (hardened at 200° C.) | Carbonic resin-base (hardened at 200° C.) Resin-base (hardened at 200° C.) | Save electricity, as material needing low temp processing is used for second upper surface electrode layers 83 and resistance layer 84. |
| 20 | Sputtered nickel-base material | Silver-base conductive powder and | Nickel-base conductive powder and | Carbonic resin-base (hardened | Same characteristic as combination 19, with less |

TABLE 4-continued

| Combination | First upper surface electrode layers 82 | Second upper surface electrode layers 83 | Third upper surface electrode layers 86 | Resistance layer 84 Protective layer 85 | Characteristics to be improved |
|---|---|---|---|---|---|
| | | resin (hardened at 200° C.) | resin (hardened at 200° C.) | at 200° C.) Resin-base (hardened at 200° C.) | manufacturing cost due to use of base metal for third upper surface electrode layers 86. |

In addition, it is easily conceivable that the mount area can be further reduced if electrodes are not formed on the side surfaces in the fourth exemplary embodiment of this invention.

Fifth Exemplary Embodiment

A resistor of a fifth exemplary embodiment of the present invention and a method of manufacturing the same will be described hereinafter by referring to accompanying figures.

Figure 17:
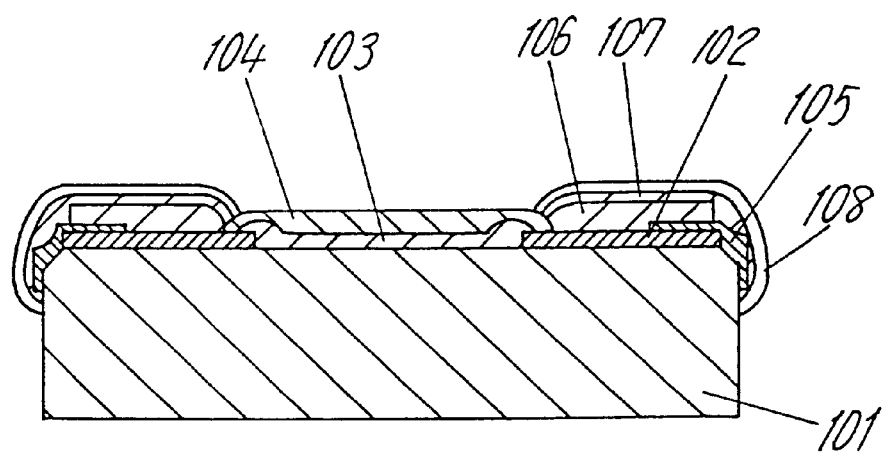
FIG. 17 is a sectional view depicting a resistor of a fifth exemplary embodiment of the present invention.

FIG. 17 is a sectional view of a resistor of the fifth exemplary embodiment of this invention.

In FIG. 17, a reference numeral 101 represents a substrate containing 96% of alumina. A reference numeral 102 represents first upper surface electrode layers composed of silver-base conductive powder containing glass, and provided on side portions of a main surface of the substrate 101. A reference numeral 103 represents a resistance layer having a chief component of ruthenium oxide for electrically connecting with the first upper surface electrode layers 102. A reference numeral 104 is a protective layer having a chief component of glass, and provided on an upper surface of the resistance layer 103. A reference numeral 105 represents second upper surface electrode layers formed by means of sputtering gold-base material on upper surfaces and portions of side surfaces of the first upper surface electrode layers 102. A surface area of the second upper surface electrode layer 105 occupying the side surface of the substrate 101 is mot more than a half of an area of the side surface of the substrate 101. A reference numeral 106 represents third upper surface electrode layers composed of silver-base conductive powder containing glass, overlapping portions of upper surfaces of the first upper surface electrode layers 102 and the second upper surface electrode layers 105. Reference numerals 107 and 108 respectively represent nickel-plated layers and solder-plated layers provided, as occasion demands, for a purpose of assuring reliability, etc. during soldering.

The resistor of the fifth exemplary embodiment of this invention constructed as above is manufactured in a manner, which will be described hereinafter by referring to the figures.

Figure 18:
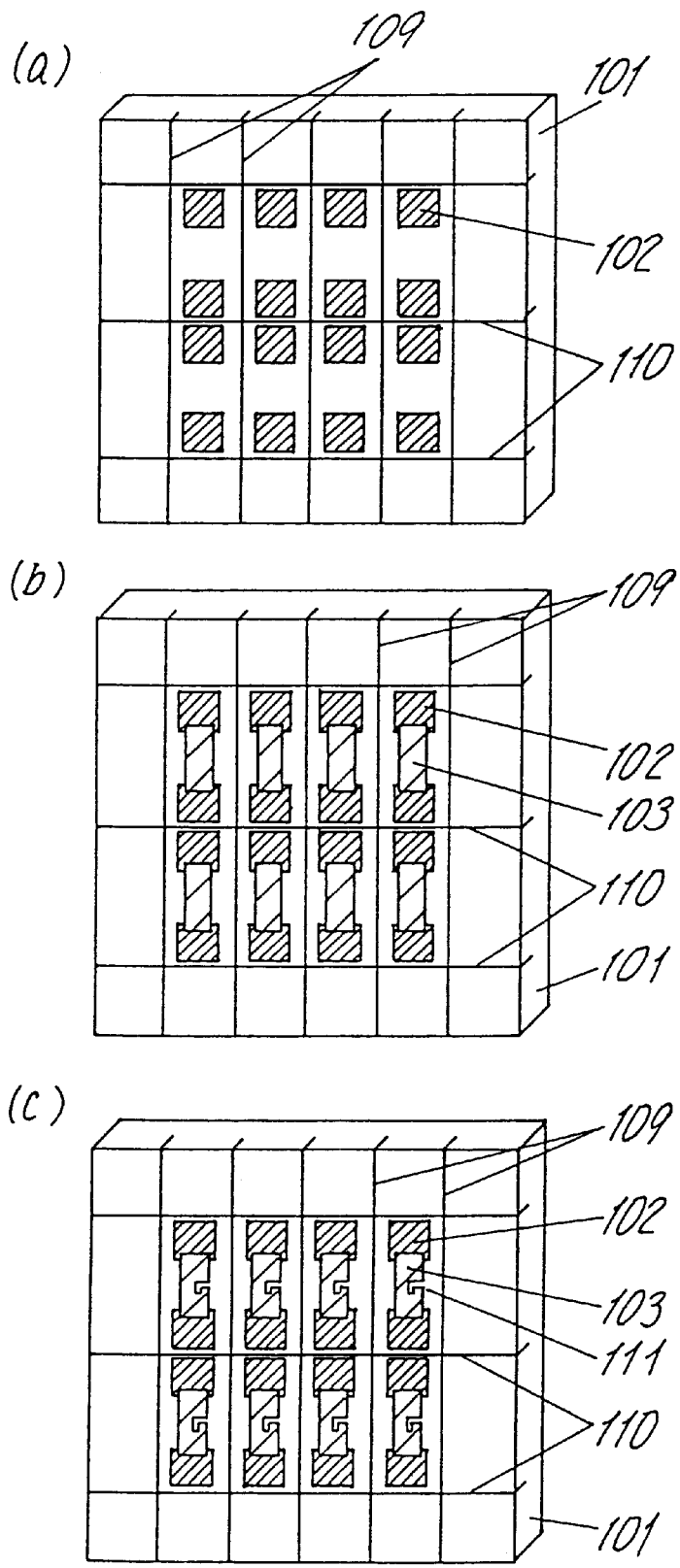
FIG. 18(a) through FIG. 18(c) represent a series of procedural views depicting a process of manufacturing the same resistor.
Figure 19:
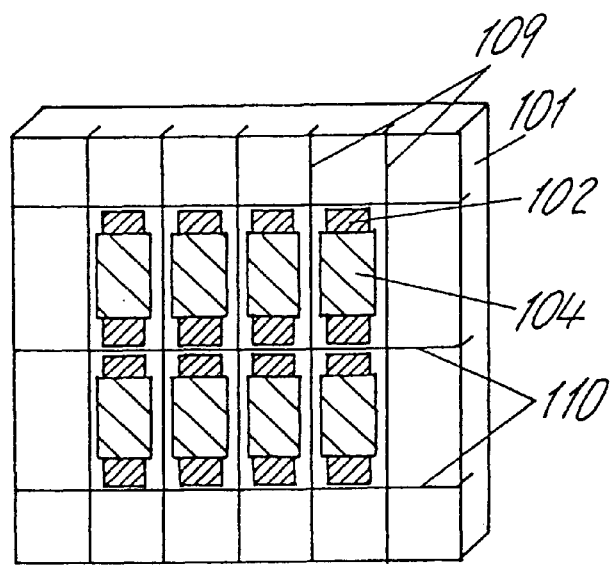
FIG. 19(a) through FIG. 19(c) represent another series of procedural views depicting the process of manufacturing the same resistor.
Figure 19:
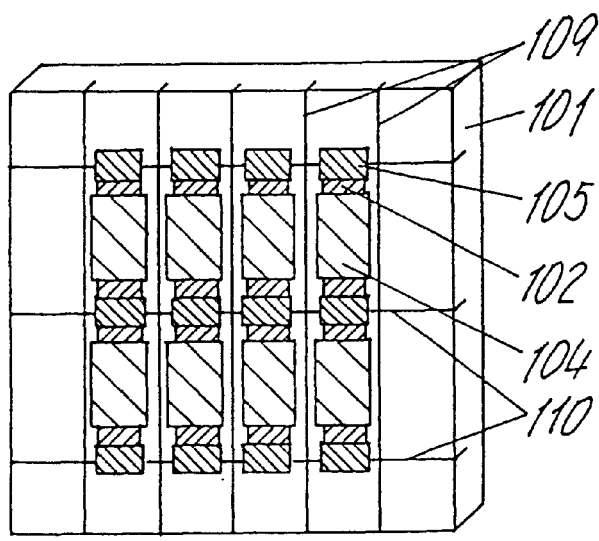
Figure 19:
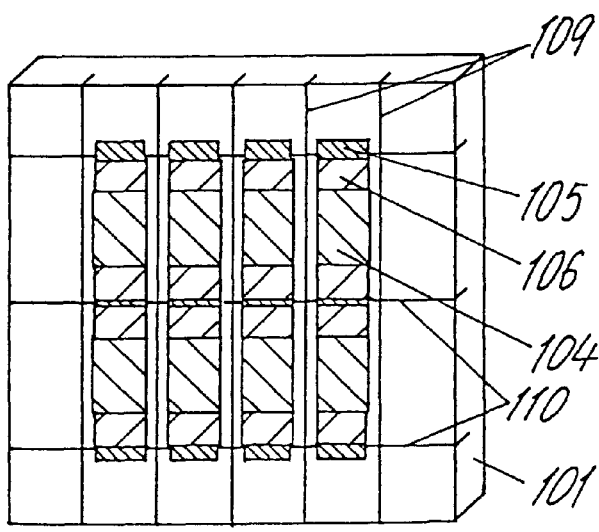
Figure 20:
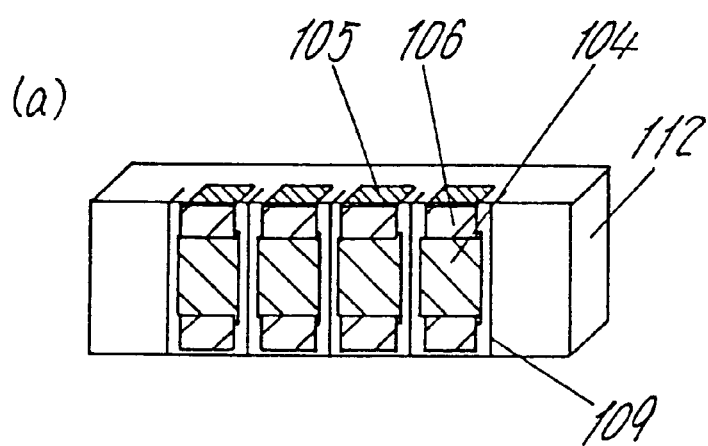
FIG. 20(a) and FIG. 20(b) represent still another series of procedural views depicting the process of manufacturing the same resistor.
Figure 20:
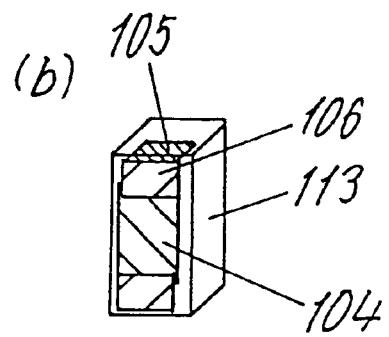

FIG. 18 through FIG. 20 represent a series of procedural views showing a manufacturing method of the resistor of the fifth exemplary embodiment of this invention.

First of all, electrode paste containing silver-base conductive powder and glass is printed to form first upper surface electrode layers 102, as shown in FIG. 18(a), in a manner not to cross over slitting grooves 110 made in a horizontal direction through a sheet-formed substrate 101, which has a superior heat-resisting property and an insulating property as it contains 96% alumina, and a surface of which is provided with a plurality of slitting grooves 109 and 110 in a vertical direction as well as in a horizontal direction in order to separate it into rectangular strips and then into individual pieces in the subsequent steps.

Next, resistive paste having a principal component of ruthenium oxide is printed to form resistance layers 103 in a manner that they connect electrically with the first upper surface electrode layers 102, as shown in FIG. 18(b). The resistance layers 103 are then calcined at a temperature of approximately 850° C. in order to make them become stable films.

Next, trimming is made to form trimmed slits 111 with a YAG laser, as shown in FIG. 18(c) in order to correct resistance values of the resistance layers 103 to a predetermined value. The trimming is made with trimming probes for measuring a resistance value set on the first upper surface electrode layers 102 during this process.

Another paste having a principal component of glass is printed to form protective layers 104, as shown in FIG. 19(a), in order to protect the resistance layers 103, of which resistance values have been corrected. For this process, a printing pattern may be made in such a shape that the protective layers 104 cross over the slitting grooves 109 of vertical direction to connectively cover a plurality of the horizontally aligned resistance layers 103. The protective layers 104 are then calcined at a temperature of approximately 600° C. in order to make them become stable films.

Resist material composed of resin is coated over an entire upper surface of the substrate 101, and openings in a film-forming pattern of the desired second upper surface electrode layers 105 are prepared in the resist material by photo-lithographic method, as shown in FIG. 19(b). Furthermore, a gold is deposited in a form of film on the entire upper surface of the substrate by sputtering method, and the resist material is then removed except for portions of the film-forming pattern for the desired second upper surface electrode layers 105. These steps complete the second upper surface electrode layers 105. During the above process, the second upper surface electrode layers 105 get into the slitting grooves 110 of horizontal direction, and thereby the second upper surface electrode layers 105 can be formed deeply down to the deep in the slitting grooves.

Generally, the slitting grooves 109 and 110 are so formed that their depth with respect to a thickness of the substrate 101 becomes equal to or less than a half of the thickness of the substrate 101, so as to avoid it from being cracked during handling in the manufacturing process.

Next, electrode paste containing silver-base conductive powder and glass is printed to form third upper surface electrode layers 106 in a manner to overlap with portions of upper surfaces of the first upper surface electrode layers 102 and the second upper surface electrode layers 105, as shown in FIG. 19(c). The third upper surface electrode layers 106 are then calcined at a temperature of approximately 850° C. in order to make them become stable films.

Then, the substrate 101 in a sheet-form, on which the first upper surface electrode layers 102, the second upper surface electrode layers 105, the third upper surface electrode layers 106, the resistance layers 103, the trimmed slits 111 and the protective layers 104 have been formed, is separated into rectangular substrate strips 112 by splitting it along the slitting grooves 110 of horizontal direction in the substrate 101, as shown in FIG. 20(a). When this is done, the previously formed second upper surface electrode layers 105 lie in their respective positions on the side surfaces along a longitudinal direction of the rectangular substrate strips 112 down to the depth of the slitting grooves 110 of horizontal direction.

As a preparatory process for plating exposed surfaces of the first upper surface electrode layers 102, the second upper surface electrode layers 105 and the third upper surface electrode layers 106, the rectangular substrate strips 112 are finally separated into individual substrate pieces 113 by splitting them along the slitting grooves 109 of vertical direction, as shown in FIG. 20(b). A resistor is now completed when a nickel-plated layer, as an intermediate layer (not shown in the figure), and a solder-plated layer, as an outer layer (not shown in the figure), are formed by means of electroplating on all exposed surfaces of the first upper surface electrode layers 102, the second upper surface electrode layers 105 and the third upper surface electrode layers 106 in order to prevent electrode-erosion during soldering and to assure reliability of the soldering.

Distinctive effects of the resistor of the fifth exemplary embodiment of this invention constructed and manufactured as above, when it is soldered on a mount board, are same as in the case of the foregoing third exemplary embodiment, and therefore they are not described.

In addition, other characteristics can be improved in this fifth exemplary embodiment of the invention, if the first upper surface electrode layers 102, the resistance layer 103, the protective layer 104, the second upper surface electrode layers 105, and the third upper surface electrode layers 106 are composed of combinations shown in Table 5.

TABLE 5

| Combination | Second upper surface electrode layers 105 | First upper surface electrode layers 102 | Third upper surface electrode layers 106 | Resistance layer 103 Protective layer 104 | Characteristics to be improved |
| --- | --- | --- | --- | --- | --- |
| 21 | Sputtered gold-base material | Silver-base conductive powder and glass (calcined at 850° C.) | Silver-base conductive powder and resin (hardened at 200° C.) | Ruthenium oxide-base (calcined at 850° C.) Glass-base (calcined at 600° C.) | Same characteristic as combination 1 in Table 1. |
| 22 | Sputtered gold-base material | Silver-base conductive powder and glass (calcined at 850° C.) | Nickel-base conductive powder and resin (hardened at 200° C.) | Ruthenium oxide-base (calcined at 850° C.) Glass-base (calcined at 600° C.) | Same characteristic as combination 2 in Table 1. |
| 23 | Sputtered gold-base material | Silver-base conductive powder and glass (calcined at 850° C.) | Silver-base conductive powder and resin (hardened at 200° C.) | Ruthenium oxide-base (calcined at 850° C.) Resin-base (hardened at 200° C.) | Same characteristic as combination 3 in Table 1. |
| 24 | Sputtered gold-base material | Silver-base conductive powder and glass (calcined at 850° C.) | Nickel-base conductive powder and resin (hardened at 200° C.) | Ruthenium oxide-base (calcined at 850° C.) Resin-base (hardened at 200° C.) | Same characteristic as combination 4 in Table 1. |
| 25 | Sputtered nickel-base material | Silver-base conductive powder and glass (calcined at 850° C.) | Silver-base conductive powder and resin (hardened at 200° C.) | Ruthenium oxide-base (calcined at 850° C.) Resin-base (hardened at 200° C.) | Same characteristic as combination 23, with less manufacturing cost due to use of base metal for second upper surface electrode layers 105. |
| 26 | Sputtered nickel-base material | Silver-base conductive powder and glass (calcined at 850° C.) | Nickel-base conductive powder and resin (hardened at 200° C.) | Ruthenium oxide-base (calcined at 850° C.) Resin-base (hardened at 200° C.) | Same characteristic as combination 25, with less manufacturing cost due to use of base metal for third upper surface electrode layers 106. |

TABLE 5-continued

| Combination | Second upper surface electrode layers 105 | First upper surface electrode layers 102 | Third upper surface electrode layers 106 | Resistance layer 103 Protective layer 104 | Characteristics to be improved |
|---|---|---|---|---|---|
| 27 | Sputtered gold-base material | Gold-base conductive powder and glass (calcined at 850° C.) | Silver-base conductive powder and glass (calcined at at 600° C.) | Ruthenium oxide-base (calcined at 850° C.) Glass-base (calcined at 600° C.) | Same characteristic as combination 5 in Table 1. |
| 28 | Sputtered gold-base material | Gold-base conductive powder and glass (calcined at 850° C.) | Silver-base conductive powder and resin (hardened at 200° C.) | Ruthenium oxide-base (calcined at 850° C.) Glass-base (calcined at 600° C.) | Same characteristic as combination 6 in Table 1. |
| 29 | Sputtered gold-base material | Gold-base conductive powder and glass (calcined at 850° C.) | Nickel-base conductive powder and resin (hardened at 200° C.) | Ruthenium oxide-base (calcined at 850° C.) Glass-base (calcined at 600° C.) | Same characteristic as combination 7 in Table 1. |
| 30 | Sputtered gold-base material | Gold-base conductive powder and glass (calcined at 850° C.) | Silver-base conductive powder and resin (hardened at 200° C.) | Ruthenium oxide-base (calcined at 200° C.) Resin-base (hardened at 200° C.) | Save characteristic as combination 8 in Table 1. |
| 31 | Sputtered gold-base material | Gold-base conductive powder and glass (calcined at 850° C.) | Nickel-base conductive powder and resin (hardened at 200° C.) | Ruthenium oxide-base (calcined at 200° C.) Resin-base (hardened at 200° C.) | Same characteristic as combination 9 in Table 1. |
| 32 | Sputtered nickel-base material | Gold-base conductive powder and glass (calcined at 850° C.) | Silver-base conductive powder and resin (hardened at 200° C.) | Ruthenium oxide-base (calcined at 850° C.) Resin-base (hardened at 200° C.) | Same characteristics as combination 25 as well as combination 5 in Table 1. |
| 33 | Sputtered nickel-base material | Silver-base conductive powder and glass (calcined at 850° C.) | Nickel-base conductive powder and resin (hardened at 200° C.) | Ruthenium oxide-base (calcined at 850° C.) Resin-base (hardened at 200° C.) | Same characteristic as combination 26 as well as combination 5 in Table 1. |

In addition, it is easily conceivable that the mount area can be further reduced if electrodes are not formed on the side surfaces in the fifth exemplary embodiment of this invention.

Sixth Exemplary Embodiment

A resistor of a sixth exemplary embodiment of the present invention and a method of manufacturing the same will be described hereinafter by referring to accompanying figures.

Figure 21:
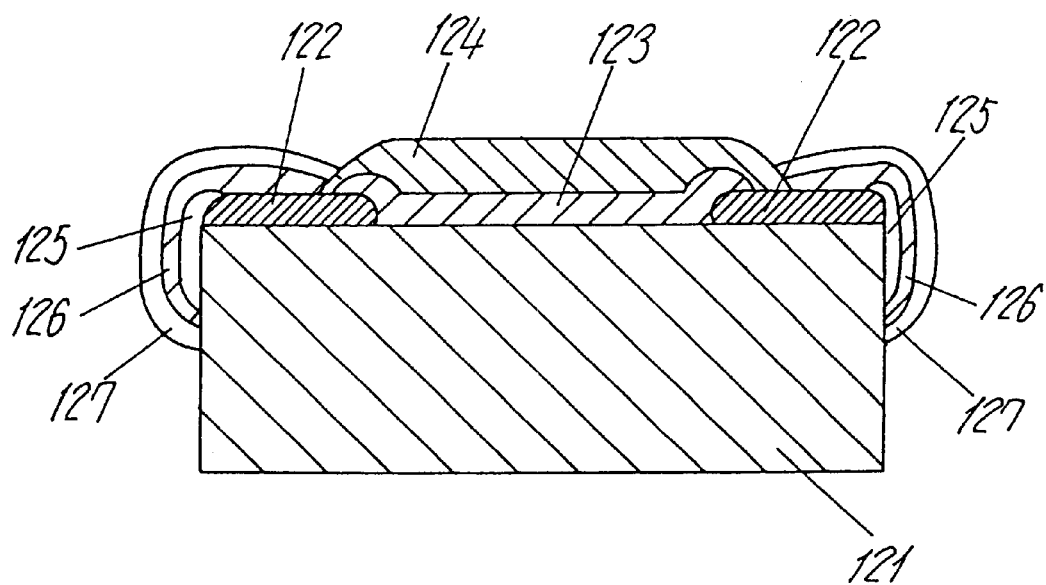
FIG. 21 is a sectional view depicting a resistor of a sixth exemplary embodiment of the present invention.

FIG. 21 is a sectional view of a resistor of the sixth exemplary embodiment of this invention.

In FIG. 21, a reference numeral 121 represents a substrate containing 96% of alumina. A reference numeral 122 represents a pair of upper surface electrode layers composed of thin films of gold-base material provided on sides portions of a main surface of the substrate 121. A reference numeral 123 represents a resistance layer composed of a thin film of nickel-chrome base or chrome-silicon base compound provided on an upper surface of the substrate 121. A reference numeral 124 is a protective layer composed of epoxy-group resin, or the like material provided on an upper surface of the resistance layer 123. A reference numeral 125 represents side surface electrode layers composed of thin films of nickel-base material provided on side surfaces of the substrate 121. Reference numerals 126 and 127 respectively represent nickel-plated layers and solder-plated layers provided, as occasion demands, for a purpose of assuring reliability, etc. during soldering. Ridges of these nickel-plated layers 126 and solder-plated layers 127 are rounded. Each surface area of the solder-plated layers 127 occupying the side surface of the substrate 121 is not more than a half of an area of the side surface of the substrate 121.

The resistor of the sixth exemplary embodiment of this invention constructed as above is manufactured in a manner, which will be described hereinafter by referring to the figures.

Figure 22:
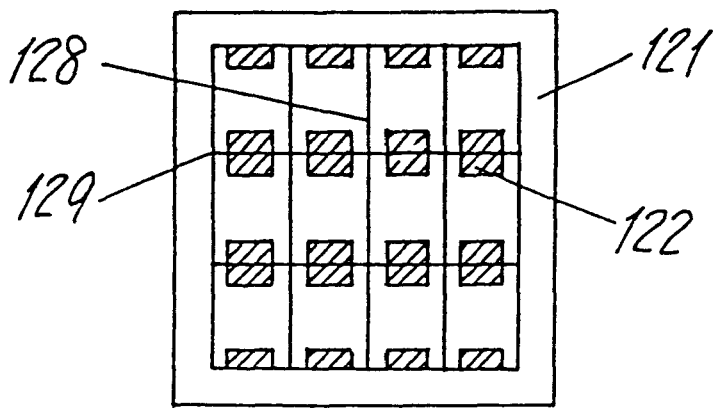
FIG. 22(a) through FIG. 22(c) represent a series of procedural views depicting a process of manufacturing the same resistor.
Figure 22:
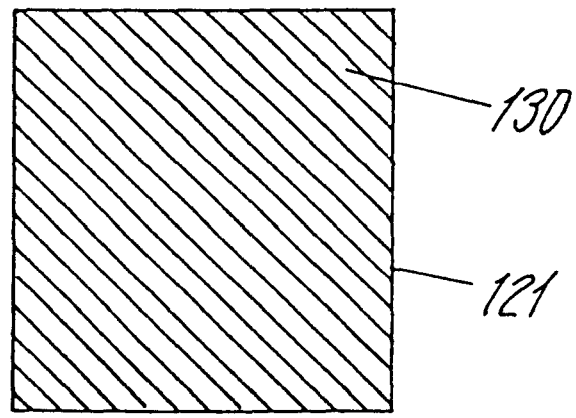
Figure 22:
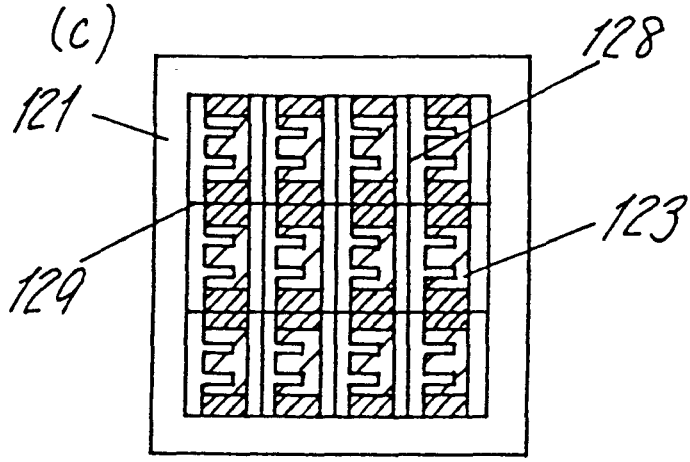
Figure 23:
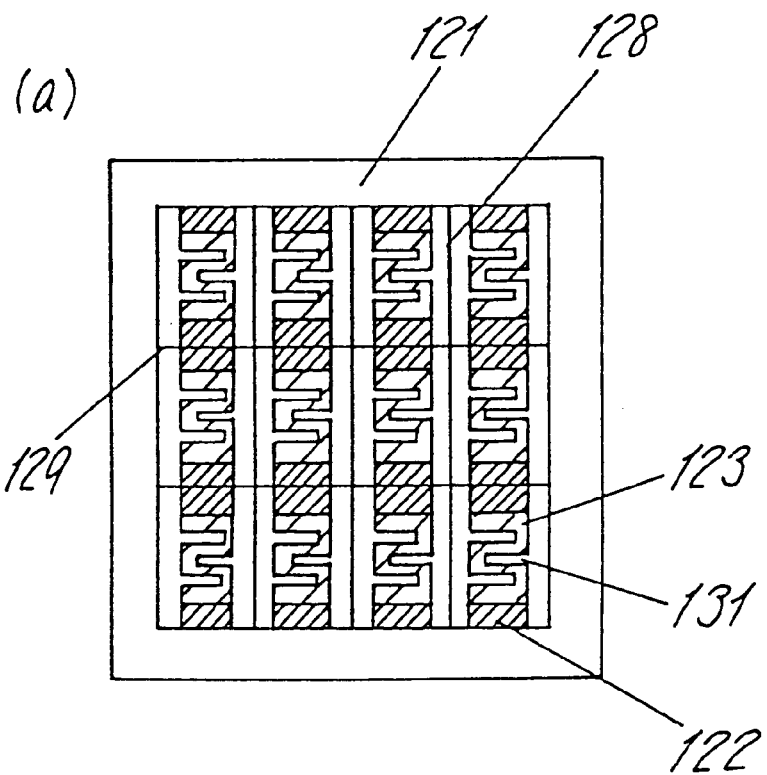
FIG. 23(a) and FIG. 23(b) represent another series of procedural views depicting the process of manufacturing the same resistor.
Figure 23:
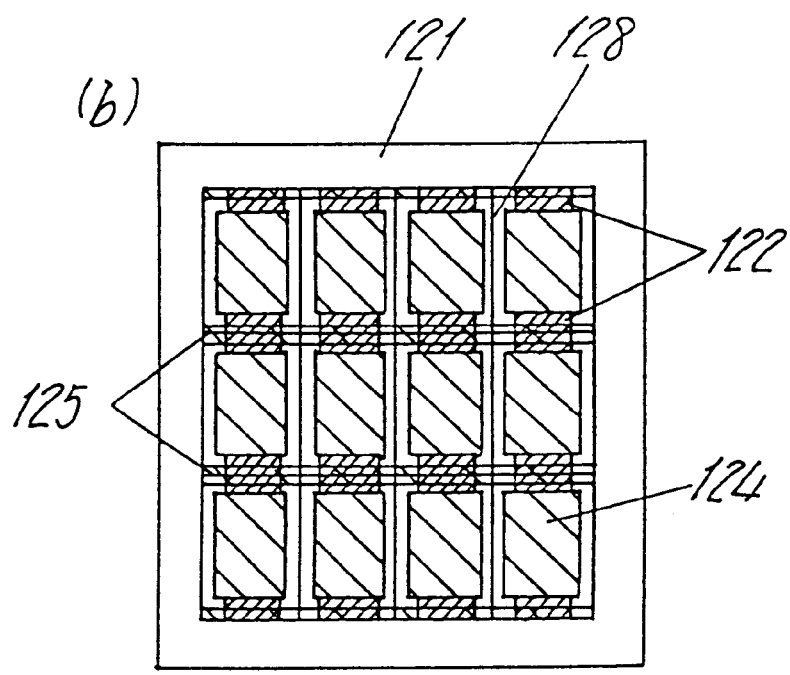
Figure 24:
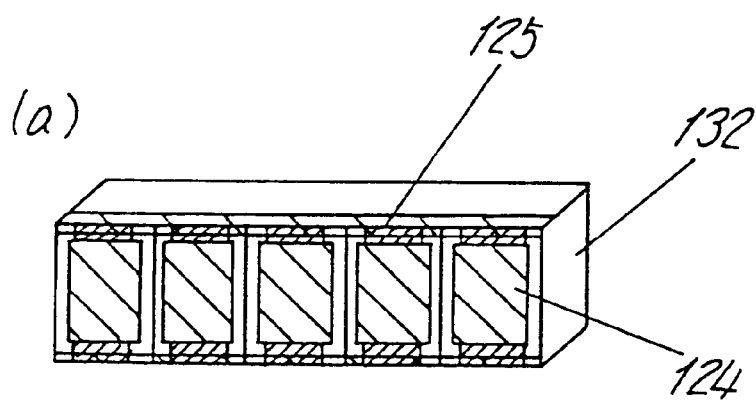
FIG. 24(a) and FIG. 24(b) represent still another series of procedural views depicting the process of manufacturing the same resistor.
Figure 24:
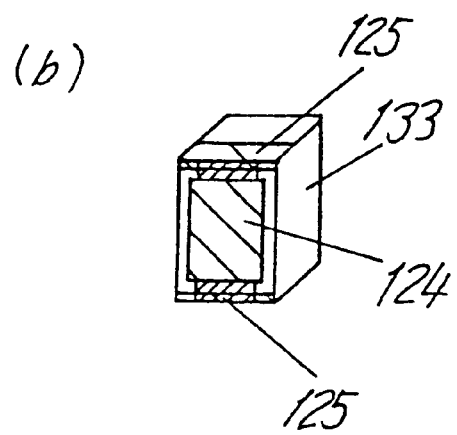

FIG. 22 through FIG. 24 represent a series of procedural views showing a manufacturing method of the resistor of the sixth exemplary embodiment of this invention.

First of all, electrode paste consisting of metallic-organic substance, etc. having a principal component of gold and the like material is screen-printed in a manner not to cross over slitting grooves 129 made in a horizontal direction through an upper surface of sheet-formed substrate 121, which has a superior heat-resisting property and an insulating property as it contains 96% alumina, and a surface of which is provided with a plurality of slitting grooves 128 and 129 in a vertical direction as well as in a horizontal direction in order to separate it into rectangular strips and then into individual pieces in the subsequent steps. After the electrode paste consisting of metallic-organic substance and the like is dried, it is calcined under a condition of approximately 850° C. for about 45 minutes in a belt-conveyed continuous kiln in order to disperse only organic components and to bake only metal components of the electrode paste onto the substrate 121, to form upper surface electrode layers 122 in thin film, as shown in FIG. 22(a).

Next, as shown in FIG. 22(b), nickel-chrome, chrome-silicon, or the like compound is deposited by sputtering method on an entire upper surface of the sheet-formed substrate 121, on which the upper surface electrode layers 122 (not shown in this figure) are formed, to form an integral resistance layer 130.

The integral resistance layer 130 is then processed by photo-lithographic method, the same method as normally used for LSI's, etc. to form resistance layers 123 of a desired pattern, as shown in FIG. 22(c). The resistance layers 123 are thermally treated at a temperature of approximately 300 to 400° C. in order to make them become stable films.

Next, trimming is made to form trimmed slits 131 with a YAG laser, as shown in FIG. 23(a) in order to correct resistance values of the resistance layers 123 to a predetermined value. Trimming probes for measuring a resistance value are set on the upper surface electrode layers 122 in this process. The trimming is made by serpentine cutting method (a plurality of straight cuts), which is capable of adjusting the resistance freely from a low value to a high value.

Epoxy-base resin paste is screen-printed to form a printing pattern of individual protective layers corresponding to their respective resistance layers 123, as shown in FIG. 23(b), in order to protect the resistance layers 123, of which resistance values have been corrected. Then, the epoxy-base resin paste is thermally set to form the protective layers 124 under a condition of approximately 200° C. for about 30 minutes in a belt-conveyed continuous hardening kiln in order to ensure a firm adhesion to the substrate 121. For this process, the printing pattern of the protective layers may be made in such a shape that the protective layers cross over the slitting grooves 128 of vertical direction, and connectively cover a plurality of the horizontally aligned resistance layers 123.

Subsequently, as shown in the same figure, side surface electrode layers 125 comprising a thin film of nickel-chrome base compound are formed by sputtering in a manner to cross over the slitting grooves 129 of horizontal direction, and to electrically connect with the upper surface electrode layers 122. In this process, a resist layer is formed in advance in an area other than portions where the side surface electrode layers are formed. After a nickel-chrome layer is formed by sputtering over an entire surface of the substrate, the nickel-chrome layer of the area other than the side surface electrode layers is removed at the same time the resist layer is removed by lift-off method.

Then, the substrate 121 in a sheet-form is subjected to a primary separation into rectangular substrate strips 132, as shown in FIG. 24(a), by splitting it along the slitting grooves 129 of horizontal direction in the substrate 121. When this is done, the side surface electrode layers 125 lie in their respective positions on the side surfaces along a longitudinal direction of the rectangular substrate strips 132 down to the depth of the slitting grooves 129 of horizontal direction.

Finally, as a preparatory process for plating exposed surfaces of the upper surface electrode layers 122 and the side surface electrode layers 125, a secondary separation is made to separate the rectangular substrate strips 132 into individual substrate pieces 133, as shown in FIG. 24(b). A resistor is now completed when a nickel-plated layer, as an intermediate layer (not shown in the figure), and a solder-plated layer, as an outer layer (not shown in the figure), are formed by means of electroplating on exposed surfaces of the upper surface electrode layers 122 and the side surface electrode layers 125, if necessary in order to prevent electrode-erosion during soldering and to assure reliability of the soldering.

Figure 25:
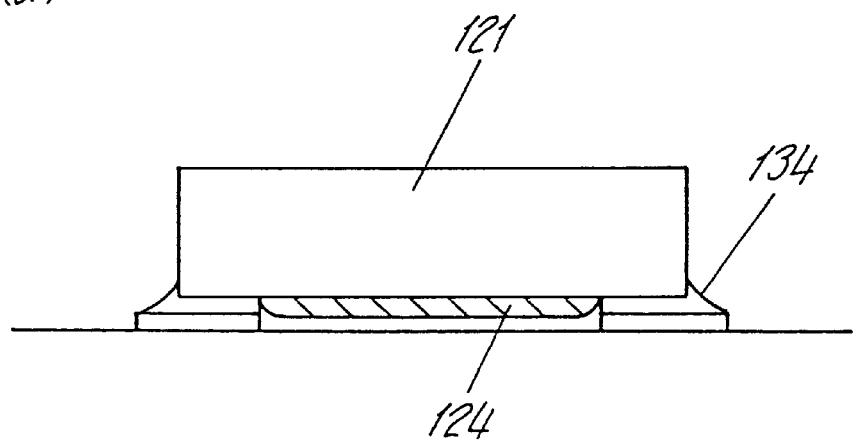
FIG. 25(a) is a sectional view depicting the same resistor in a mounted position.
FIG. 25(b) is a plan view depicting the same resistor in the mounted position.
Figure 25:
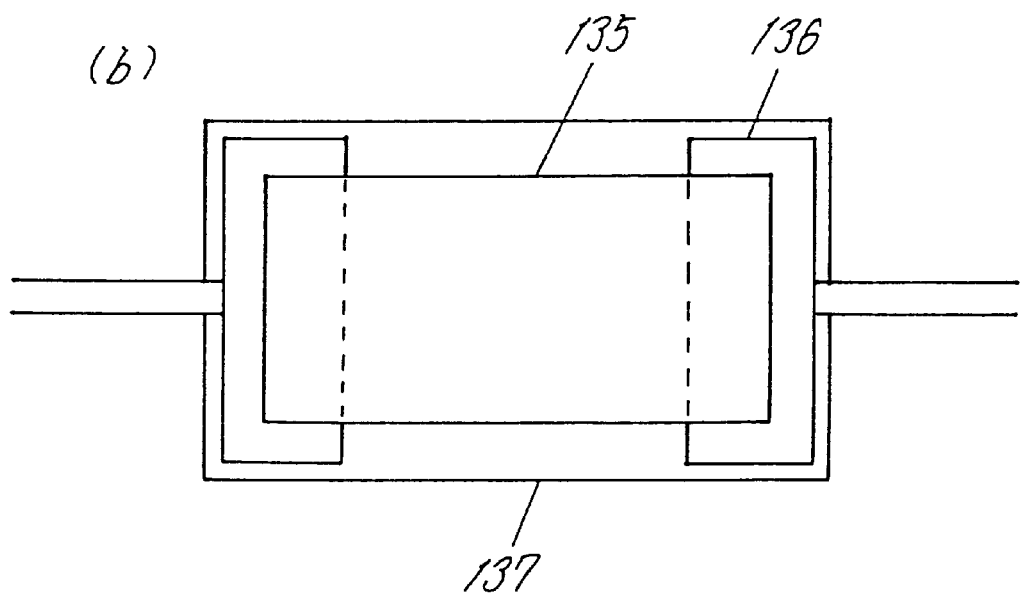

The resistor of the sixth exemplary embodiment of this invention constructed and manufactured as above was soldered on a mount board. The resistor was mounted with the surface having the protective layer down, and soldered with both the upper surface electrode layers (not shown in the figure) and the resistance layer portion on side surface of the substrate, as shown in a sectional view of FIG. 25(a) depicting the mounted position. However, since areas, whereon the side surface electrodes are formed, were so small, fillets 134 were barely formed. Accordingly, an actual mount area 137 came to the sum of a component area 135 and areas 136 required for soldering the side surfaces, as shown in a plan view of FIG. 25(b) depicting the mounted position. The invention could attain a reduction of approximately 20% in the mount area as compared to a product of the prior art, in the case of a square-tip resistor in a size of 0.6×0.3 mm.

Therefore, the structure according to the present invention requires a small area on a mount board to form fillets of soldering, because of the small areas of the side surface electrodes of the resistor, and thereby it can reduce the mount areas.

Moreover, the side surface electrode layers 125 formed by sputtering can provide such advantages as strong adhesion to the substrate, realizing a linearity in boundary lines between the substrate 121 and the solder-plated layers 127 on the side surfaces of the substrate 121, and high quality of the external appearance.

In addition, it is easily conceivable that the mount area can be further reduced if the side surface electrode layers 125 are not formed in the sixth exemplary embodiment of this invention. However, if the side surface electrode layers 125 are not formed, the resistor forms no fillet at all, thereby giving rise to a problem that makes an automated inspection by image recognition inexecutable, in consideration of the fact that inspection of soldering is usually carried out by means of image recognition after mounting components in the current manufacturing process of electronic devices.

In the sixth exemplary embodiment of this invention, if solder-plated layers 127 and the protective layer 124 are formed to be on the same plane, or if the solder-plated layers 127 are formed to be higher than the protective layer 124, the resistor is not likely to allow a gap between the solder-plated layers 127 and a land pattern, when it is mounted, thereby further improving quality of mounting.

Furthermore, similar effect can be attained with other combinations of the upper surface electrode layers 122, the resistance layer 123 and the protective layer 124, beside the above combination in the structure of the sixth exemplary embodiment of this invention. These combinations and their respective characteristics are outlined in Table 6.

layers 142. A reference numeral 144 represents a protective layer composed of epoxy-group resin, or the like material provided on an upper surface of the resistance layer 143. A reference numeral 145 represents a pair of second upper surface electrode layers composed of silver or nickel-base conductive powder containing resin. A reference numeral

TABLE 6

| Combination | Upper surface electrode layers 122 | Resistance layer 123 | Protective layer 124 | Characteristics |
|---|---|---|---|---|
| 1 | Silver or gold-base conductive powder and glass (calcined at 850° C.) | Ruthenium oxide-base material (calcined at 850° C.) | Resin-base material (hardened at 200° C.) | High accuracy in resistance value due to low forming temperature of protective layer. |
| 2 | Silver or gold-base conductive powder and glass (calcined at 850° C.) | Ruthenium oxide-base material (calcined at 850° C.) | Glass-base material (calcined at 600° C.) | High resistance to humidity due to protective layer composed of glass. |
| 3 | Silver or gold-base conductive powder and glass (calcined at 850° C.) | Carbonic resin-base material (hardened at 200° C.) | Resin-base material (hardened at 200° C.) | Capable of saving energy due to low forming temperature of resistance layer, in addition to characteristic of combination 1. |
| 4 | Silver or gold-base conductive powder and glass (calcined at 850° C.) | Ni-Cr base or Cr-Si base sputtered film | Resin-base material (hardened at 200° C.) | Same characteristic as combination 1. |
| 5. | Gold-base organic metal compound (calcined at 850° C.) | Ruthenium oxide-base material (calcined at 850° C.) | Resin-base material (hardened at 200° C.) | Low manufacturing cost due to small amount of gold used, in addition to characteristic of combination 1. |
| 6 | Gold-base organic metal compound (calcined at 850° C.) | Ruthenium oxide-base material (calcined at 850° C.) | Glass-base material (calcined at 600° C.) | Low manufacturing cost due to small amount of gold used, in addition to characteristic of combination 2 |
| 7 | Gold-base organic metal compound (calcined at 850° C.) | Carbonic resin-base material (hardened at 200° C.) | Resin-base material (hardened at 200° C.) | Low manufacturing cost due to small amount of gold used, in addition to characteristic of combination 3 |
| 8 | Gold-base organic metal compound (calcined at 850° C.) | Ni-Cr base or Cr-Si base sputtered film | Resin-base material (hardened at 200° C.) | (Combination of the first exemplary embodiment) |
| 9 | Sputtered nickel-base, copper-base, or gold base material | Ni-Cr base or Cr-Si base sputtered film | Resin-base material (hardened at 200° C.) | Inexpensive construction, if base metal of nickel or copper is used, in addition to characteristic of combination 7. |

Seventh Exemplary Embodiment

A resistor of a seventh exemplary embodiment of the present invention and a method of manufacturing the same will be described hereinafter by referring to accompanying figures.

Figure 26:
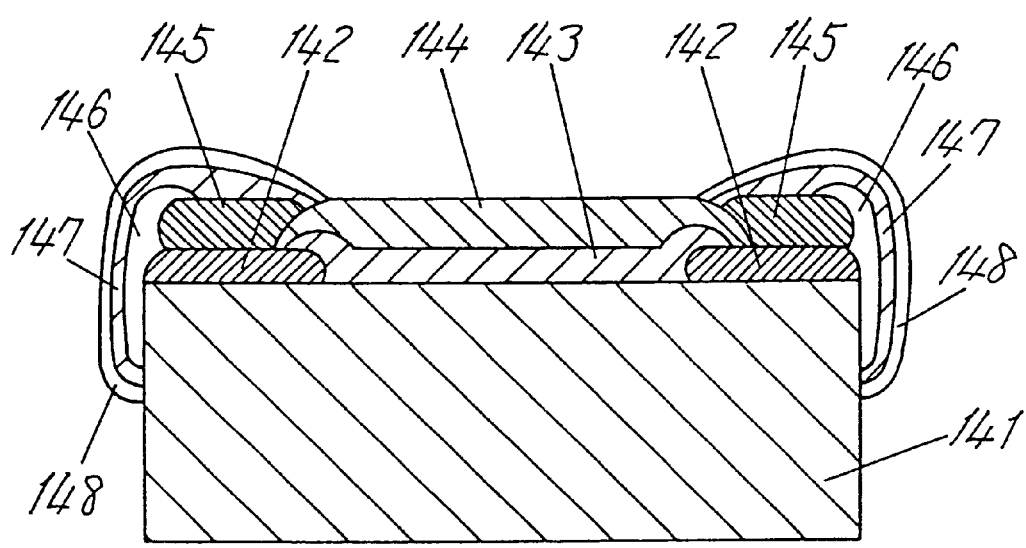
FIG. 26 is a sectional view depicting a resistor of a seventh exemplary embodiment of the present invention.

FIG. 26 is a sectional view of a resistor of the seventh exemplary embodiment of this invention.

In FIG. 26, a reference numeral 141 represents a substrate containing 96% of alumina. A reference numeral 142 represents a pair of first upper surface electrode layers composed of thin films of gold-base material provided on side portions of an upper surface of the substrate 141. A reference numeral 143 represents a resistance layer composed of a thin film of nickel-chrome base or chrome-silicon base compound provided between the first upper surface electrode 146 represents side surface electrode layers provided on side surfaces of the substrate 141 in a manner to connect with the first upper surface electrode layers 142 or the second upper surface electrode layers 145. Reference numerals 147 and 148 respectively represent nickel-plated layers and solder-plated layers provided, as occasion demands, for a purpose of assuring reliability, etc. during soldering. Ridges of these nickel-plated layers 147 and solder-plated layers 148 are rounded. Each surface area of the solder-plated layers 148 on the side surfaces of the substrate 121 is not more than a half of an area of the side surface of the substrate 141.

The resistor of the seventh exemplary embodiment of this invention constructed as above is manufactured in a manner, which will be described hereinafter by referring to the figures.

Figure 27:
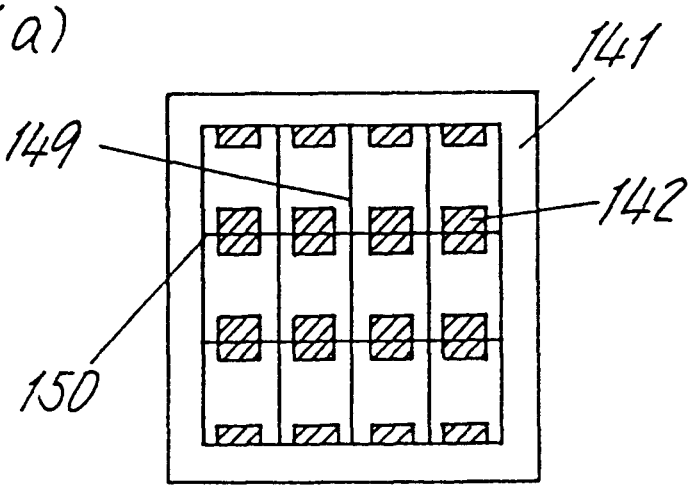
FIG. 27(a) through FIG. 27(c) represent a series of procedural views depicting a process of manufacturing the same resistor.
Figure 27:
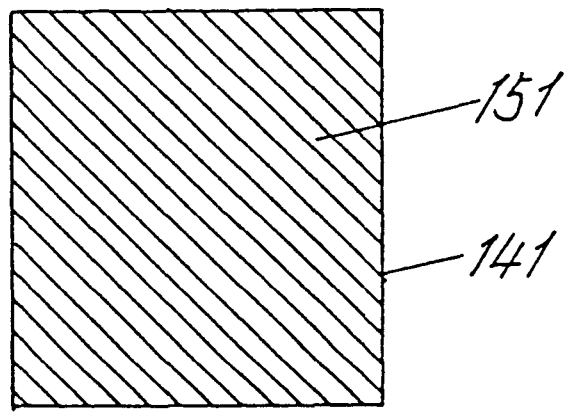
Figure 27:
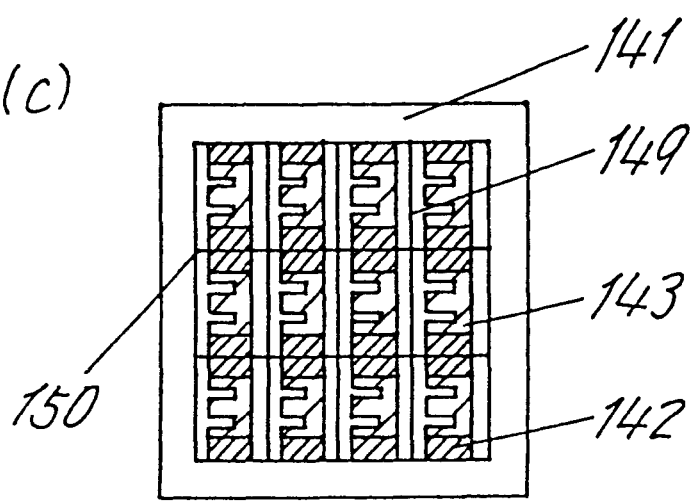
Figure 28:
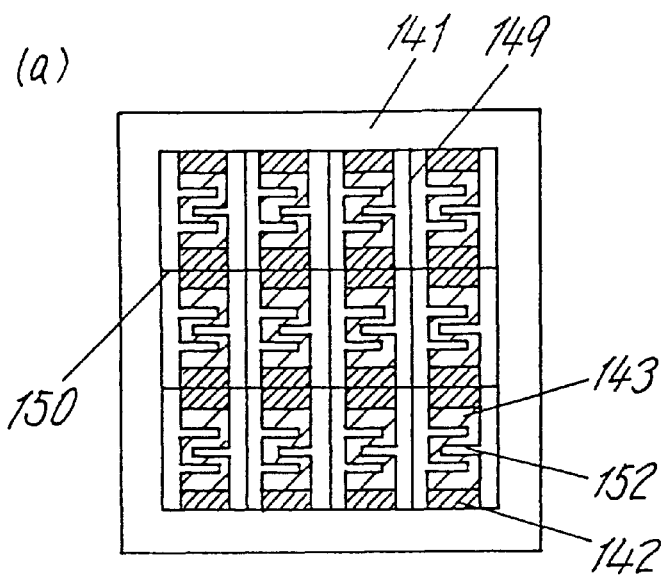
FIG. 28(a) through FIG. 28(c) represent another series of procedural views depicting the process of manufacturing the same resistor.
Figure 28:
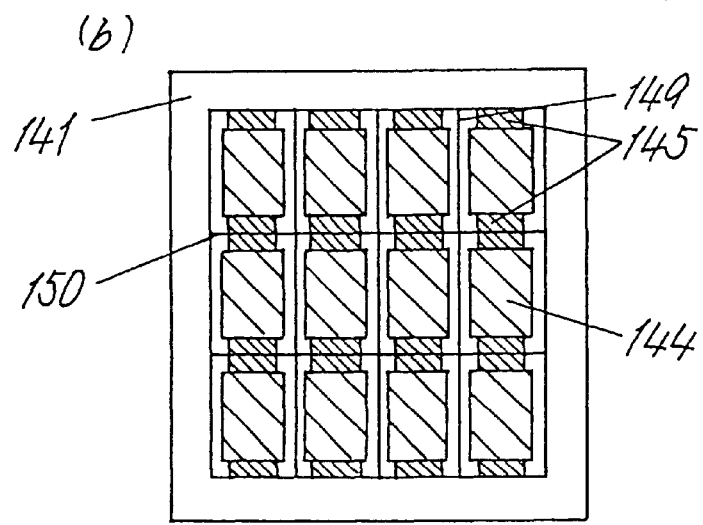
Figure 28:
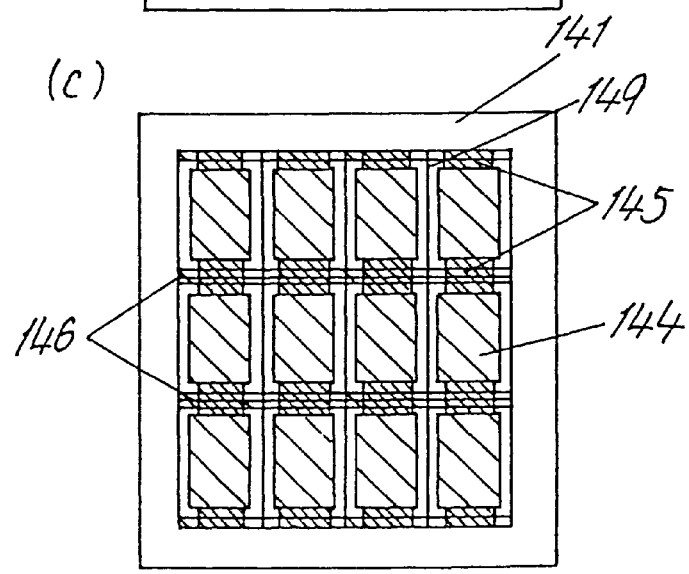
Figure 29:
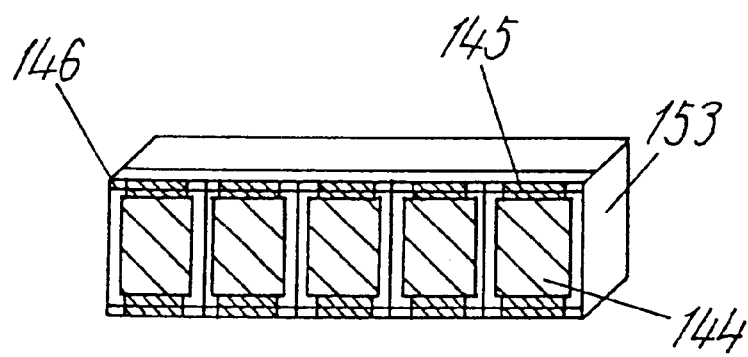
FIG. 29(a) and FIG. 29(b) represent still another series of procedural views depicting the process of manufacturing the same resistor.
Figure 29:
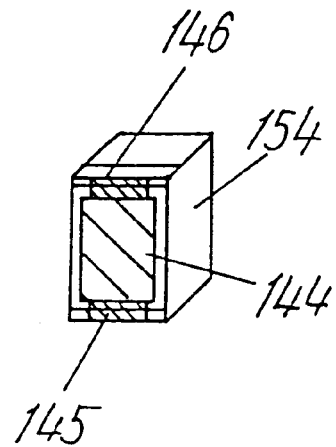

FIG. 27 through FIG. 29 represent a series of procedural views showing a manufacturing method of the resistor of the seventh exemplary embodiment of this invention.

First of all, electrode paste consisting of metallic-organic substance, etc. having a principal component of gold and the like material is screen-printed in a manner not to cross over slitting grooves 150 made in a horizontal direction through an upper surface of sheet-formed substrate 141, which has a superior heat-resisting property and an insulating property as it contains 96% alumina, and a surface of which is provided with a plurality of slitting grooves 149 and 150 in a vertical direction as well as in a horizontal direction in order to separate it into rectangular strips and then into individual pieces in the subsequent steps. After the electrode paste consisting of metallic-organic substance, etc. is dried, it is calcined under a condition of approximately 850° C. for about 45 minutes in a belt-conveyed continuous kiln in order to disperse only organic components and to bake only metal components of the electrode paste onto the substrate 141, to form upper surface electrode layers 142 in thin film, as shown in FIG. 27(a).

Next, as shown in FIG. 27(b), nickel-chrome, chrome-silicon, or the like compound is deposited by sputtering method on an entire upper surface of the sheet-formed substrate 141, on which the upper surface electrode layers 142 (not shown in this figure) are formed, to form an integral resistance layer 151.

The integral resistance layer 151 is then processed by photo-lithographic method, the same method as normally used for LSI's, etc. to form resistance layers 143 of a desired pattern, as shown in FIG. 27(c). The resistance layers 143 are thermally treated at a temperature of approximately 300 to 400° C. in order to make them become stable films.

Next, trimming is made to form trimmed slits 152 with a YAG laser, as shown in FIG. 28(a) in order to correct resistance values of the resistance layers 143 to a predetermined value. Trimming probes for measuring a resistance value are set on the upper surface electrode layers 142 in this process. The trimming is made by serpentine cutting method (a plurality of straight cuts), which is capable of adjusting the resistance freely from a low value to a high value.

Epoxy-base resin paste is screen-printed to form a printing pattern of individual protective layers corresponding to their respective resistance layers 143, as shown in FIG. 28(b), in order to protect the resistance layers 143, of which resistance values have been corrected. Then, the epoxy-base resin paste is thermally set to form the protective layers 144 under a condition of approximately 200° C. for about 30 minutes in a belt-conveyed continuous hardening kiln in order to ensure a firm adhesion to the substrate 141. For this process, the printing pattern of the protective layers may be made in such a shape that the protective layers cross over the slitting grooves 149 of vertical direction, and connectively cover a plurality of the horizontally aligned resistance layers 143.

Next, second upper surface electrode layers 145 are formed as shown in the same figure by screen-printing conductive paste composed of silver-base or nickel-base conductive powder containing resin in a manner to cover the upper surface electrode layers 142, followed by thermally setting them in a belt-conveyed continuous hardening kiln under a condition of approximately 200° C. for about 30 minutes in order to ensure a firm adhesion to the substrate 141.

Subsequently, as shown in FIG. 28(c), side surface electrode layers 146 comprising a thin film of nickel-chrome base compound are formed by sputtering in a manner to cross over the slitting grooves of horizontal direction (not shown in the figure), and to electrically connect with the upper surface electrode layers 142. In this process, a resist layer is formed in advance in an area other than portions where the side surface electrode layers are formed. After a nickel-chrome layer is formed by sputtering over an entire surface of the substrate, the nickel-chrome layer in the area other than the side surface electrode layers is removed at the same time the resist layer is removed by lift-off method.

Then, the substrate 141 in a sheet-form is subjected to a primary separation into rectangular substrate strips 153, as shown in FIG. 29(a), by splitting it along the slitting grooves 150 of horizontal direction in the substrate 141. When this is done, the side surface electrode layers 146 lie in their respective positions on the side surfaces along a longitudinal direction of the rectangular substrate strips 153 down to the depth of the slitting grooves 150 of horizontal direction.

Finally, as a preparatory process for plating exposed surfaces of the second upper surface electrode layers 145 and the side surface electrode layers 146, a secondary separation is made to separate the rectangular substrate strips 153 into individual substrate pieces 154, as shown in FIG. 29(b). A resistor is now completed when a nickel-plated layer, as an intermediate layer (not shown in the figure), and a solder-plated layer, as an outer layer (not shown in the figure), are formed by means of electroplating on exposed surfaces of the second upper surface electrode layers 145 and the side surface electrode layers 146, if necessary in order to prevent electrode-erosion during soldering and to assure reliability of the soldering.

The resistor of the seventh exemplary embodiment of this invention constructed and manufactured as above provides the same advantages as what has been described in the sixth exemplary embodiment, when it is soldered on a mount board, and therefore they will not be described.

In addition, similar effect can be attained with other combinations of the first upper surface electrode layers 142, the second upper surface electrode layers 145, the resistance layer 143 and the protective layer 144, beside the above combination in the structure of the seventh exemplary embodiment of this invention. These combinations and their respective characteristics are outlined in Table 7.

TABLE 7

| Combination | First upper surface electrode layers 142 | Second upper surface electrode layers 145 | Resistance layer 143 | Protective layer 144 | Characteristics |
|---|---|---|---|---|---|
| 1 | Silver-base or gold-base conductive powder and glass (calcined at 850° C.) | Silver-base or gold-base conductive powder and glass (calcined at 600° C.) | Ruthenium oxide-base material (calcined at 850° C.) | Glass-base material (calcined at 600° C.) | High resistance to humidity. |
| 2 | Silver-base or gold-base conductive powder and glass (calcined at 850° C.) | Silver-base or nickel-base material and resin (hardened at 200° C.) | Ruthenium oxide-base material (calcined at 850° C.) | Resin-base material (hardened at 200° C.) | Same characteristic as combination 1 of Table 1 |
| 3 | Silver-base or gold-base conductive powder and glass (calcined at 850° C.) | Silver-base or nickel-base material and resin (hardened at 200° C.) | Ni-Cr base or Cr-Si base sputtered film | Resin-base material (hardened at 200° C.) | Same as above. |
| 4 | Gold-base organic metal compound (calcined at 850° C.) | Silver-base or gold-base conductive powder and glass (calcined at 600° C.) | Ruthenium oxide-base material (calcined at 850° C.) | Glass-base material (calcined at 600° C.) | Same characteristic as combination 5 of Table 1. |
| 5 | Gold-base organic metal compound (calcined at 850° C.) | Silver-base or nickel-base material and resin (hardened at 200° C.) | Ni-Cr base or Cr-Si base sputtered film | Resin-base material (hardened at 200° C.) | (Combination of second exemplary embodiment) |
| 6 | Gold-base organic metal compound (calcined at 850° C.) | Silver-base or nickel-base material and resin (hardened at 200° C.) | Carbonic resin base material (hardened at 200° C.) | Resin-base material (hardened at 200° C.) | Same characteristic as combination 7 of Table 1. |
| 7 | Sputtered nickel-base, copper-base, or gold base material | Silver-base or nickel-base material and resin (hardened at 200° C.) | Ni-Cr base or Cr-Si base sputtered film | Resin-base material (hardened at 200° C.) | Same characteristic as combination 9 of Table 1. |
| 8 | Sputtered nickel-base, copper-base, or gold base material | Silver-base or nickel-base material and resin (hardened at 200° C.) | Carbonic resin base material (hardened at 200° C.) | Resin-base material (hardened at 200° C.) | Same characteristic as combination 9 of Table 1. |

Eighth Exemplary Embodiment

A resistor of an eighth exemplary embodiment of the present invention and a method of manufacturing the same will be described hereinafter by referring to accompanying figures.

Figure 30:
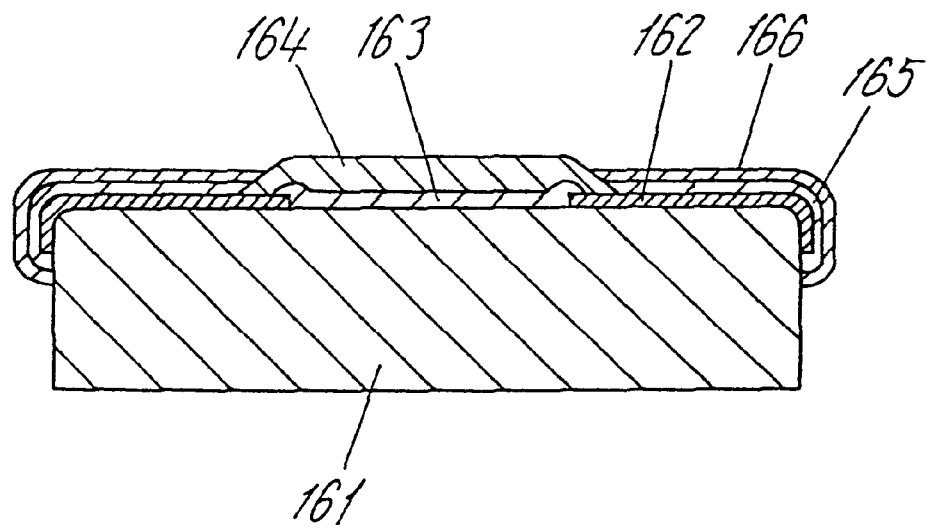
FIG. 30 is a sectional view depicting a resistor of an eighth exemplary embodiment of the present invention.

FIG. 30 is a sectional view of a resistor of the eighth exemplary embodiment of this invention.

In FIG. 30, a reference numeral 161 represents a substrate containing 96% of alumina. A reference numeral 162 represents upper surface electrode layers composed of silver-base conductive powder containing glass, and provided on side portions of a main surface and portions of side surfaces of the substrate 161. Ridges of these upper surface electrode layers 162 are rounded. In addition, a surface area of each of the upper surface electrode layers 162 on the side surfaces of the substrate 161 is not more than a half of an area of the side surface of the substrate 161. A reference numeral 163 represents a resistance layer having a chief component of ruthenium oxide, for electrically connecting with the upper surface electrode layers 163. A reference numeral 164 represents a protective layer having a chief component of glass, provided on an upper surface of the resistance layer 163. Reference numerals 165 and 166 respectively represent nickel-plated layers and solder-plated layers provided, as occasion demands, for a purpose of assuring reliability, etc. during soldering.

The resistor of the eighth exemplary embodiment of this invention constructed as above is manufactured in a manner, which will be described hereinafter by referring to the figures.

Figure 31:
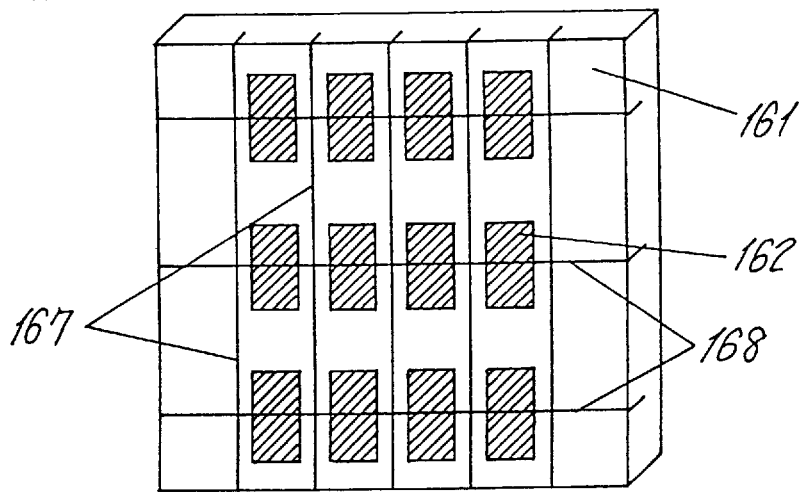
FIG. 31(a) through FIG. 31(c) represent a series of procedural views depicting a process of manufacturing the same resistor.
Figure 31:
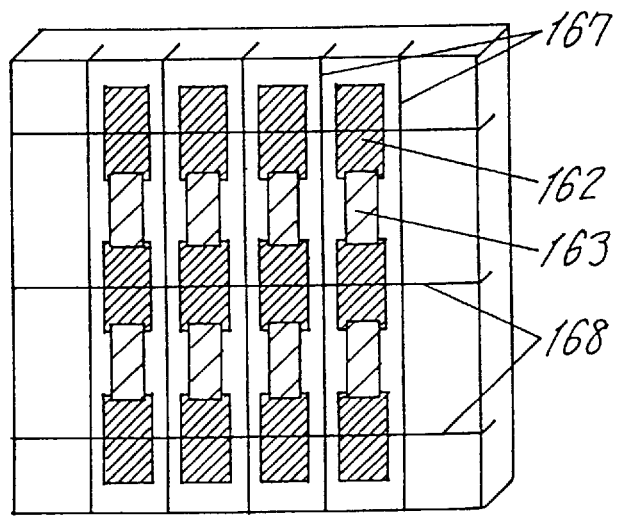
Figure 31:
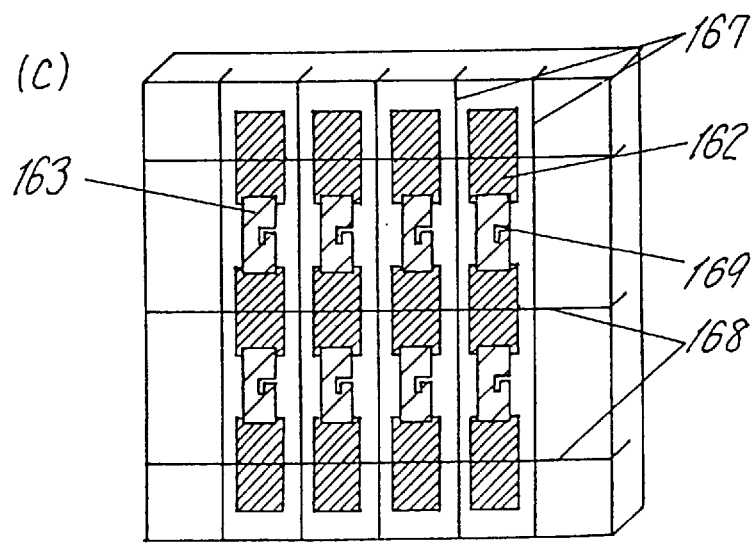
Figure 32:
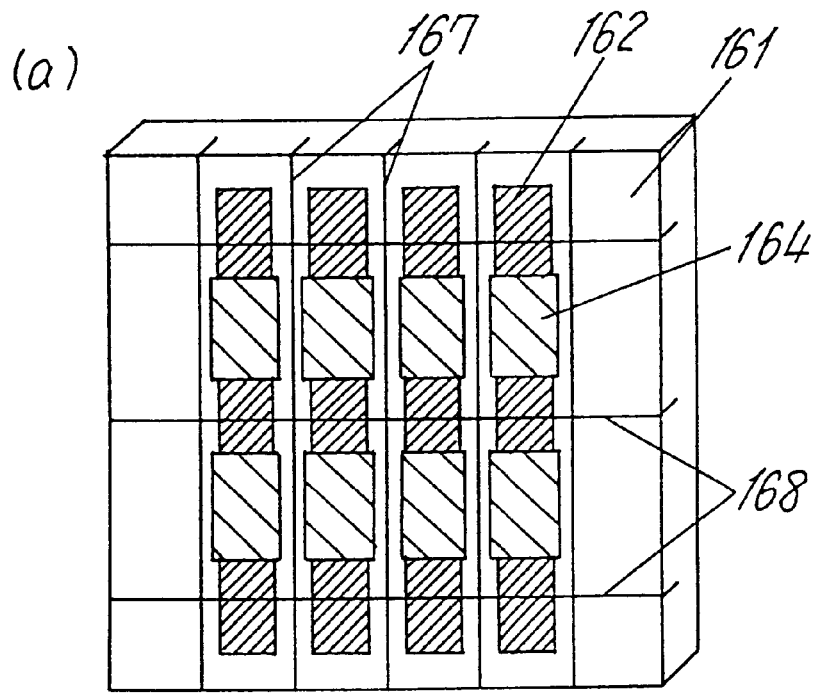
FIG. 32(a) through FIG. 32(c) represent another series of procedural views depicting the process of manufacturing the same resistor.
Figure 32:
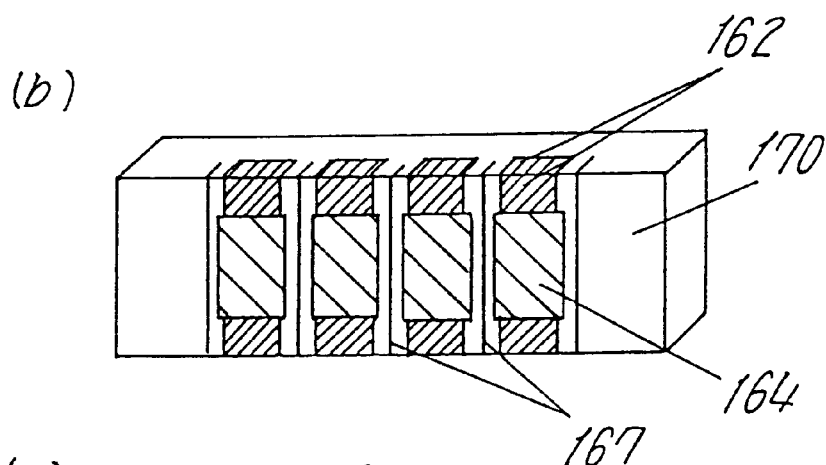
Figure 32:
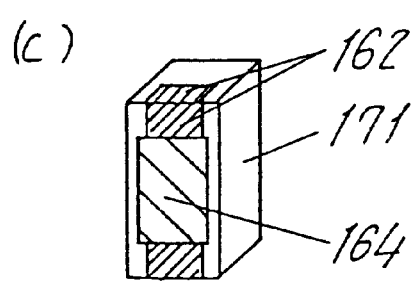

FIG. 31 and FIG. 32 represent a series of procedural views showing a manufacturing method of the resistor of the eighth exemplary embodiment of this invention.

First, electrode paste containing silver-base conductive powder and glass is printed to form upper surface electrode layers 162, as shown in FIG. 31(*a*), in a manner to cross over slitting grooves 168 made in a horizontal direction through a sheet-formed substrate 161, which has a superior heat-resisting property and an insulating property as it contains 96% alumina, and a surface of which is provided with a plurality of slitting grooves 167 and 168 in a vertical direction as well as in a horizontal direction in order to separate it into rectangular strips and then into individual pieces in the subsequent steps. The upper surface electrode layers 162 are then calcined at a temperature of approximately 850° C. in order to make them become stable films. During this process, the electrode paste gets into the slitting grooves 168 of horizontal direction, and that the upper surface electrode layers 162 can be formed deeply down in the slitting grooves. Generally, the slitting grooves 167 and 168 are so formed that their depth with respect to a thickness of the substrate 161 becomes equal to or less than a half of the thickness of the substrate 161, so as to avoid it from being cracked during handling in the manufacturing process.

Next, resistive paste having a principal component of ruthenium oxide is printed to form resistance layers 163 in a manner that they connect electrically with the upper surface electrode layers 162, as shown in FIG. 31(*b*). The resistance layers 163 are then calcined at a temperature of approximately 850° C. in order to make them become stable films.

Next, trimming is made to form trimmed slits 169 with a YAG laser, as shown in FIG. 31(*c*) in order to correct resistance values of the resistance layers 163 to a predetermined value. The trimming is made with trimming probes for measuring a resistance value set on the upper surface electrode layers 162 during this process.

Another paste having a principal component of glass is printed to form protective layers 164, as shown in FIG. 32(*a*), in order to protect the resistance layers 163, of which resistance values have been corrected. For this process, a printing pattern may be made in such a shape that the protective layers 164 cross over the slitting grooves 167 of vertical direction to connectively cover a plurality of the horizontally aligned resistance layers 163. The protective layers 164 are then calcined at a temperature of approximately 600° C. in order to make them become stable films.

Then, the substrate 161 in a sheet-form is separated into rectangular substrate strips 170 by splitting it along the slitting grooves 168 of horizontal direction in the substrate 161, on which the upper surface electrode layers 162, the resistance layers 163, the trimmed slits 169, and the protective layers 164 are formed, as shown in FIG. 32(*b*). When this is done, the previously formed upper surface electrode layers 162 lie in their respective positions on the side surfaces along a longitudinal direction of the rectangular substrate strips 170 down to the depth of the slitting grooves 168 of horizontal direction.

As a preparatory process for plating exposed surfaces of the upper surface electrode layers 162, the rectangular substrate strips 170 are finally separated into individual substrate pieces 171 by splitting them along the slitting grooves 167 of vertical direction, as shown in FIG. 32(*c*). A resistor is now completed when a nickel-plated layer, as an intermediate layer (not shown in the figure), and a solder-plated layer, as an outer layer (not shown in the figure), are formed by means of electroplating on exposed surfaces of the upper surface electrode layers 162 in order to prevent electrode-erosion during soldering and to assure reliability of the soldering.

Figure 33:
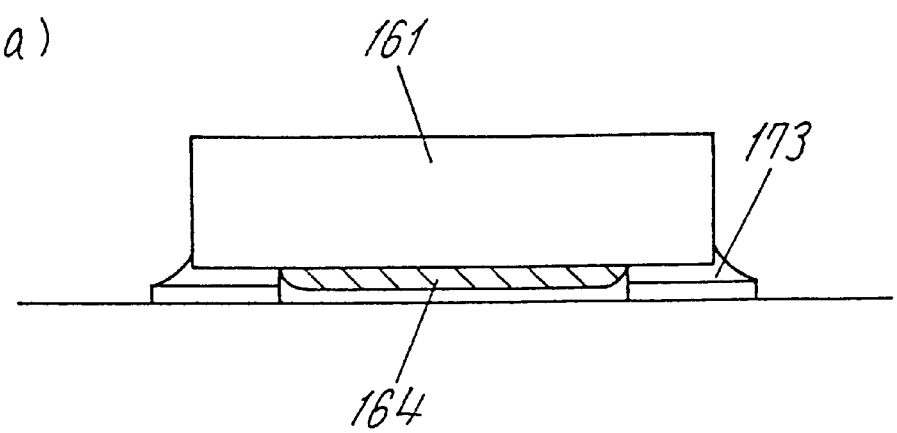
FIG. 33(a) is a sectional view depicting the same resistor in a mounted position.
FIG. 33(b) is a plan view depicting the same resistor in the mounted position.
Figure 33:
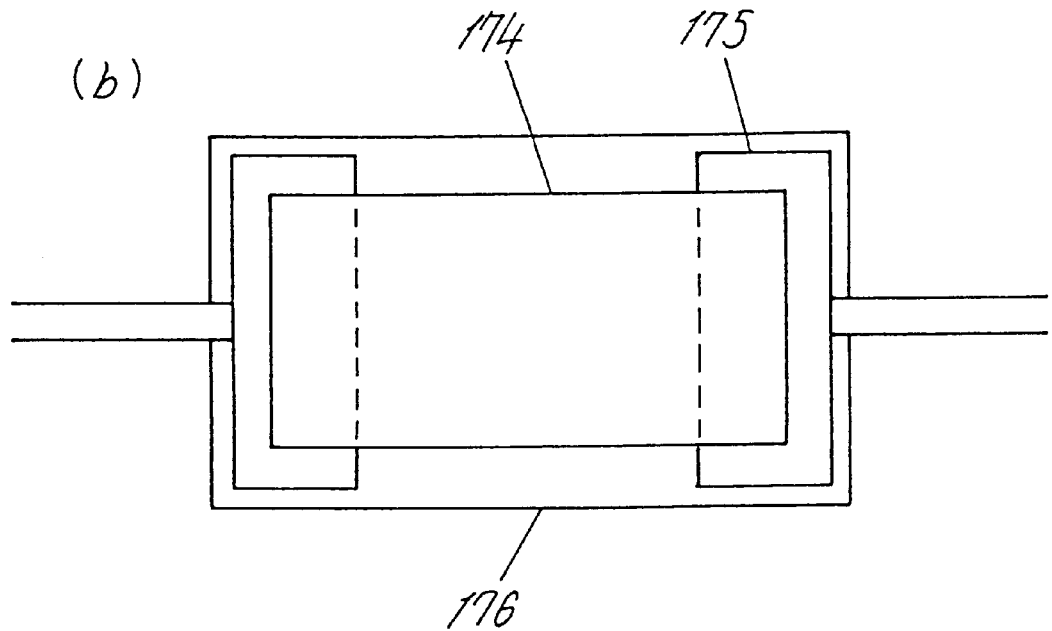

The resistor of the eighth exemplary embodiment of this invention constructed and manufactured as above was soldered on a mount board. The resistor was mounted with the surface having the protective layer down, and soldered with both the upper surface electrode layers (not shown in the figure) and the resistance layer on side surfaces of the substrate, as shown in a sectional view of FIG. 33(*a*) depicting a mounted position. However, since areas in the side surfaces, whereon the electrodes are formed, were so small, fillets 173 were barely formed. Accordingly, an actual mount area 176 came to the sum of a component area 174 and areas 175 required for soldering the side surfaces of this component, as shown in a plan view of FIG. 33(*b*) depicting the mounted position. The invention could attain a reduction of approximately 20% in the mount area as compared to a component of the prior art, in the case of a square-tip resistor in a size of 0.6×0.3 mm.

Therefore, the structure according to the eighth exemplary embodiment of the present invention requires a small area on a mount board to form fillets of soldering, because of the small areas of the side surface electrodes on the resistor, and thereby it can reduce the mount areas.

In the eighth exemplary embodiment of this invention, if solder-plated layers 166 and the protective layer 164 are formed to be on the same plane, or if the solder-plated layers 166 are formed to be higher than the protective layer 164, the resistor is not likely to allow a gap between the solder-plated layers 166 and a land pattern, when it is mounted, thereby further improving quality of mounting.

In addition, other characteristics (specified in Table 8) can be improved in this eighth exemplary embodiment of the invention, if the upper surface electrode layers 162 and the protective layer 164 are constituted of combinations shown in Table 8.

TABLE 8

| Combination | Upper surface electrode layers 162 | Protective layer 164 | Characteristics to be improved |
|---|---|---|---|
| 1 | Gold-base conductive powder and glass (calcined at 850° C.) | Glass-base material (calcined at 600° C.) | Improvement in loaded-life characteristic due to low ion migration |
| 2 | Silver-base conductive powder and glass (calcined at 850° C.) | Resin-base material (hardened at 200° C.) | No variation in resistance value in manufacturing process, and small deviation in resistance value of products, due to low processing temperature of protective layer 34. |
| 3 | Gold-base conductive powder and glass (calcined at 850° C.) | Resin-base material (hardened at 200° C.) | Both characteristics of above combinations 1 and 2. |
| 4 | Gold-base organic metal compound (calcined at 850° C.) | Glass-base material (calcined at 600° C.) | Same characteristics as above combinations 1, and low manufacturing cost due to less amount of gold used than combination 1. |
| 5 | Gold-base organic metal compound (calcined at 850° C.) | Resin-base material (hardened at 200° C.) | Both characteristics of above combinations 3 and 4. |

In addition, it is easily conceivable that the mount area can be further reduced if the side surface electrodes are not formed in the eighth exemplary embodiment of this invention. However, if the side surface electrodes are not formed, the resistor forms no fillet at all, thereby giving rise to a problem that makes an automated inspection by image recognition inexecutable, in consideration of the fact that inspection of soldering is usually carried out by means of image recognition after mounting components in the current manufacturing process of electronic devices.

Ninth Exemplary Embodiment

A resistor of a ninth exemplary embodiment of the present invention and a method of manufacturing the same will be described hereinafter by referring to accompanying figures.

Figure 34:
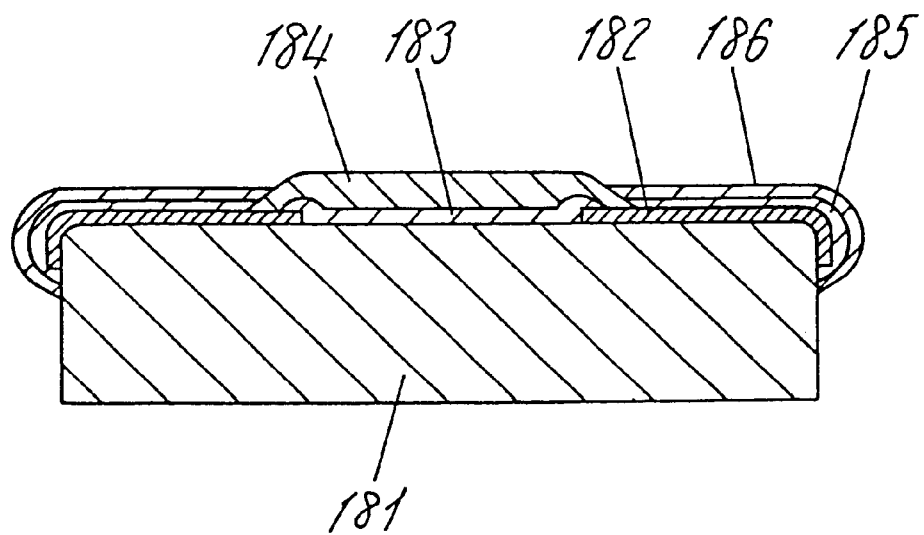
FIG. 34 is a sectional view depicting a resistor of a ninth exemplary embodiment of the present invention.

FIG. 34 is a sectional view of a resistor of the ninth exemplary embodiment of this invention.

In FIG. 34, a reference numeral 181 represents a substrate containing 96% of alumina. A reference numeral 182 represents upper surface electrode layers provided by sputtering gold-base material on side portions of a main surface and portions of side surfaces of the substrate 181. Ridges of these upper surface electrode layers 182 are rounded. In addition, a surface area of each of the upper surface electrode layers 182 on the side surfaces of the substrate 181 is not more than a half of an area of the side surface of the substrate 181. A reference numeral 183 represents a resistance layer having a chief component of ruthenium oxide, for electrically connecting with the upper surface electrode layers 182. A reference numeral 184 represents a protective layer having a chief component of glass, provided on an upper surface of the resistance layer 183. Reference numerals 185 and 186 respectively represent nickel-plated layers and solder-plated layers provided, as occasion demands, for a purpose of assuring reliability, etc. during soldering.

The resistor of the ninth exemplary embodiment of this invention constructed as above is manufactured in a manner, which will be described hereinafter by referring to the figures.

Figure 35:
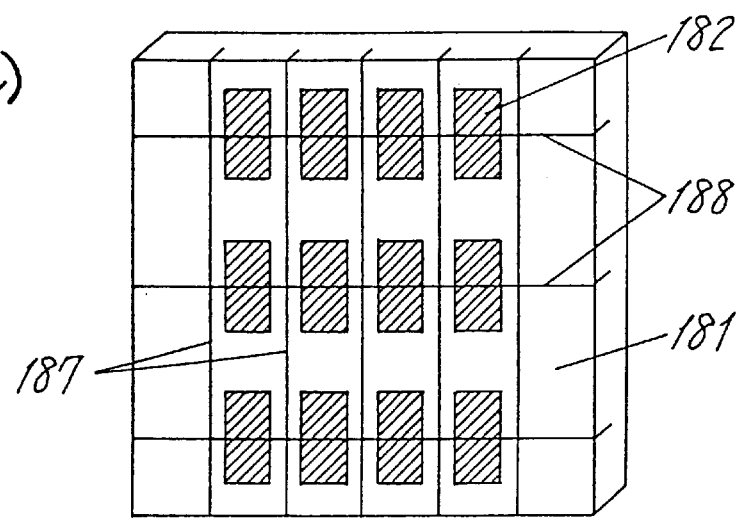
FIG. 35(a) through FIG. 35(c) represent a series of procedural views depicting a process of manufacturing the same resistor.
Figure 35:
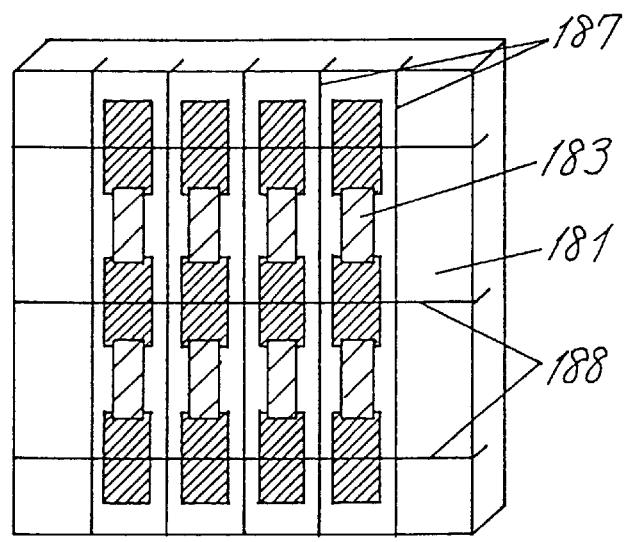
Figure 35:
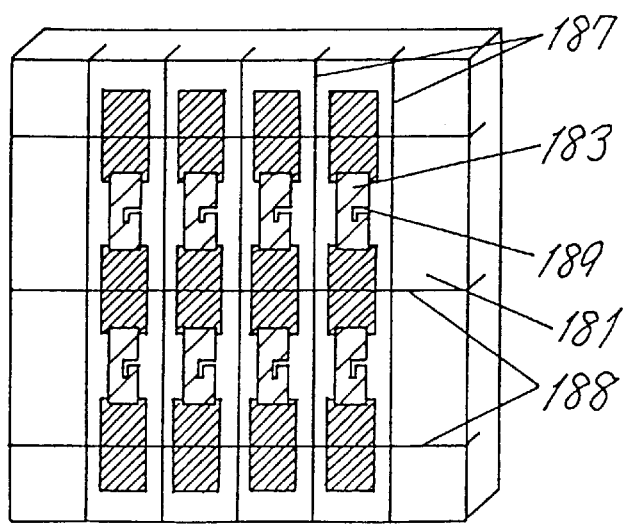
Figure 36:
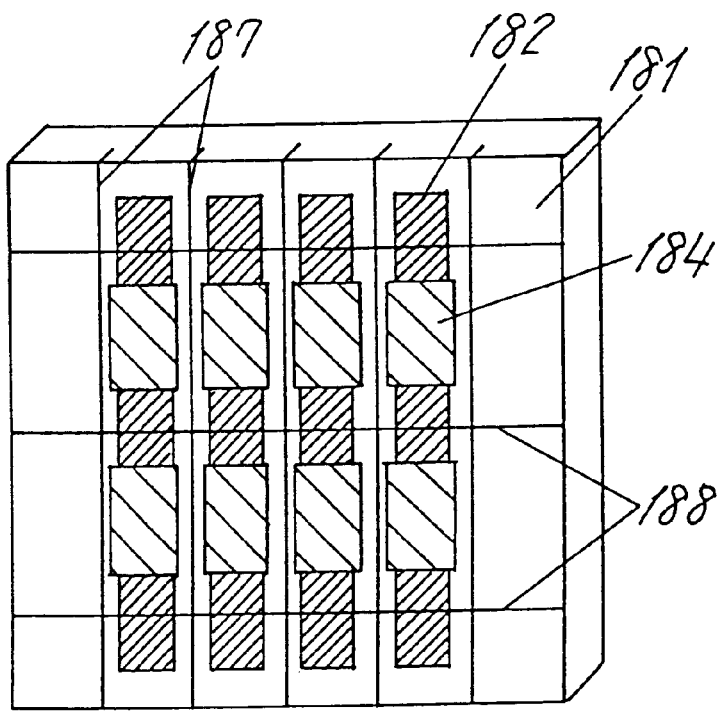
FIG. 36(a) through FIG. 36(c) represent another series of procedural views depicting the process of manufacturing the same resistor.
Figure 36:
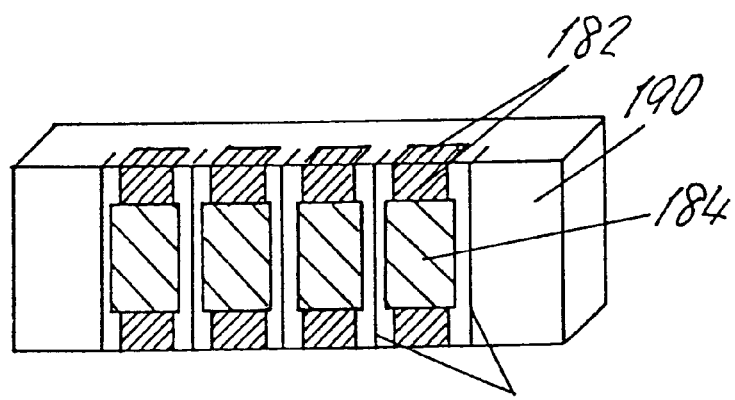
Figure 36:
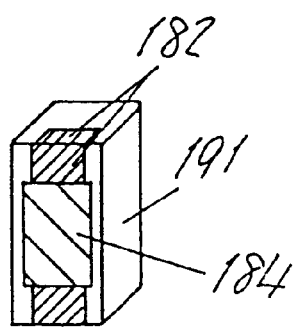

FIG. 35 and FIG. 36 represent a series of procedural views showing a manufacturing method of the resistor of the ninth exemplary embodiment of this invention.

First, gold is deposited in a form of film by sputtering method on an entire upper surface of a sheet-formed substrate 181, which has a superior heat-resisting property and an insulating property as it contains 96% alumina; and a surface of which is provided with a plurality of slitting grooves 187 and 188 in a vertical direction as well as in a horizontal direction in order to separate it into rectangular strips and then into individual pieces in the subsequent steps. Further, upper surface electrode layers 182 having a desired electrode pattern are formed, as shown in FIG. 35(a), by photo-lithographic method which is normally used for LSI's, and the like. The upper surface electrode layers 182 are subjected to a heat treatment at a temperature of approximately 300 to 400° C. in order to make them become stable films. During this process, the upper surface electrode layers 182 get into slitting grooves 188 of horizontal direction, and the upper surface electrode layers 182 can be formed deeply down in the slitting grooves. Generally, the slitting grooves 187 and 188 are so formed that their depth with respect to a thickness of the substrate 181 becomes equal to or less than a half of the thickness of the substrate 181, so as to avoid it from being cracked during handling in the manufacturing process.

Next, resistive paste having a principal component of ruthenium oxide is printed to form resistance layers 183 in a manner that they connect electrically with the upper surface electrode layers 182, as shown in FIG. 35(b). The resistance layers 183 are then calcined at a temperature of approximately 850° C. in order to make them become stable films.

Next, trimming is made to form trimmed slits 189 with a YAG laser, as shown in FIG. 35(c) in order to correct resistance values of the resistance layers 183 to a predetermined value. The trimming is made with trimming probes for measuring a resistance value set on the upper surface electrode layers 182 during this process.

Another paste having a principal component of glass is printed to form protective layers 184, as shown in FIG. 36(a), in order to protect the resistance layers 183, of which resistance values have been corrected. For this process, a printing pattern may be made in such a shape that the protective layers 184 cross over the slitting grooves 187 of vertical direction to connectively cover a plurality of the horizontally aligned resistance layers 183. The protective layers 184 are then calcined at a temperature of approximately 600° C. in order to make them become stable films.

Then, the substrate 181 in a sheet-form, on which the upper surface electrode layers 182, the resistance layers 183, the trimmed slits 189, and the protective layers 184 are formed, is separated into rectangular substrate strips 190 by splitting it along the slitting grooves 188 of horizontal direction in the substrate 181, as shown in FIG. 36(b). When this is done, the previously formed upper surface electrode layers 182 lie in their respective positions on the side surfaces along a longitudinal direction of the rectangular substrate strips 190 down to the depth of the slitting grooves 188 of horizontal direction.

As a preparatory process for plating exposed surfaces of the upper surface electrode layers 182, the rectangular substrate strips 190 are finally separated into individual substrate pieces 191 by splitting them along the slitting grooves 187 of vertical direction, as shown in FIG. 36(c). A resistor is now completed when a nickel-plated layer, as an intermediate layer (not shown in the figure), and a solder-plated layer, as an outer layer (not shown in the figure), are formed by means of electroplating on exposed surfaces of the upper surface electrode layers 182 in order to prevent electrode-erosion during soldering and to assure reliability of the soldering.

The resistor of the ninth exemplary embodiment of this invention constructed and manufactured as above provides the same advantages as what has been described in the eighth exemplary embodiment, when it is soldered on a mount board, and therefore they will not be described.

In addition, other characteristics (specified in Table 9) can be improved in this ninth exemplary embodiment of the invention, if the upper surface electrode layers 182, resistance layer 183 and the protective layer 184 are constituted of combinations shown in Table 9.

TABLE 9

| Combination | Upper surface electrode layers 182 | Resistance layer 183 | Protective layer 184 | Characteristics to be improved |
|---|---|---|---|---|
| 6 | Sputtered gold-base material (heat-treated at 300–400° C.) | Ruthenium oxide-base material (calcined at 850° C.) | Resin-base material (hardened at 200° C.) | No variation in manufacturing process, and small deviation in resistance value of products, due to low processing temperature of protective layer |
| 7 | Sputtered gold-base material (heat-treated at 300–400° C.) | Carbonic-resin base material (hardened at 200° C.) | Resin-base material (hardened at 200° C.) | Same characteristic as above combination 6, with less cost and capable of saving electric energy due to lower process temperature of resistance layer than combination 6. |
| 8 | Sputtered nickel-base material (heat-treated at 300–400° C.) | Carbonic-resin base material (hardened at 200° C.) | Resin-base material (hardened at 200° C.) | Same characteristic as above combination 7, with less manufacturing cost due to use of base metal for electrode material as opposed to combination 7. |

Tenth Exemplary Embodiment

A resistor of a tenth exemplary embodiment of the present invention and a method of manufacturing the same will be described hereinafter by referring to accompanying figures.

Figure 37:
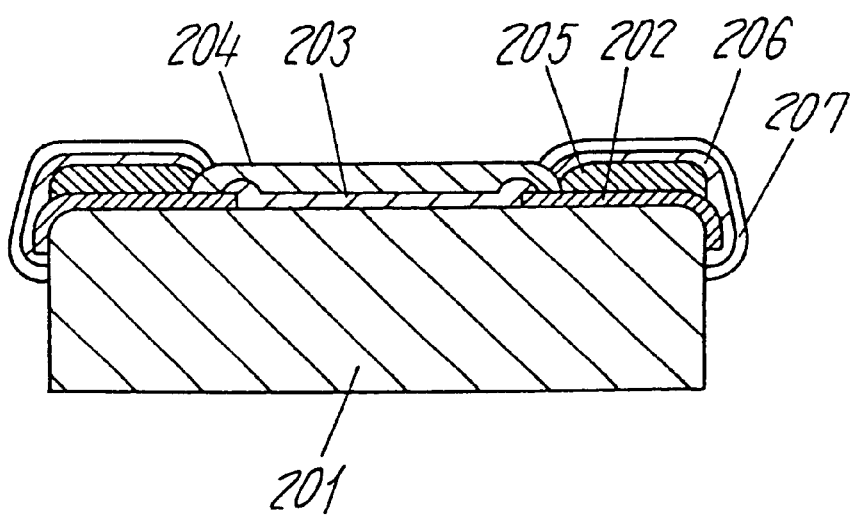
FIG. 37 is a sectional view depicting a resistor of a tenth exemplary embodiment of the present invention.

FIG. 37 is a sectional view of a resistor of the tenth exemplary embodiment of this invention.

In FIG. 37, a reference numeral 201 represents a substrate containing 96% of alumina. A reference numeral 202 represents first upper surface electrode layers composed of silver-base conductive powder containing glass, provided on side portions of a main surface and portions of side surfaces of the substrate 201. A surface area of each of the first upper surface electrode layers 202 on the side surfaces of the substrate 201 is not more than a half of an area of the side surface of the substrate 201. A reference numeral 203 represents a resistance layer having a chief component of ruthenium oxide, for electrically connecting with the first upper surface electrode layers 202. A reference numeral 204 represents a protective layer having a chief component of glass, provided on an upper surface of the resistance layer 203. A reference numeral 205 represents second upper surface electrode layers composed of silver-base conductive powder containing glass, provided on upper surfaces of the first upper surface electrode layers 202. Ridges of the second upper surface electrode layers 205 are rounded. Reference numerals 206 and 207 respectively represent nickel-plated layers and solder-plated layers provided, as occasion demands, for a purpose of assuring reliability, etc. during soldering.

The resistor of the tenth exemplary embodiment of this invention constructed as above is manufactured in a manner, which will be described hereinafter by referring to the figures.

Figure 38:
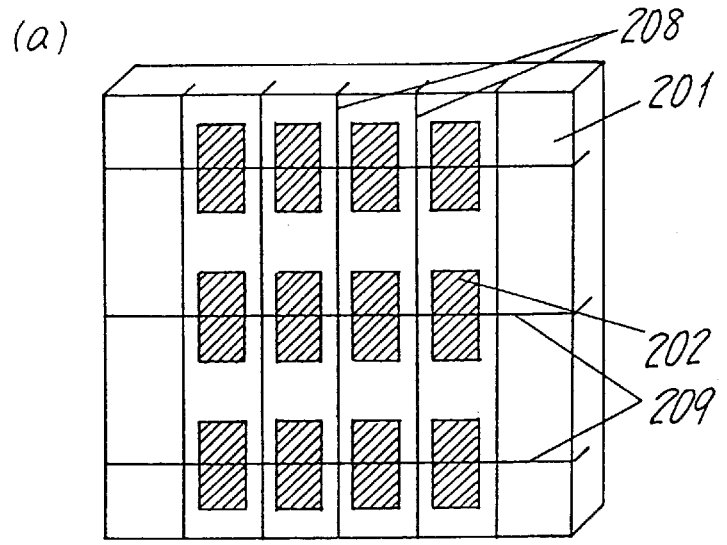
FIG. 38(a) through FIG. 38(c) represent a series of procedural views depicting a process of manufacturing the same resistor.
Figure 38:
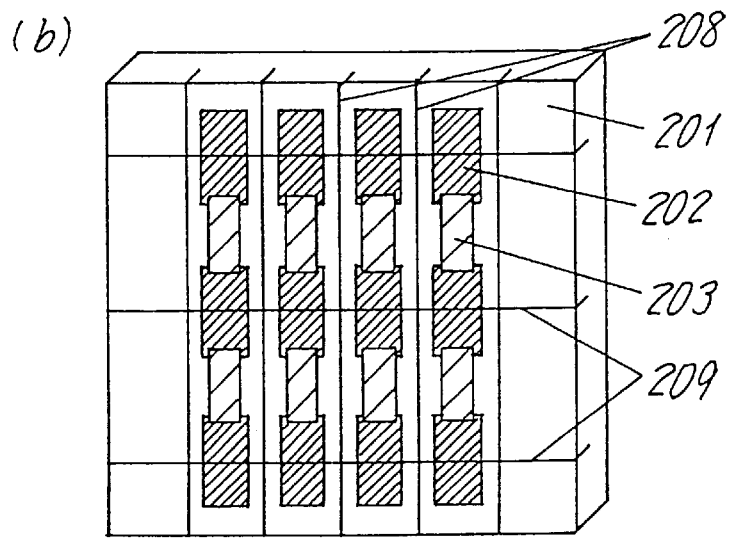
Figure 38:
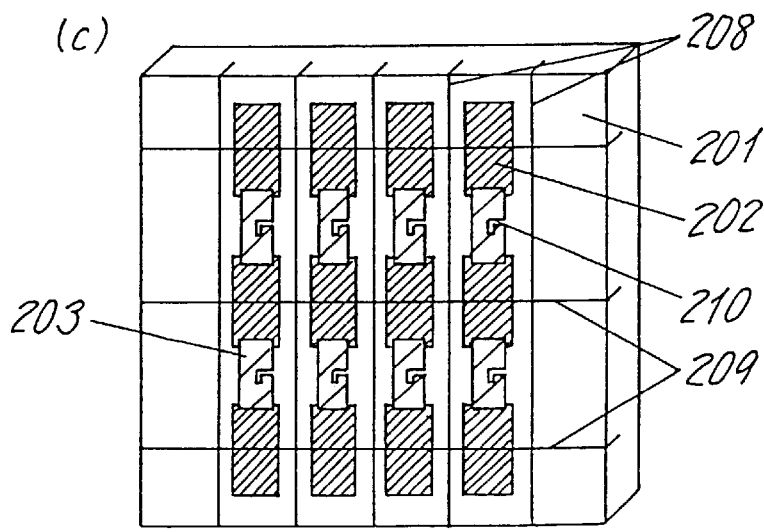
Figure 39:
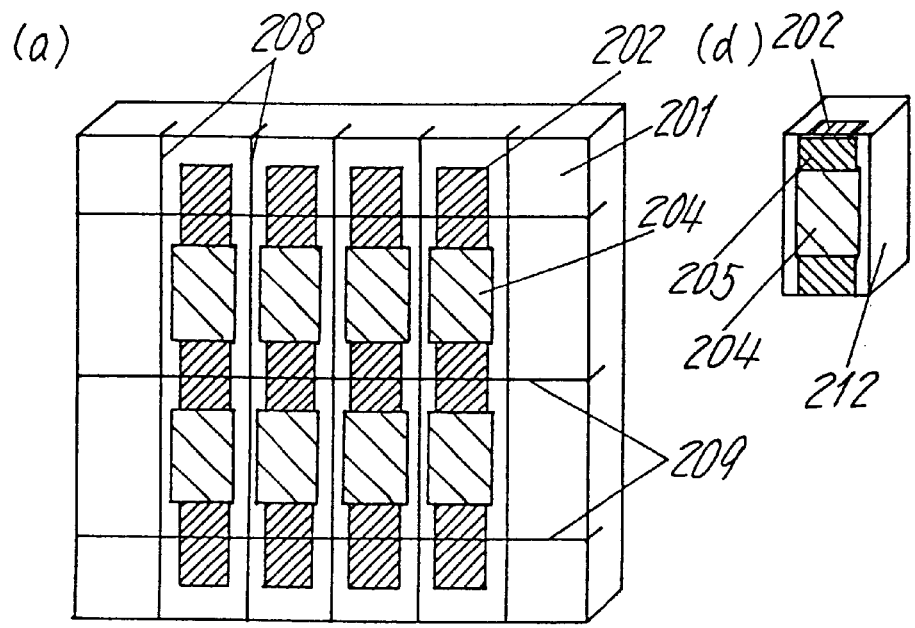
FIG. 39(a) through FIG. 39(c) represent another series of procedural views depicting the process of manufacturing the same resistor.
Figure 39:
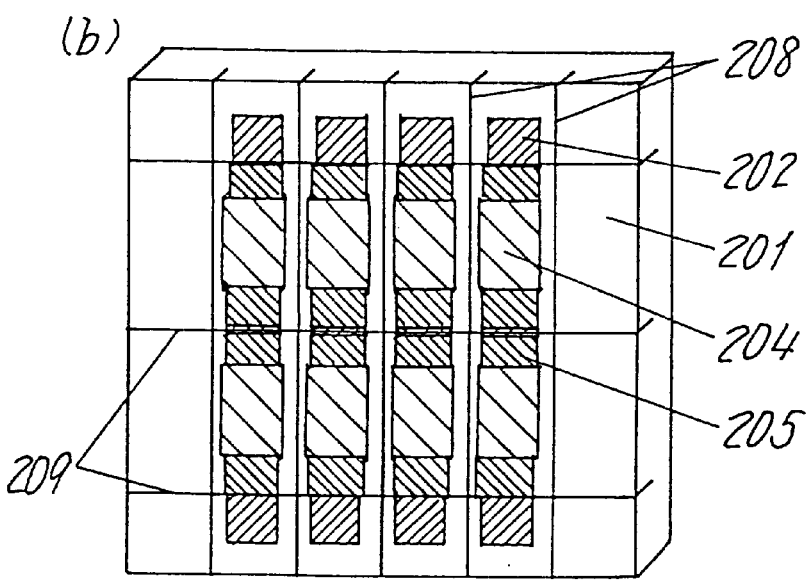
Figure 39:
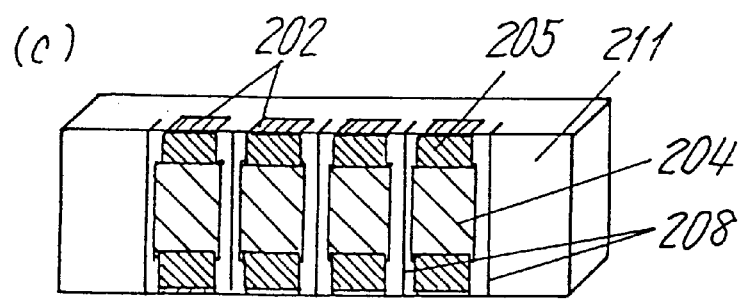

FIG. 38 and FIG. 39 represent a series of procedural views showing a manufacturing method of the resistor of the tenth exemplary embodiment of this invention.

First, electrode paste containing silver-base conductive powder and glass is printed to form first upper surface electrode layers 202, as shown in FIG. 38(a), in a manner to cross over slitting grooves 209 made in a horizontal direction through a sheet-formed substrate 201, which has a superior heat-resisting property and an insulating property as it contains 96% alumina, and a surface of which is provided with a plurality of slitting grooves 208 and 209 in a vertical direction as well as in a horizontal direction in order to separate it into rectangular strips and then into individual pieces in the subsequent steps. The first upper surface electrode layers 202 are then calcined at a temperature of approximately 850° C. in order to make them become stable films. During this process, the electrode paste gets into the slitting grooves 209 of horizontal direction, thereby the first upper surface electrode layers 202 can be formed down deeply in the slitting grooves. Generally, the slitting grooves 208 and 209 are so formed that their depth with respect to a thickness of the substrate 201 becomes equal to or less than a half of the thickness of the substrate 201, so as to avoid it from being cracked during handling in the manufacturing process.

Next, resistive paste having a principal component of ruthenium oxide is printed to form resistance layers 203 in a manner that they connect electrically with the first upper surface electrode layers 202, as shown in FIG. 38(b). The resistance layers 203 are then calcined at a temperature of approximately 850° C. in order to make them become stable films.

Next, trimming is made to form trimmed slits 210 with a YAG laser, as shown in FIG. 38(c) in order to correct resistance values of the resistance layers 203 to a predetermined value. The trimming is made with trimming probes for measuring a resistance value set on the first upper surface electrode layers 202 during this process.

Another paste having a principal component of glass is printed to form protective layers 204, as shown in FIG. 39(a), in order to protect the resistance layers 203, of which resistance values have been corrected. For this process, a printing pattern may be made in such a shape that the protective layers 204 cross over the slitting grooves 208 of vertical direction to connectively cover a plurality of the horizontally aligned resistance layers 203. The protective layers 204 are then calcined at a temperature of approximately 600° C. in order to make them become stable films.

Next, electrode paste containing silver-base conductive powder and glass is printed to form second upper surface electrode layers 205 on upper surfaces of the first upper surface electrode layers 202, as shown in FIG. 39(b), in a manner not to cross over slitting grooves 209 of horizontal direction. For this process, the printing pattern of the second upper surface electrode layers 205 may be made in such a shape that the second upper surface electrode layers cross over the slitting grooves 208 of vertical direction, above the plurality of horizontally aligned first upper surface electrode layers 202. The second upper surface electrode layers 205 are then calcined at a temperature of approximately 600° C. in order to make them become stable films.

Then, the substrate 201 in a sheet-form, on which the first upper surface electrode layers 202, the resistance layers 203, the trimmed slits 210, the protective layers 204 and the second upper surface electrode layers 205 are formed, is separated into rectangular substrate strips 211 by splitting it along the slitting grooves 209 of horizontal direction in the substrate 201, as shown in FIG. 39(c). When this is done, the previously formed first upper surface electrode layers 202 lie in their respective positions on the side surfaces along a longitudinal direction of the rectangular substrate strips 211 down to the depth of the slitting grooves 209 of horizontal direction.

As a preparatory process for plating exposed surfaces of the first upper surface electrode layers 202 and the second upper surface electrode layers 205, the rectangular substrate strips 211 are finally separated into individual substrate pieces 212 by splitting them along the slitting grooves 208 of vertical direction, as shown in FIG. 39(d). A resistor is now completed when a nickel-plated layer, as an intermediate layer (not shown in the figure), and a solder-plated layer, as an outer layer (not shown in the figure), are formed by means of electroplating on exposed surfaces of the first upper surface electrode layers 202 and the second upper surface electrode layers 205 in order to prevent electrode-erosion during soldering and to assure reliability of the soldering.

Figure 40:
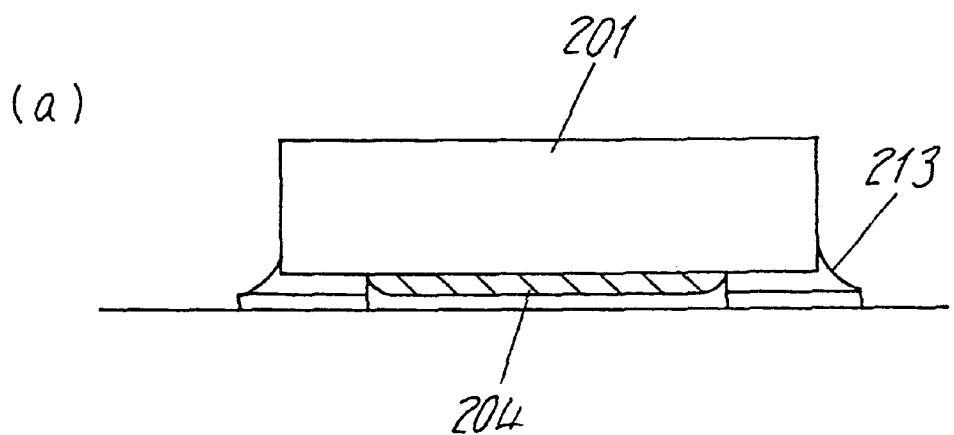
FIG. 40(a) is a sectional view depicting the same resistor in a mounted position.
FIG. 40(b) is a plan view depicting the same resistor in the mounted position.
Figure 40:
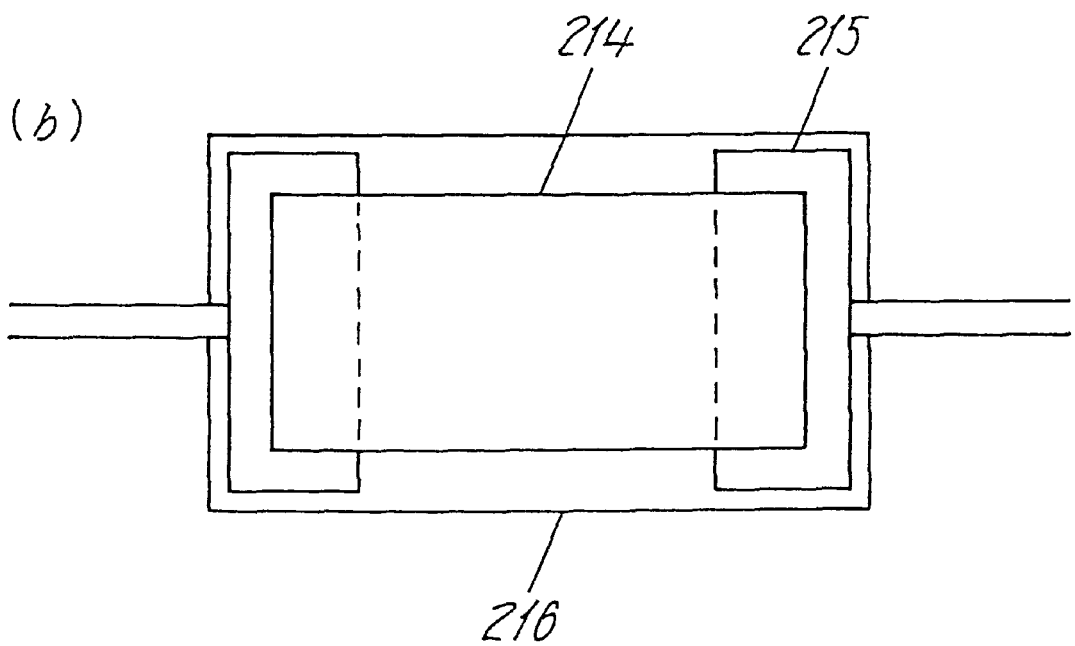

The resistor of the tenth exemplary embodiment of this invention constructed and manufactured as above was soldered on a mount board. The resistor was mounted with the surface having the protective layer down, and soldered with both the upper surface electrode layers (not shown in the figure) and the resistance layer on sides of the substrate, as shown in a sectional view of FIG. 40(a) depicting a mounted position. However, since areas in the side surfaces, whereon electrodes are formed, were so small, fillets 213 were barely formed. Accordingly, an actual mount area 216 came to the sum of a component area 214 and areas 215 required for soldering the side surfaces of this component, as shown in a plan view of FIG. 40(b) depicting the mounted position. The invention could attain a reduction of approximately 20% in the mount area as compared to a component of the prior art, in the case of a square-tip resistor in a size of 0.6×0.3 mm.

Therefore, the structure according to the present invention requires a small area on a mount board to form fillets of soldering, because of the small areas of the side surface electrodes on the resistor, and thereby it can reduce the mount areas.

In the tenth exemplary embodiment of this invention, if solder-plated layers 207 and the protective layer 204 are formed to be on the same plane, or if the solder-plated layers 207 are formed to be higher than the protective layer 204, the resistor is not likely to allow a gap between the solder-plated layers 207 and a land pattern, when it is mounted, thereby further improving quality of mounting.

In addition, other characteristics (specified in Table 10) can be improved in this tenth exemplary embodiment of the invention, if the first upper surface electrode layers 202, the protective layer 204 and the second upper surface electrode layers 205 are constituted of combinations shown in Table 10.

TABLE 10

| Combination | First upper surface electrode layers 202 | Second upper surface electrode layers 205 | Protective layer 204 | Characteristics to be improved |
|---|---|---|---|---|
| 1 | Silver-base conductive powder and glass (calcined at 850° C.) | Silver-base conductive powder and resin (hardened at 200° C.) | Resin-base material (hardened at 200° C.) | No variation in resistance value during manufacturing process, and small deviation in resistance value of products, due to low processing temperature of protective layer 204. |
| 2 | Silver-base conductive powder and glass (calcined at 850° C.) | Nickel-base conductive powder and resin (hardened at 200° C.) | Resin-base material (hardened at 200° C.) | Same characteristic as above combination 1, with less manufacturing cost due to use of base metal for second upper surface electrode layers 205. |
| 3 | Silver-base conductive powder and glass (calcined at 850° C.) | Silver-base conductive powder and glass (calcined at 600° C.) | Glass-base material (hardened at 600° C.) | Improvement in loaded-life characteristic due to low ion migration. |
| 4 | Gold-base conductive powder and glass (calcined at 850° C.) | Silver-base conductive powder and resin (hardened at 200° C.) | Resin-base material (hardened at 200° C.) | Both characteristics of above combinations 1 and 3. |
| 5 | Gold-base conductive powder and glass (calcined at 850° C.) | Nickel-base conductive powder and resin (hardened at 200° C.) | Resin-base material (hardened at 200° C.) | Both characteristics of above combinations 2 and 3. |
| 6 | Gold-base organic metal compound (calcined at 850° C.) | Silver-base conductive powder and glass (calcined at 600° C.) | Glass-base material (hardened at 600° C.) | Same characteristic as above combination 3, and low cost due to reduction in amount of gold used. |
| 7 | Gold-base organic metal compound (calcined at 850° C.) | Silver-base conductive powder and resin (hardened at 200° C.) | Resin-base material (hardened at 200° C.) | Both characteristics of above combinations 1 and 6. |
| 8 | Gold-base organic metal compound (calcined at 850° C.) | Nickel-base conductive powder and resin (hardened at 200° C.) | Resin-base material (hardened at 200° C.) | Both characteristics of above combinations 2 and 6. |

In addition, it is easily conceivable that the mount area can be further reduced if electrodes are not formed on the side surfaces in the tenth exemplary embodiment of this invention. However, if the electrodes are not formed on the side surfaces, the resistor forms no fillet at all, thereby giving rise to a problem that makes an automated inspection by image recognition inexecutable, in consideration of the fact that inspection of soldering is usually carried out by means of image recognition after mounting components in the current manufacturing process of electronic devices.

Eleventh Exemplary Embodiment

A resistor of an eleventh exemplary embodiment of the present invention and a method of manufacturing the same will be described hereinafter by referring to accompanying figures.

Figure 41:
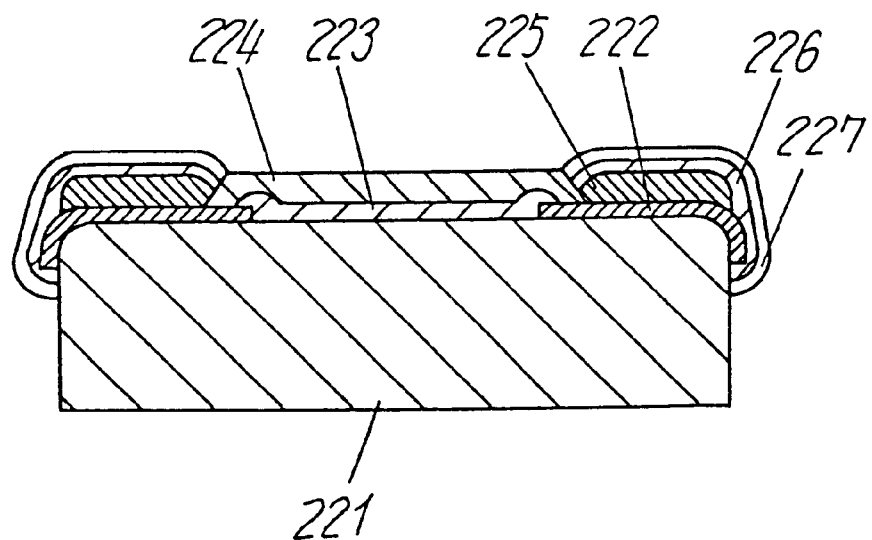
FIG. 41 is a sectional view depicting a resistor of an eleventh exemplary embodiment of the present invention.

FIG. 41 is a sectional view of a resistor of the eleventh exemplary embodiment of this invention.

In FIG. 41, a reference numeral 221 represents a substrate containing 96% of alumina. A reference numeral 222 represents first upper surface electrode layers provided on side portions of a main surface and portions of side surfaces of the substrate 221 by means of sputtering gold-base material. A surface area of each of the first upper surface electrode layers 222 on the side surfaces of the substrate 221 is not more than a half of an area of the side surface of the substrate 221. A reference numeral 223 represents a resistance layer having a chief component of ruthenium oxide, for electrically connecting with the first upper surface electrode layers 222. A reference numeral 224 represents a protective layer having a chief component of glass, provided on an upper surface of the resistance layer 223. A reference numeral 225 represents second upper surface electrode layers composed of silver-base conductive powder containing glass, provided on upper surfaces of the first upper surface electrode layers 222. Ridges of the second upper surface electrode layers 225 are rounded. Reference numerals 226 and 227 respectively represent nickel-plated layers and solder-plated layers provided, as occasion demands, for a purpose of assuring reliability, etc. during soldering.

The resistor of the eleventh exemplary embodiment of this invention constructed as above is manufactured in a manner, which will be described hereinafter by referring to the figures.

Figure 42:
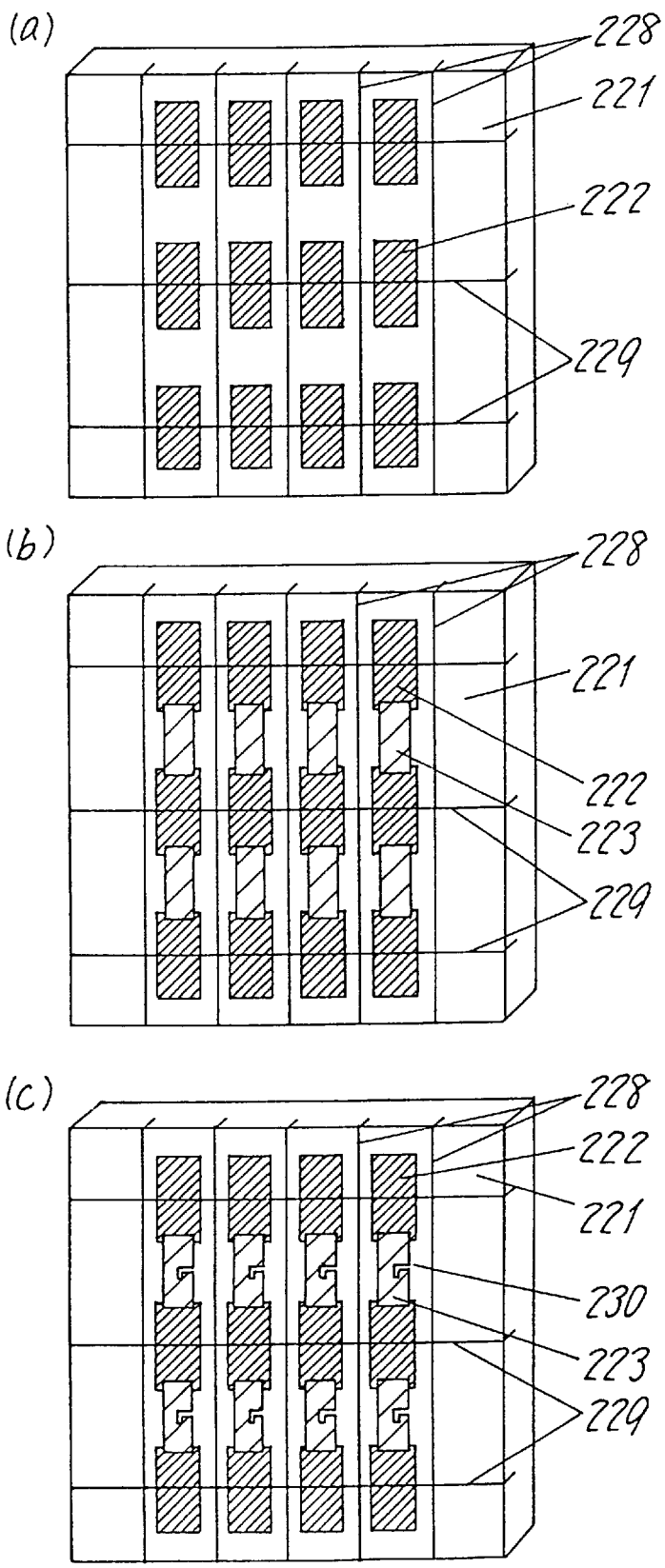
FIG. 42(a) through FIG. 42(c) represent a series of procedural views depicting a process of manufacturing the same resistor.
Figure 43:
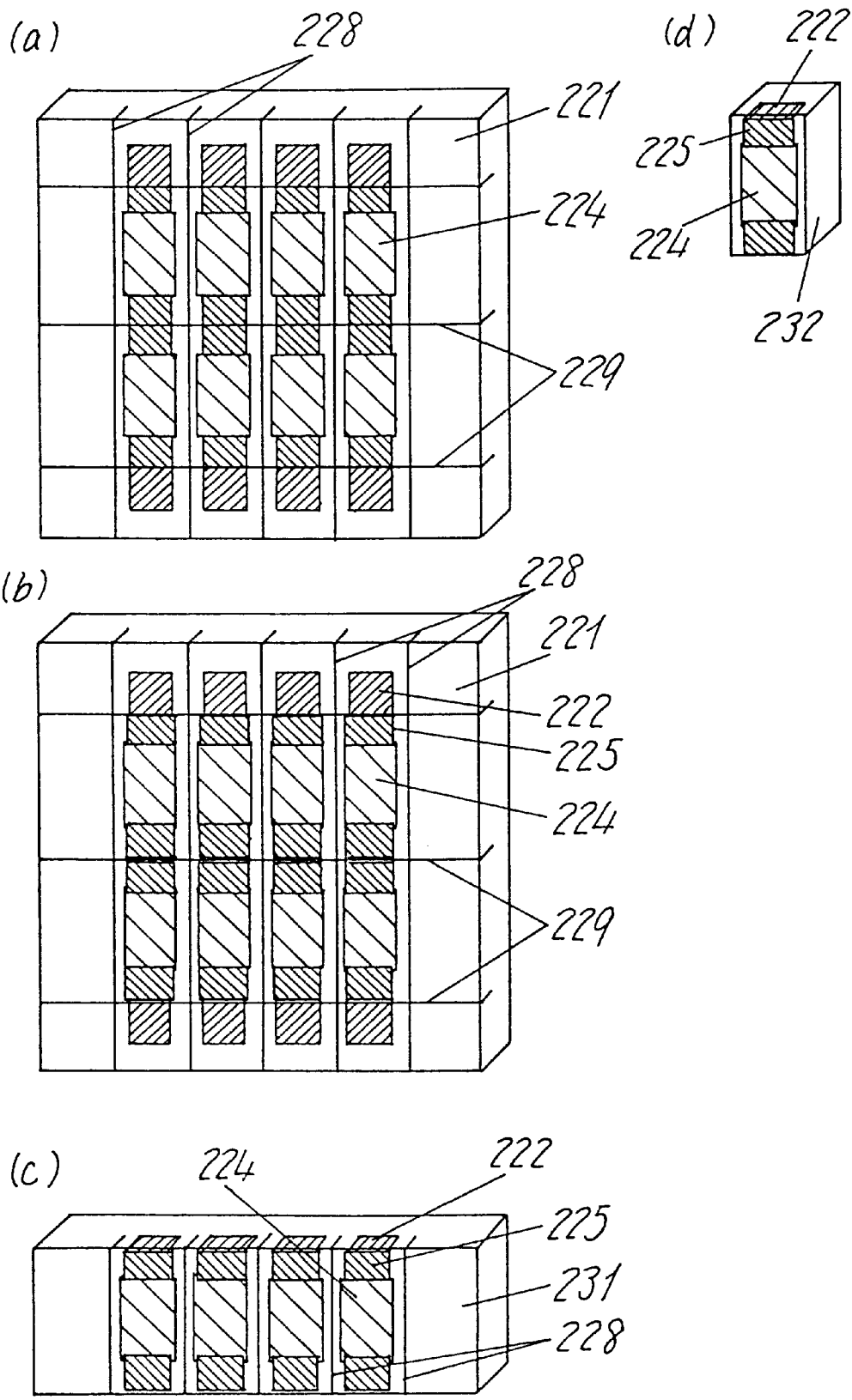
FIG. 43(a) through FIG. 43(d) represent another series of procedural views depicting the process of manufacturing the same resistor.

FIG. 42 and FIG. 43 represent a series of procedural views showing a manufacturing method of the resistor of the eleventh exemplary embodiment of this invention.

First, gold is deposited in a form of film by sputtering method on an entire upper surface of a sheet-formed substrate 221, which has a superior heat-resisting property and an insulating property as it contains 96% alumina, and a surface of which is provided with a plurality of slitting grooves 228 and 229 in a vertical direction as well as in a horizontal direction in order to separate it into rectangular strips and then into individual pieces in the subsequent steps. Further, first upper surface electrode layers 222 having a desired electrode pattern are formed, as shown in FIG. 42(a), by photo-lithographic method which is normally used for LSI's, and the like. The first upper surface electrode layers 222 are subjected to heat treatment at a temperature of approximately 300 to 400° C. in order to make them become stable films. During this process, the first upper surface electrode layers 222 get into slitting grooves 229 of horizontal direction, thereby the upper surface electrode layers 222 can be formed down deeply in the slitting grooves. Generally, the slitting grooves 228 and 229 are so formed that their depth with respect to a thickness of the substrate 221 becomes equal to or less than a half of the thickness of the substrate 221, so as to avoid it from being cracked during handling in the manufacturing process.

Next, resistive paste having a principal component of ruthenium oxide is printed to form resistance layers 223 in a manner that they connect electrically with the first upper surface electrode layers 222, as shown in FIG. 42(b). The resistance layers 223 are then calcined at a temperature of approximately 850° C. in order to make them become stable films.

Next, trimming is made to form trimmed slits 230 with a YAG laser, as shown in FIG. 42(c) in order to correct resistance values of the resistance layers 223 to a predetermined value. The trimming is made with trimming probes for measuring a resistance value set on the first upper surface electrode layers 222 during this process.

Another paste having a principal component of glass is printed to form protective layers 224, as shown in FIG. 43(a), in order to protect the resistance layers 223, of which resistance values have been corrected. For this process, a printing pattern may be made in such a shape that the protective layers 224 cross over the slitting grooves 228 of vertical direction to connectively cover a plurality of the horizontally aligned resistance layers 223. The protective layers 224 are then calcined at a temperature of approximately 600° C. in order to make them become stable films.

Next, electrode paste containing silver-base conductive powder and glass is printed to form second upper surface electrode layers 225 on upper surfaces of the first upper surface electrode layers 222, as shown in FIG. 43(b), in a manner not to cross over slitting grooves 229 of horizontal direction. The second upper surface electrode layers 225 are then calcined at a temperature of approximately 600° C. in order to make them become stable films.

Then, the substrate 221 in a sheet-form on which the first upper surface electrode layers 222, the resistance layers 223, the trimmed slits 230, the protective layers 224 and second upper surface electrode layers 225 are formed, is separated into rectangular substrate strips 231 by splitting it along the slitting grooves 229 of horizontal direction in the substrate 221, as shown in FIG. 43(c). When this is done, the previously formed first upper surface electrode layers 222 lie in their respective positions on the side surfaces along a longitudinal direction of the rectangular substrate strips 231 down to the depth of the slitting grooves 229 of horizontal direction.

As a preparatory process for plating exposed surfaces of the first upper surface electrode layers 222 and the second upper surface electrode layers 225, the rectangular substrate strips 231 are finally separated into individual substrate pieces 232 by splitting them along the slitting grooves 228 of vertical direction, as shown in FIG. 43(d). A resistor is now completed when a nickel-plated layer, as an intermediate layer (not shown in the figure), and a solder-plated layer, as an outer layer (not shown in the figure), are formed by means of electroplating on exposed surfaces of the upper surface electrode layers 222 in order to prevent electrode-erosion during soldering and to assure reliability of the soldering.

The resistor of the eleventh exemplary embodiment of this invention constructed and manufactured as above provides the same advantages as what has been described in the tenth exemplary embodiment, when it is soldered on a mount board, and therefore they will not be described.

In addition, other characteristics (specified in Table 11) can be improved in this eleventh exemplary embodiment of the invention, if the first upper surface electrode layers 222, the protective layer 224 and the second upper surface electrode layers 225 are constituted of combinations shown in Table 11.

TABLE 11

| Combination | First upper surface electrode layers 222 | Second upper surface electrode layers 225 | Protective layer 224 | Characteristics to be improved |
|---|---|---|---|---|
| 9 | Sputtered gold-base material (heat-treated at 300–400° C.) | Silver-base conductive powder and resin (hardened at 200° C.) | Resin-base material (hardened at 200° C.) | No variation in resistance value during manufacturing process, and small deviation in resistance value of products, due to low processing temperature of protective layer 224. |
| 10 | Sputtered gold-base material (heat-treated at 300–400° C.) | Nickel-base conductive powder and resin (hardened at 200° C.) | Resin-base material (hardened at 200° C.) | Same characteristic as above combination 9, with less manufacturing cost due to use of base metal for second upper surface electrode layers. |
| 11 | Sputtered nickel-base material (heat-treated at 300–400° C.) | Silver-base conductive powder and resin (hardened at 200° C.) | Resin-base material (hardened at 200° C.) | Requires carbonic resin-base material for resistance layer. Carbonic resin-base material can provide saving of electricity. |

Twelfth Exemplary Embodiment

A resistor of a twelfth exemplary embodiment of the present invention and a method of manufacturing the same will be described hereinafter by referring to accompanying figures.

Figure 44:
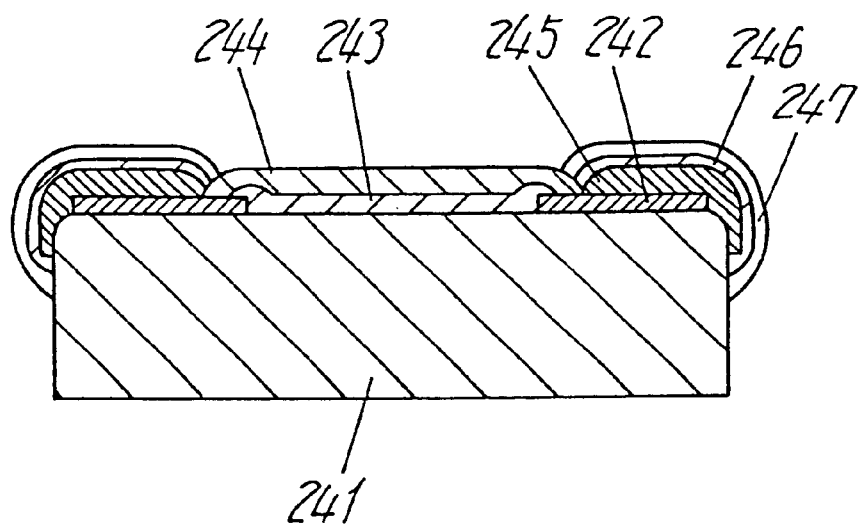
FIG. 44 is a sectional view depicting a resistor of a twelfth exemplary embodiment of the present invention.

FIG. 44 is a sectional view of a resistor of the twelfth exemplary embodiment of this invention.

In FIG. 44, a reference numeral 241 represents a substrate containing 96% of alumina. A reference numeral 242 represents first upper surface electrode layers composed of silver-base conductive powder containing glass, provided on side portions of a main surface of the substrate 241. A reference numeral 243 represents a resistance layer having a chief component of ruthenium oxide, for electrically connecting with the first upper surface electrode layers 242. A reference numeral 244 represents a protective layer having a chief component of glass, provided on an upper surface of the resistance layer 243. A reference numeral 245 represents second upper surface electrode layers composed of silver-base conductive powder containing glass, provided on upper surfaces of the first upper surface electrode layers 242 and portions of side surfaces of the substrate 241. A surface area of each of the second upper surface electrode layers 245 on the side surfaces of the substrate 241 is not more than a half of an area of the side surface of the substrate 241. Ridges of the second upper surface electrode layers 245 are rounded. Reference numerals 246 and 247 respectively represent nickel-plated layers and solder-plated layers provided, as occasion demands, for a purpose of assuring reliability, etc. during soldering.

Figure 45:
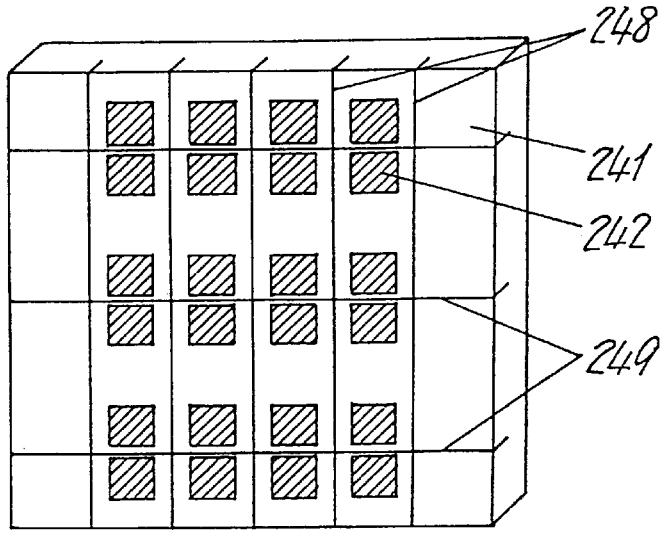
FIG. 45(*a*) through FIG. 45(*c*) represent a series of procedural views depicting a process of manufacturing the same resistor.
Figure 45:
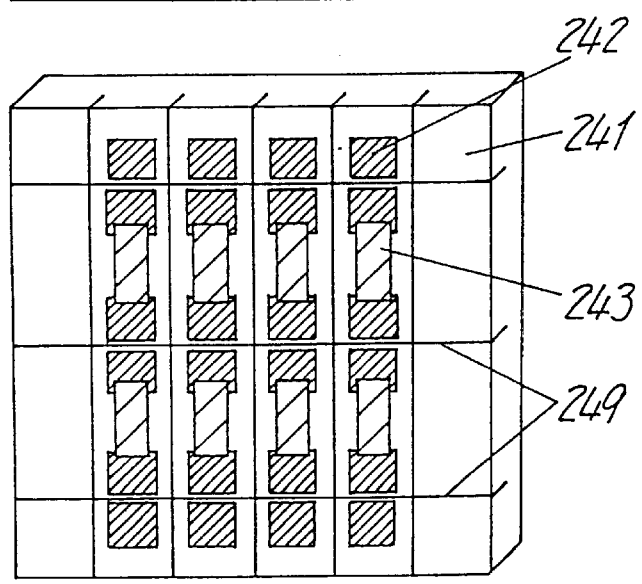
Figure 45:
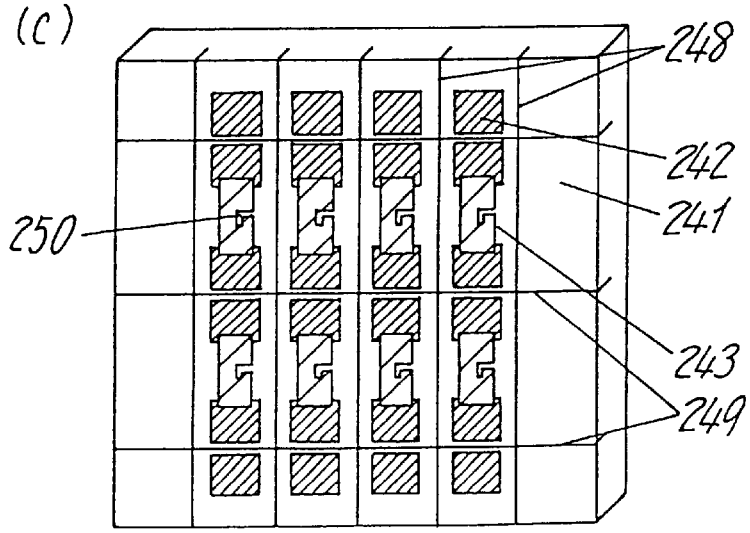
Figure 46:
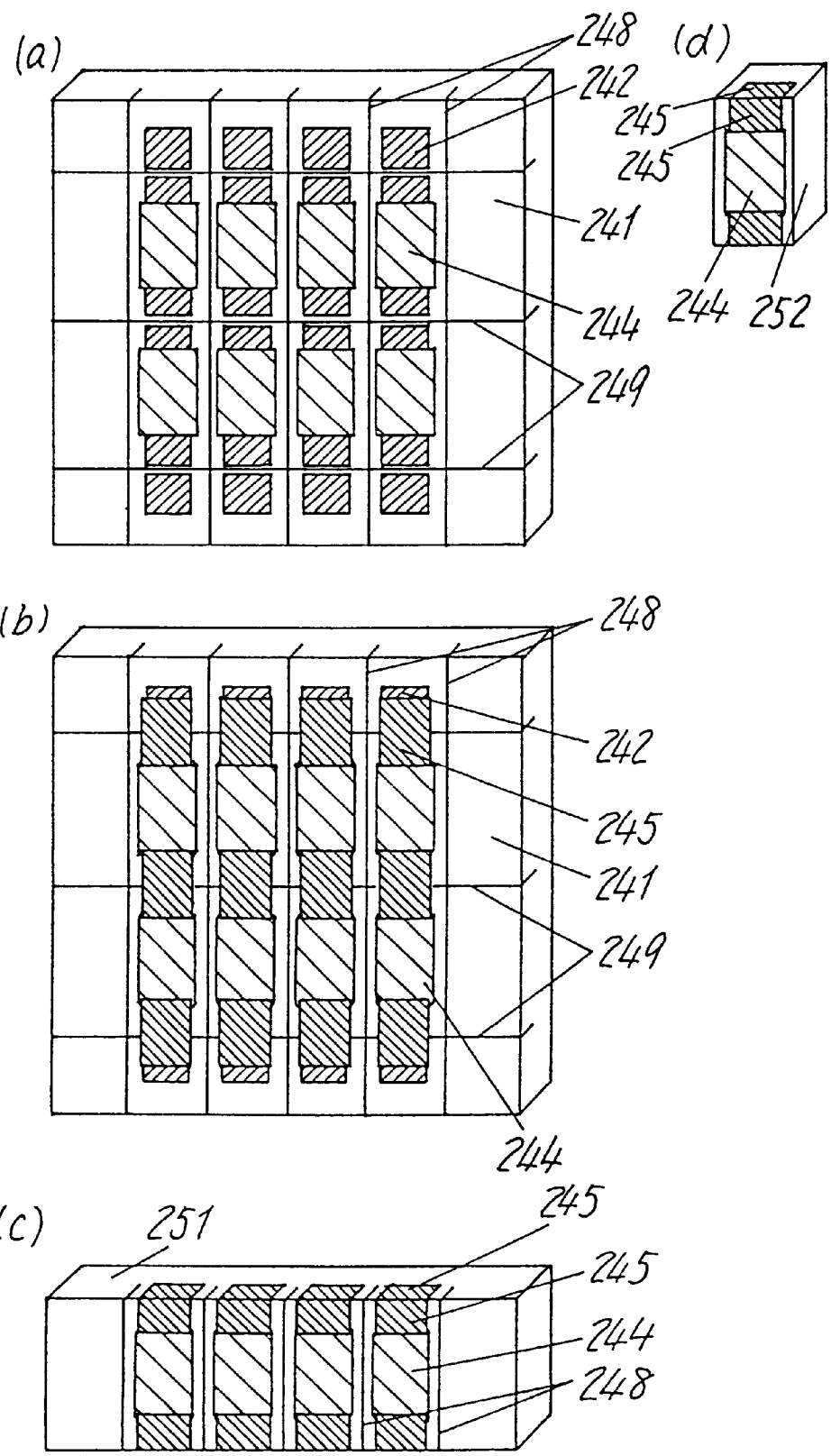
FIG. 46(*a*) through FIG. 46(*d*) represent another series of procedural views depicting the process of manufacturing the same resistor.

FIG. 45 and FIG. 46 represent a series of procedural views showing a manufacturing method of the resistor of the twelfth exemplary embodiment of this invention.

First, electrode paste containing silver-base conductive powder and glass is printed to form first upper surface electrode layers 242, as shown in FIG. 45(a), in a manner to cross over slitting grooves 249 made in a horizontal direction through a sheet-formed substrate 241, which has a superior heat-resisting property and an insulating property as it contains 96% alumina, and a surface of which is provided with a plurality of slitting grooves 248 and 249 in a vertical direction as well as in a horizontal direction in order to separate it into rectangular strips and then into individual pieces in the subsequent steps. The first upper surface electrode layers 242 are then calcined at a temperature of approximately 850° C. in order to make them become stable films. Generally, the slitting grooves 248 and 249 are so formed that their depth with respect to a thickness of the substrate 241 becomes equal to or less than a half of the thickness of the substrate 241, so as to avoid it from being cracked during handling in the manufacturing process.

Next, resistive paste having a principal component of ruthenium oxide is printed to form resistance layers 243 in a manner that they connect electrically with the first upper surface electrode layers 242, as shown in FIG. 45(b). The resistance layers 243 are then calcined at a temperature of approximately 850° C. in order to make them become stable films.

Next, trimming is made to form trimmed slits 250 with a YAG laser, as shown in FIG. 45(c) in order to correct resistance values of the resistance layers 243 to a predetermined value. The trimming is made with trimming probes for measuring a resistance value set on the first upper surface electrode layers 242 during this process.

Another paste having a principal component of glass is printed to form protective layers 244, as shown in FIG. 46(a), in order to protect the resistance layers 243, of which resistance values have been corrected. For this process, a printing pattern may be made in such a shape that the protective layers 244 cross over the slitting grooves 248 of vertical direction to connectively cover a plurality of the horizontally aligned resistance layers 243, which form lines. The protective layers 244 are then calcined at a temperature of approximately 600° C. in order to make them become stable films.

Next, electrode paste containing silver-base conductive powder and glass is printed to form second upper surface electrode layers 245 on an upper surface of the first substrate 242, as shown in FIG. 46(b), in a manner to cross over slitting grooves 249 of horizontal direction in the substrate 241. During this process, the electrode paste gets into the slitting grooves 249 of horizontal direction, thereby the second upper surface electrode layers 245 can be formed down to the deep in the slitting grooves. For this process, the printing pattern of the second upper surface electrode layers 245 may be made in such a shape that the second upper surface electrode layers cross over the slitting grooves 248 of vertical direction, over the plurality of horizontally aligned first upper surface electrode layers 242. The second upper surface electrode layers 245 are then calcined at a temperature of approximately 600° C. in order to make them become stable films.

Then, the substrate 241 in a sheet-form on which the first upper surface electrode layers 242, the resistance layers 243, the trimmed slits 250, the protective layers 244 and the second upper surface electrode layers 245 are formed, is separated into rectangular substrate strips 251 by splitting it along the slitting grooves 249 of horizontal direction in the substrate 241, as shown in FIG. 46(c). When this is done, the previously formed second upper surface electrode layers 245 lie in their respective positions on the side surfaces along a longitudinal direction of the rectangular substrate strips 251 down to the depth of the slitting grooves 249 of horizontal direction.

As a preparatory process for plating exposed surfaces of the second upper surface electrode layers 245, the rectangular substrate strips 251 are finally separated into individual substrate pieces 252 by splitting them along the slitting grooves 248 of vertical direction, as shown in FIG. 46(d). A resistor is now completed when a nickel-plated layer, as an intermediate layer (not shown in the figure), and a solder-plated layer, as an outer layer (not shown in the figure), are formed by means of electroplating on exposed surfaces of the second upper surface electrode layers 245 in order to prevent electrode-erosion during soldering and to assure reliability of the soldering.

The resistor of the twelfth exemplary embodiment of this invention constructed and manufactured as above provides the same advantages as what has been described in the tenth exemplary embodiment, when it is soldered on a mount board, and therefore they will not be described.

In addition, other characteristics (specified in Table 12) can be improved in this twelfth exemplary embodiment of the invention, if the first upper surface electrode layers 242, the protective layer 244 and the second upper surface electrode layers 245 are constituted of combinations shown in Table 12.

TABLE 12

| Combination | First upper surface electrode layers 242 | Second upper surface electrode layers 245 | Protective layer 244 | Characteristics to be improved |
|---|---|---|---|---|
| 12 | Silver-base conductive powder and glass (calcined at 850° C.) | Silver-base conductive powder and resin (hardened at 200° C.) | Resin-base material (hardened at 200° C.) | No variation in resistance value during manufacturing process, and small deviation in resistance value of products, due to low processing temperature of protective layer 244. |
| 13 | Silver-base conductive powder and glass (calcined at 850° C.) | Nickel-base conductive powder and resin (hardened at 200° C.) | Resin-base material (hardened at 200° C.) | Same characteristic as above combination 12, with less manufacturing cost due to use of base metal for second upper surface electrode layers. |
| 14 | Gold-base conductive powder and glass (calcined at 850° C.) | Silver-base conductive powder and glass (calcined at 600° C.) | Glass-base material (hardened at 600° C.) | Improvement in loaded-life characteristic due to low ion migration. |
| 15 | Gold-base conductive powder and glass (calcined at 850° C.) | Silver-base conductive powder and resin (hardened at 200° C.) | Resin-base material (hardened at 200° C.) | Both characteristics of above combinations 12 and 14. |
| 16 | Gold-base conductive powder and glass (calcined at 850° C.) | Nickel-base conductive powder and resin (hardened at 200° C.) | Resin-base material (hardened at 200° C.) | Both characteristics of above combinations 13 and 14. |
| 17 | Gold-base organic metal compound (calcined at 850° C.) | Silver-base conductive powder and glass (calcined at 600° C.) | Glass-base material (hardened at 600° C.) | Same characteristic as above combination 14, and low cost due to reduction in amount of gold used. |
| 18 | Gold-base organic metal compound (calcined at 850° C.) | Silver-base conductive powder and resin (hardened at 200° C.) | Resin-base material (hardened at 200° C.) | Both characteristics of above combinations 12 and 17. |
| 19 | Gold-base organic metal compound (calcined at 850° C.) | Nickel-base conductive powder and resin (hardened at 200° C.) | Resin-base material (hardened at 200° C.) | Both characteristics of above combinations 13 and 17. |

Thirteenth Exemplary Embodiment

A resistor of a thirteenth exemplary embodiment of the present invention and a method of manufacturing the same will be described hereinafter by referring to accompanying figures.

Figure 47:
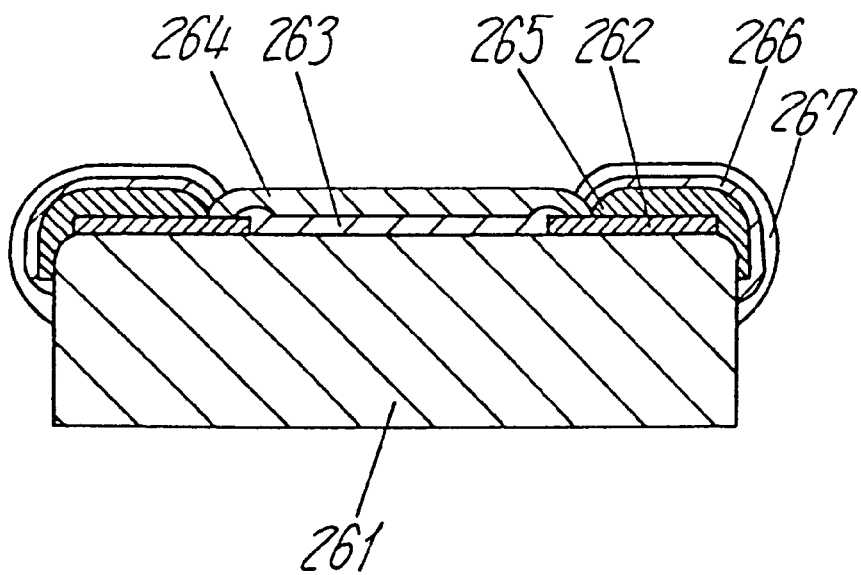
FIG. 47 is a sectional view depicting a resistor of a thirteenth exemplary embodiment of the present invention.

FIG. 47 is a sectional view of a resistor of the thirteenth exemplary embodiment of this invention.

In FIG. 47, a reference numeral 261 represents a substrate containing 96% of alumina. A reference numeral 262 represents first upper surface electrode layers composed of silver-base conductive powder containing glass, provided on side portions of a main surface of the substrate 261. A reference numeral 263 represents a resistance layer having a chief component of ruthenium oxide, for electrically connecting with the first upper surface electrode layers 262. A reference numeral 264 represents a protective layer having a chief component of glass, provided on an upper surface of the resistance layer 263. A reference numeral 265 represents second upper surface electrode layers formed by means of sputtering gold-base material in positions on upper surfaces and portions of side surfaces of the first upper surface electrode layers 262. A surface area of each of the second upper surface electrode layers 265 on the side surfaces of the substrate 261 is not more than a half of an area of the side surface of the substrate 261. Ridges of the second upper surface electrode layers 265 are rounded. Reference numerals 266 and 267 respectively represent nickel-plated layers and solder-plated layers provided, as occasion demands, for a purpose of assuring reliability, etc. during soldering.

The resistor of the thirteenth exemplary embodiment of this invention constructed as above is manufactured in a manner, which will be described hereinafter by referring to the figures.

Figure 48:
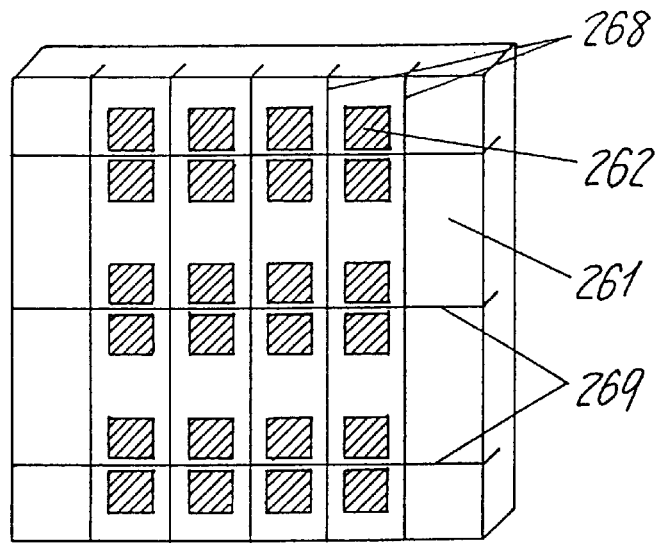
FIG. 48(*a*) through FIG. 48(*c*) represent a series of procedural views depicting a process of manufacturing the same resistor.
Figure 48:
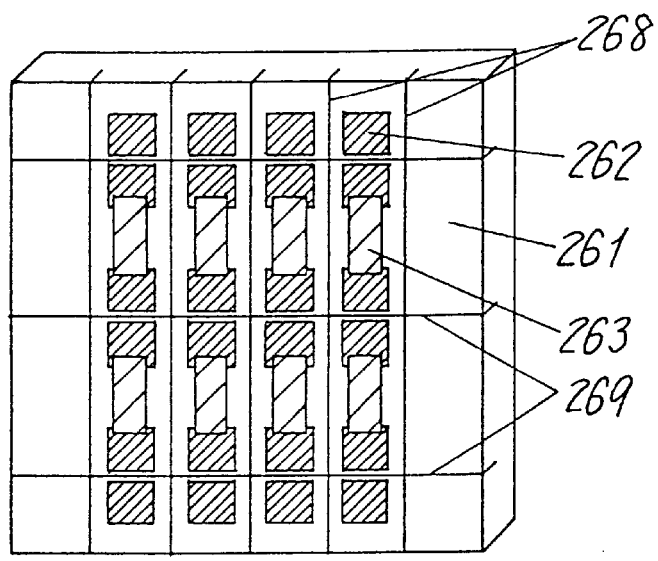
Figure 48:
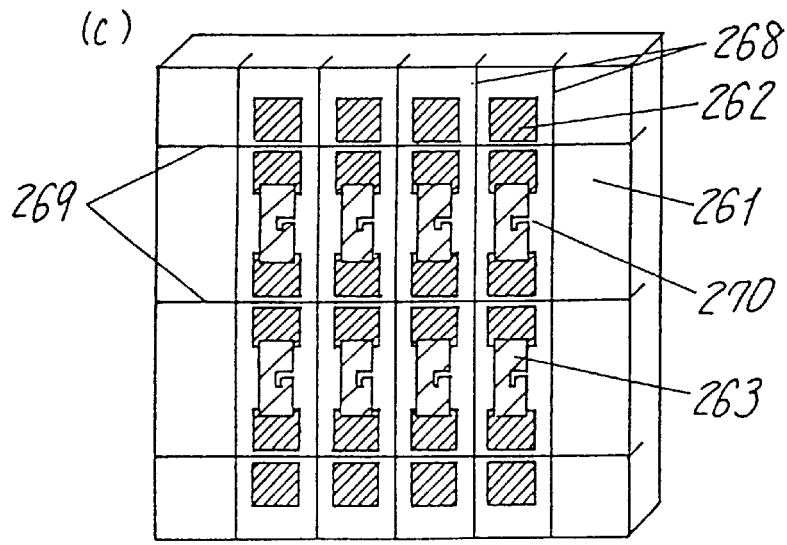
Figure 49:
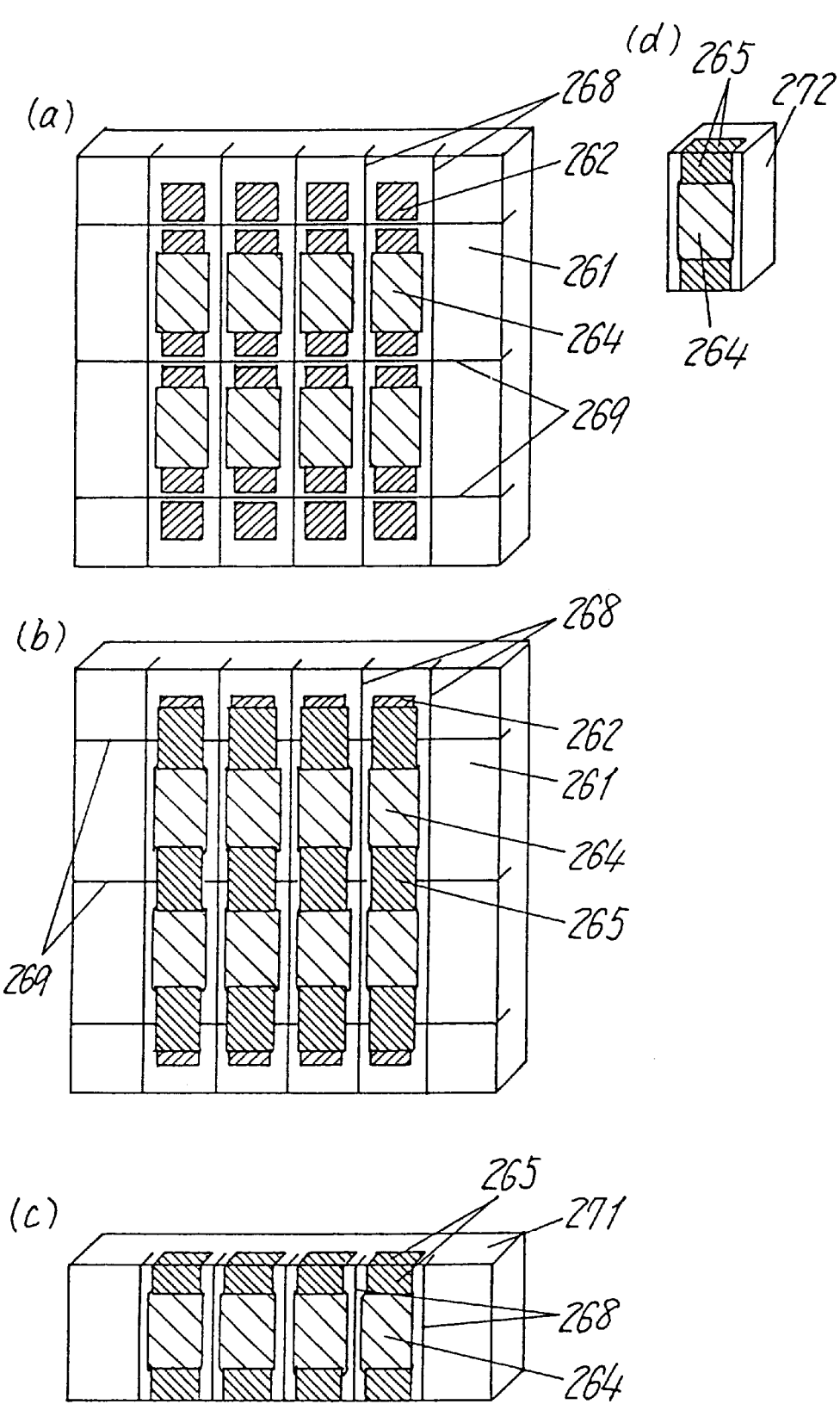
FIG. 49(*a*) through FIG. 49(*d*) represent another series of procedural views depicting the process of manufacturing the same resistor.
Figure 50:
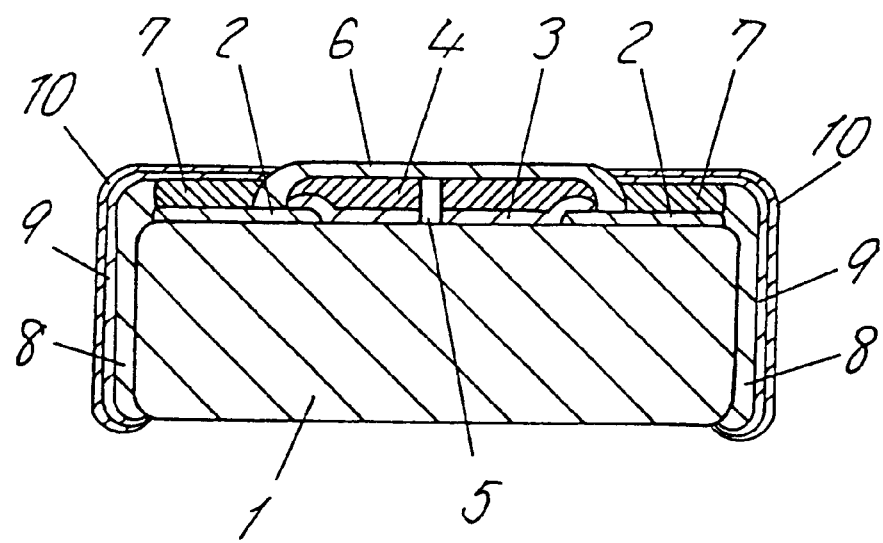
FIG. 50 is a sectional view depicting a resistor of the prior art.
Figure 51:
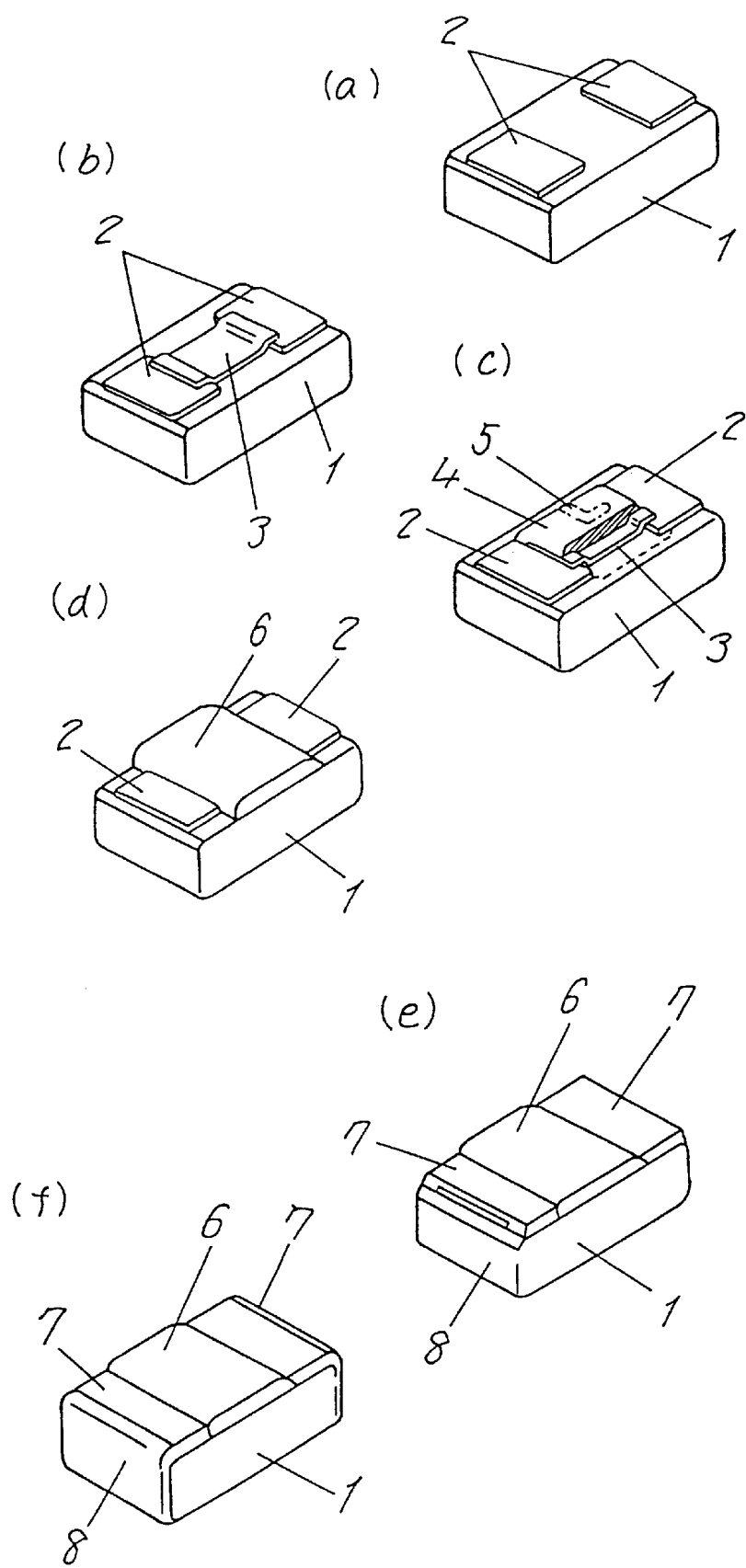
FIG. 51(*a*) through FIG. 51(*f*) represent a series of procedural views depicting a process of manufacturing the same resistor.
Figure 52:
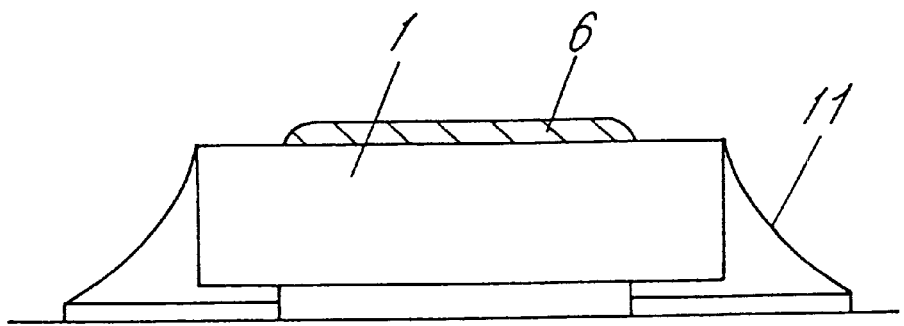
FIG. 52(*a*) is a sectional view depicting the same resistor in a mounted position.
Figure 52:
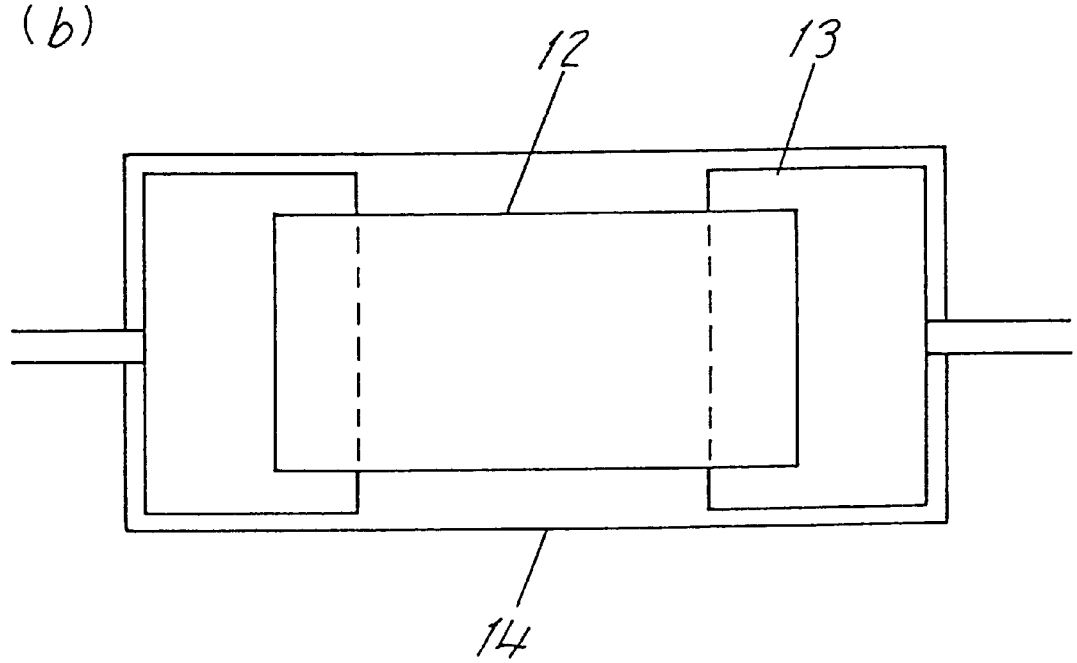

FIG. 48 and FIG. 49 represent a series of procedural views showing a manufacturing method of the resistor of the thirteenth exemplary embodiment of this invention.

First, electrode paste containing silver-base conductive powder and glass is printed to form first upper surface electrode layers 262, as shown in FIG. 48(*a*), in a manner not to cross over slitting grooves 269 made in a horizontal direction on a sheet-formed substrate 261, which has a superior heat-resisting property and an insulating property as it contains 96% alumina, and a surface of which is provided with a plurality of slitting grooves 268 and 269 in a vertical direction as well as in a horizontal direction in order to separate it into rectangular strips and then into individual pieces in the subsequent steps.

Next, resistive paste having a principal component of ruthenium oxide is printed to form resistance layers 263 in a manner that they connect electrically with the first upper surface electrode layers 262, as shown in FIG. 48(*b*). The resistance layers 263 are then calcined at a temperature of approximately 850° C. in order to make them become stable films.

Next, trimming is made to form trimmed slits 270 with a YAG laser, as shown in FIG. 48(*c*) in order to correct resistance values of the resistance layers 263 to a predetermined value. The trimming is made with trimming probes for measuring a resistance value set on the first upper surface electrode layers 262 during this process.

Another paste having a principal component of glass is printed to form protective layers 264, as shown in FIG. 49(*a*), in order to protect the resistance layers 263, of which resistance values have been corrected. For this process, a printing pattern may be made in such a shape that the protective layers 264 cross over the slitting grooves 268 of vertical direction to connectively cover a plurality of the horizontally aligned resistance layers 263. The protective layers 264 are then calcined at a temperature of approximately 600° C. in order to make them become stable films.

Resist material composed of resin is coated over an entire upper surface of the substrate 261, and openings having a film-forming pattern of the, desired second upper surface electrode layers 265 are made in the resist material by photo-lithographic method, as shown in FIG. 49(*b*). Furthermore, gold is deposited in a form of film on the entire upper surface of the substrate 261 by sputtering method, and the resist material is then removed except for portions of the film-forming pattern for the desired second upper surface electrode layers 265. These steps compose the second upper surface electrode layers 265. During the above process, the second upper surface electrode layers 265 get into the slitting grooves 269 of horizontal direction, and thereby the second upper surface electrode layers 265 can be formed down deeply in the slitting grooves.

Generally, the slitting grooves 268 and 269 are so formed that their depth with respect to a thickness of the substrate 261 becomes equal to or less than a half of the thickness of the substrate 261, so as to avoid it from being cracked during handling in the manufacturing process.

Then, the substrate 261 in a sheet-form, on which the first upper surface electrode layers 262, the resistance layers 263, the trimmed slits 270, the protective layers 264 and the second upper surface electrode layers 265 are formed, is separated into rectangular substrate strips 271 by splitting it along the slitting grooves 269 of horizontal direction in the substrate 261, as shown in FIG. 49(*c*). When this is done, the previously formed second upper surface electrode layers 265 lie in their respective positions on the side surfaces along a longitudinal direction of the rectangular substrate strips 271 down to the depth of the slitting grooves 269 of horizontal direction.

As a preparatory process for plating exposed surfaces of the upper surface electrode layers 265, the rectangular substrate strips 271 are finally separated into individual substrate pieces 272 by splitting them along the slitting grooves 268 of vertical direction, as shown in FIG. 49(*d*). A resistor is now completed when a nickel-plated layer, as an intermediate layer (not shown in the figure), and a solder-plated layer, as an outer layer (not shown in the figure), are formed by means of electroplating on exposed surfaces of the second upper surface electrode layers 265 in order to prevent electrode-erosion during soldering and to assure reliability of the soldering.

The resistor of the thirteenth exemplary embodiment of this invention constructed and manufactured as above provides the same advantages as what has been described in the tenth exemplary embodiment, when it is soldered on a mount board, and therefore they will not be described.

In addition, other characteristics (specified in Table 13) can be improved in this thirteenth exemplary embodiment of the invention, if the first upper surface electrode layers 262, the protective layer 264 and the second upper surface electrode layers 265 are constituted of combinations shown in Table 13.

TABLE 13

| Combination | First upper surface electrode layers 262 | Second upper surface electrode layers 265 | Protective layer 264 | Characteristics to be improved |
|---|---|---|---|---|
| 20 | Silver-base conductive powder and glass (calcined at 850° C.) | Sputtered gold-base material (heat-treated at 200° C.) | Resin-base material (hardened at 200° C.) | No variation in resistance value during manufacturing process, and small deviation in resistance value of products, due to low processing temperature of protective layer 264. |
| 21 | Silver-base conductive powder and glass (calcined at 850° C.) | Sputtered nickel-base material (hardened at 200° C.) | Glass-base material (calcined at 600° C.) | Less manufacturing cost due to use of base metal for second upper surface electrode layers. |
| 22 | Gold-base conductive powder and glass (calcined at 850° C.) | Sputtered gold-base material (heat-treated at 200° C.) | Glass-base material (calcined at 600° C.) | Improvement in loaded-life characteristic due to low ion migration. |
| 23 | Gold-base conductive powder and glass (calcined at 850° C.) | Sputtered gold-base material (heat-treated at 200° C.) | Resin-base material (hardened at 200° C.) | Both characteristics of above combinations 20 and 22. |
| 24 | Gold-base conductive powder and glass (calcined at 850° C.) | Sputtered nickel-base material (heat-treated at 200° C.) | Glass-base material (hardened at 200° C.) | Both characteristics of above combinations 21 and 22. |
| 25 | Gold-base conductive powder and glass (calcined at 850° C.) | Sputtered nickel-base material (heat-treated at 200° C.) | Resin-base material (hardened at 200° C.) | Both characteristics of above combinations 21, 22 and 20. |

TABLE 13-continued

| Combination | First upper surface electrode layers 262 | Second upper surface electrode layers 265 | Protective layer 264 | Characteristics to be improved |
|---|---|---|---|---|
| 26 | Gold-base organic metal compound (calcined at 850° C.) | Sputtered gold-base material (heat-treated at 200° C.) | Glass-base material (calcined at 600° C.) | Same characteristic as above combination 22, and low manufacturing cost due to reduction in amount of gold used. |
| 27 | Gold-base organic metal compound (calcined at 850° C.) | Sputtered gold-base material (heat-treated at 200° C.) | Resin-base material (hardened at 200° C.) | Same characteristic as above combination 23, and low manufacturing cost due to reduction in amount of gold used. |
| 28 | Gold-base organic metal compound (calcined at 850° C.) | Sputtered gold-base material (heat-treated at 200° C.) | Glass-base material (hardened at 200° C.) | Same characteristic as above combination 24, and low manufacturing cost due to reduction in amount of gold used. |
| 29 | Gold-base organic metal compound (calcined at 850° C.) | Sputtered nickel-base material (heat-treated at 200° C.) | Resin-base material (hardened at 200° C.) | Same characteristic as above combination 25, and low manufacturing cost due to reduction in amount of gold used. |

INDUSTRIAL APPLICABILITY

As has been described, a resistor of the present invention comprises: a substrate; a pair of first upper surface electrode layers provided on side portions of an upper surface toward portions of side surfaces of the substrate; a pair of second upper surface electrode layers provided in a manner to make electrical connections with the first upper surface electrode layers; a resistance layer provided in a manner to make electrical connections with the second upper surface electrode layers; and a protective layer provided to cover at least an upper surface of the resistance layer. The above-described structure provides the resistor with side surface electrodes having a small surface area, since the pair of first upper surface electrode layers are disposed on side portions of the upper surface toward portions of the side surfaces of the substrate. Because the resistor is soldered with the side surface electrodes of the small area, it can reduce an area required to form fillets of soldering, when it is soldered on a mount board. Accordingly, the resistor is able to reduce an actual mount area, including soldering portions, on the mount board.

What is claimed is:

1. A discrete resistor comprising:
   a substrate having an upper surface, side surfaces and a bottom surface, said side surfaces each having a length from said upper surface to said bottom surface;
   a pair of electrodes including respective electrode Sayers, each being disposed on and in contact with respective opposite end portions of said upper surface of said substrate and on respective portions of said side surfaces of said substrate, said portion being limited to no more than half the length of said side surfaces from said upper surface;
   further respective conductive layers outside of said electrode layers along said respective portions of said side surfaces of said substrate, at least half the length of said side surfaces from said bottom surface being free of any conductive layers;
   a resistor layer disposed on said upper surface of said substrate, said resistor layer electrically connected to each of said pair of electrodes; and
   a protective layer covering at least an upper surface of said resistor layer.

2. The resistor of claim 1, wherein said pair of electrodes includes a first electrode and a second electrode,
   said first electrode and second electrode being electrically connected,
   said first electrode being disposed on an upper surface of said substrate, said second electrode being disposed on said first electrode and on a portion of said side surface of said substrate, said portion being no more than half the length of said side surface from said upper surface, and
   said resistor layer being electrically connected to said first electrode.

3. The resistor of claim 1, wherein said pair of electrodes includes a first electrode and a second electrode,
   said first electrode and second electrode being electrically connected,
   said first electrode being disposed on an end portion of said upper surface and a portion of said side surface of said substrate, said portion being no more than half the length of said side surface from said upper surface,
   said second electrode being disposed on said first electrode, and
   said resistor layer being electrically connected to said second electrode.

4. The resistor of claim 1, wherein each of said pair of electrodes includes a first electrode and a second electrode,
   said first electrode and second electrode being electrically connected,
   said first electrode being disposed on an upper surface and a portion of said side surface of said substrate, said portion being no more than half the length of said side surface from said upper surface,
   said second electrode being disposed on an upper surface of said first electrode, and
   said resistor layer being electrically connected to said first electrode.

5. The resistor of claim 2, further comprising a third electrode disposed on said second electrode and electrically connected to said second electrode.

6. The resistor of claim 3, further comprising a third electrode disposed on said second electrode and electrically connected to said second electrode.

7. The resistor of claim 1, wherein each of said pair of electrodes includes a first electrode, a second electrode and a third electrode,
   said first electrode, second electrode and third electrode being electrically connected,
   said first electrode being disposed on and in contact with an upper surface of said substrate,
   said second electrode being disposed on said first electrode,
   said third electrode being disposed on said second electrode and a portion of side surface of said substrate, said portion being no more than half the length of said side surface from said upper surface, and said resistor layer being electrically connected to said first electrode.

8. The resistor of claim 1, further comprising a metal plated layer covering each of said pair of electrodes, said plated layer being formed on the same plane with, or greater in height than said protective layer.

9. The resistor of claim 2, further comprising a metal plated layer covering each of said pair of electrodes, said plated layer being formed on the same plane with, or greater in height than said protective layer.

10. The resistor of claim 3, further comprising a metal plated layer covering each of said pair of electrodes, said plated layer being formed on the same plane with, or greater in height than said protective layer.

11. The resistor of claim 4, further comprising a metal plated layer covering each of said pair of electrodes, said plated layer being formed on the same plane with, or greater in height than said protective layer.

12. The resistor,of claim 5, further comprising a metal plated layer covering each of said pair of electrodes, said plated layer being formed on the same plane with or greater in height than said protective layer.

13. The resistor of claim 6, further comprising a metal plated layer covering each of said pair of electrodes, said plated layer being formed on the same plane with, or greater in height than said protective layer.

14. The resistor of claim 7, further comprising a metal plated layer covering each of said pair of electrodes, said plated layer being formed on the same plane with, or greater in height than said protective layer.

15. The resistor of any claim 2, wherein said first electrode is one of gold base thin film and nickel base thin film.

16. The resistor of any claim 3, wherein said first electrode is one of gold base thin film and nickel base thin film.

17. The resistor of any claim 4, wherein said first electrode is one of gold base thin film and nickel base thin film.

18. The resistor of any claim 5, wherein said first electrode is one of gold base thin film and nickel base thin film.

19. The resistor of any claim 6, wherein said first electrode is one of gold base thin film and nickel base thin film.

20. The resistor of any claim 7, wherein said first electrode is one of gold base thin film and nickel base thin film.

21. A discrete resistor according to claim 1, wherein said pair of electrodes are one-piece.

* * * * *

UNITED STATES PATENT AND TRADEMARK OFFICE
CERTIFICATE OF CORRECTION

PATENT NO. : 6,636,143 B1
DATED : October 21, 2003
INVENTOR(S) : Hashimoto et al.

It is certified that error appears in the above-identified patent and that said Letters Patent is hereby corrected as shown below:

Column 49,
Line 61, "Sayers" should read -- layers --.

Signed and Sealed this

Thirtieth Day of March, 2004

JON W. DUDAS
*Acting Director of the United States Patent and Trademark Office*